(12) United States Patent
Maeda et al.

(10) Patent No.: US 8,685,856 B2
(45) Date of Patent: Apr. 1, 2014

(54) SOLID-STATE IMAGING DEVICE, FABRICATION METHOD THEREOF, IMAGING APPARATUS, AND FABRICATION METHOD OF ANTI-REFLECTION STRUCTURE

(75) Inventors: Kensaku Maeda, Kanagawa (JP); Kaoru Koike, Kumamoto (JP); Tohru Sasaki, Kumamoto (JP); Tetsuya Tatsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 608 days.

(21) Appl. No.: 12/728,448

(22) Filed: Mar. 22, 2010

(65) Prior Publication Data

US 2010/0244169 A1 Sep. 30, 2010

(30) Foreign Application Priority Data

Mar. 31, 2009 (JP) ................................. 2009-086671
May 20, 2009 (JP) ................................. 2009-121605

(51) Int. Cl.
*H01L 31/0236* (2006.01)

(52) U.S. Cl.
USPC .................. 438/689; 257/437; 257/E21.214; 257/E31.127; 257/E31.13; 438/72

(58) Field of Classification Search
USPC .......... 257/432; 438/706, 707, 710, 712, 714; 430/5, 312, 313, 314, 315, 316, 317
See application file for complete search history.

(56) References Cited

U.S. PATENT DOCUMENTS

| | | | |
|---|---|---|---|
| 4,407,695 A | | 10/1983 | Deckman et al. |
| 5,939,182 A | * | 8/1999 | Huang et al. .................. 428/323 |
| 6,356,389 B1 | | 3/2002 | Nilsen et al. |
| 6,682,873 B2 | * | 1/2004 | Michiels et al. ............. 430/313 |
| 7,674,717 B2 | * | 3/2010 | Wang et al. ................... 438/706 |
| 2004/0227446 A1 | | 11/2004 | Fujimoto et al. |

(Continued)

FOREIGN PATENT DOCUMENTS

| | | |
|---|---|---|
| EP | 0 180 222 | 5/1986 |
| JP | 06-261249 | 9/1994 |

(Continued)

OTHER PUBLICATIONS

T. Nakanishi et al.; Nano-patterning using an embedded particle monolayer as an etch mask; Microelectronic Engineering; Elsevier Publishers BV, Amsterdam, NL; vol. 83, No. 4-9; Apr. 1, 2006; pp. 1503-1508.

(Continued)

*Primary Examiner* — Stephen W Smoot
*Assistant Examiner* — Edward Chin
(74) *Attorney, Agent, or Firm* — Dentons US LLP

(57) ABSTRACT

A fabrication method of an anti-reflection structure includes the steps of: forming a resin film having micro-particles dispersed therein on a surface of a substrate; forming a protrusion dummy pattern on the resin film by etching the resin film using the micro-particles in the resin film as a mask while gradually etching the micro-particles; and forming a protrusion pattern on the surface of the substrate by etching back the surface of the substrate together with the resin film having the protrusion dummy pattern formed thereon, and transferring a surface shape of the protrusion dummy pattern formed on a surface of the resin film to the surface of the substrate.

7 Claims, 30 Drawing Sheets

(56) References Cited

U.S. PATENT DOCUMENTS

| | | |
|---|---|---|
| 2005/0105150 A1 | 5/2005 | Raguin |
| 2007/0205439 A1 | 9/2007 | Okita et al. |
| 2008/0055728 A1 | 3/2008 | Tanaka et al. |
| 2009/0274873 A1* | 11/2009 | Shinotsuka .................. 428/143 |
| 2009/0317733 A1* | 12/2009 | Okura et al. ................... 430/56 |

FOREIGN PATENT DOCUMENTS

| | | |
|---|---|---|
| JP | 2001-272505 | 10/2001 |
| JP | 2004-324439 | 11/2004 |
| JP | 2006-147991 | 6/2006 |
| JP | 2006-303468 | 11/2006 |
| JP | 2006-332433 | 12/2006 |
| JP | 2007-261247 | 10/2007 |
| JP | 2008-256785 | 10/2008 |
| WO | 2005/109042 | 11/2005 |
| WO | 2010/007853 | 1/2010 |

OTHER PUBLICATIONS

European Search Report dated Aug. 20, 2012, in connection with counterpart EP Application No. 10 15 7325.

* cited by examiner

PERSPECTIVE VIEW OF MICRO-PROTRUSION PATTERN

SEM IMAGE (5) BIRD'S EYE-VIEW SEM IMAGE (6) CROSS-SECTIONAL SEM IMAGE (1)

(2)

(3)

(4)

(3)

(4)

(1) BIRD'S EYE-VIEW SEM IMAGE (2) CROSS-SECTIONAL SEM IMAGE

PITCH: 40 nm (1)

(2)

(1)

(2)

(3)

(4)

(5)

(6)

(1)

(2)

(3)

(4)

(5)

(6)

SOLID-STATE IMAGING DEVICE, FABRICATION METHOD THEREOF, IMAGING APPARATUS, AND FABRICATION METHOD OF ANTI-REFLECTION STRUCTURE

BACKGROUND OF THE INVENTION

1. Field of the Invention

The present invention relates to a solid-state imaging device, a fabrication method thereof, an imaging apparatus, and a fabrication method of an anti-reflection structure.

2. Description of the Related Art

In solid-state imaging devices, it is necessary for a photoelectric conversion portion to convert incident light to electrical signals while preventing reflection of the incident light in order to increase conversion efficiency of the photoelectric conversion portion performing photoelectric conversion on the incident light.

Therefore, it is desirable to decrease the light components reflected from the interfaces as much as possible.

In solid-state image sensors, a light-condensing stacked structure is formed to efficiently condense light. In this case, since the stacked layers of different materials produce an interface at which a difference in refractive indices is large, there occurs an optical loss due to interfacial reflection, which may lead to a reduction in sensitivity if no countermeasures are taken. In addition, the light reflected from the interface may become the source of noise such as flare or ghost.

In this regard, a method has been proposed to form an anti-reflection film on an interface at which a difference in refractive indices is large so as to reduce interfacial reflection (for example, see JP-A-2007-242697 and JP-A-6-292206).

As a high performance anti-reflection structure, a method has been proposed to form a relief structure on an on-chip lens, for example, so as to reduce the interfacial reflection (for example, see JP-A-2004-47682, JP-A-2006-147991, and WO2005/109042).

The reduced interfacial reflection results in the reduction in noise light such as flare or ghost which is generated when light reflected once is reflected again from another member such as a protective glass and then enters the lens.

According to the method to form the anti-reflection film on the interface at which a difference in refractive indices is large so as to reduce interfacial reflection (for example, JP-A-2007-242697 and JP-A-6-292206), since the anti-reflection structure is achieved with a single layer, anti-reflection performance can be increased by choosing a film thickness such that the phases of light are reversed therein.

However, in a practical fabrication of solid-state image sensors, since a step or the like exists between a light-receiving element portion and a peripheral circuit, it is difficult to form a uniform single-layer film on the light-receiving elements. Therefore, an interference state differs for each location of the light-receiving elements. Moreover, since the optimum thickness of the anti-reflection film generally differs depending on the wavelength of visible light, an uneven thickness may become the cause of color unevenness.

From these and other reasons, the use of a single-layer anti-reflection structure in a solid-state image sensor has drawbacks in fabrication and principle.

For detailed description, an appearance of an interference pattern caused by reflections when a silicon nitride film is formed as an anti-reflection film on a silicon-air interface (a silicon-side interface) is illustrated in FIG. 1.

The thickness of the anti-reflection film is optimized to a 560 nm wavelength of visible light. For this reason, the interference pattern observed with incident light of 560 nm wavelength disappears almost completely, and it can thus be understood that the film functions properly as an anti-reflection film. On the other hand, the interference pattern observed with incident light of 440 nm wavelength does not disappear much. The optimum thickness of the anti-reflection film where the anti-reflection film has an interference reduction effect changes depending on the wavelength of incident light. Therefore, since the sensitivity to incident light also varies with a variation in the thickness of the anti-reflection film, such a sensitivity variation becomes the cause of color unevenness.

As an anti-reflection method, there are known anti-reflection films that use single-layer or multi-layer interference coatings. Although these films exhibit excellent anti-reflection properties at a particular wavelength band, it is particularly difficult to form an anti-reflection film having excellent anti-reflection properties over all the visible light bands.

Moreover, it is also difficult to have anti-reflection capabilities for light coming at every angle of incidence.

Furthermore, the anti-reflection capabilities of these anti-reflection films are sensitive to their film thickness. In addition, in order to maintain stable anti-reflection properties, many problems such as difficulties in fabrication management should be solved.

A method has been proposed to provide an anti-reflection structure which is constructed from microscopic protrusions formed on an interface of a solid-state image sensor, at which refractive indices are different, thus preventing reflections (for example, see JP-A-2004-47682, WO2005/109042, or JP-A-2006-332433). In the anti-reflection structure using protrusions, it is considered preferable for the microscopic protrusion to have a size about half the wavelength of incident light, and the size is about 200 nm for visible light. Thus, a stable formation method is difficult.

In the technique disclosed in JP-A-2004-47682, 100 nm-size patterns spaced by 100 nm from adjacent patterns are formed by electron beam exposure, and the patterns are subjected to dry-etching, thus forming a protrusion pattern. In the technique disclosed in WO2005/109042, a protrusion pattern is formed by using any one of a combination of photolithography and hot-reflow, a combination of nickel-electrocasting and replica molding, and dual-beam interference exposure. In the technique disclosed in JP-A-2006-332433, a protrusion pattern is formed by forming a coating film using aluminum compound, which is then subjected to hot-water treatment or vapor treatment. However, neither of the methods can be said to be a low-cost and highly reliable formation method of an anti-reflection structure using protrusions. In addition, neither of the disclosures teaches formation of a spindle shape suitable for an anti-reflection structure.

As an additional method, a method has been proposed to form a 125 nm-size resist pattern on a metal film by electron beam exposure and etch both the metal film and the glass substrate, thereby obtaining a conical or pyramidal shape (for example, see JP-A-2001-272505). However, it is expensive to form a microscopic resist pattern by electron beam exposure. Moreover, this disclosure does not teach details of a method of obtaining a spindle shape suitable for an anti-reflection structure.

As another method, a method has been proposed to perform microscopic processing by performing etching using nano-size particles as a mask (for example, see JP-A-2001-272505 and U.S. Pat. No. 4,407,695). However, in the method disclosed in JP-A-2001-272505 and U.S. Pat. No. 4,407,695, it is difficult to form a spindle shape which is the shape of a protrusion pattern suitable for an anti-reflection structure.

The method disclosed in JP-A-2001-272505 teaches formation of only nano-size columnar or conical shapes. In the method disclosed in U.S. Pat. No. 4,407,695, it is possible to form an oval hole shape, but it is difficult to form a spindle shape.

The reason why the shape of the protrusion pattern suitable for the anti-reflection structure is a spindle shape will be described briefly with reference to FIG. 2. As illustrated in FIG. 2, since light reflections are caused by an abrupt change in refractive index, by forming a structure such that refractive indices are distributed continuously at an interface of different substances with a protrusion pattern, it is possible to reduce the light reflections. When a widthwise dimension of the protrusion pattern is smaller than a wavelength of light, a spatial occupancy of a substance (e.g., air) on one side of the interface changes gradually so that the substance is switched to a substrate (e.g., a microlens) on the other side of the interface, whereby an effective refractive index changes continuously.

Since a variation in spatial occupancy has the same meaning as a volume variation between the substances on both sides of the interface, a spindle-shaped anti-reflection structure is suitable which has a sinusoidal curved surface where a volume variation is smooth as illustrated in FIG. 3.

However, neither of the disclosures presents a method of stably forming a protrusion pattern suitable for an anti-reflection structure. Moreover, for example, in a method in which a protrusion pattern is formed on a passivation film, and a color filter layer is formed on the passivation film, there is a high possibility of the protrusion pattern being deformed at the time of coating a color filter material. Thus, such a method cannot be said to be a practical method.

The solid-state image sensor disclosed in JP-A-2004-47682 has an anti-reflection structure which has a relief structure and is formed on the surface of a passivation film. The relief structure is characterized in that it has an aspect ratio of 1 or higher, which appears at intervals of 0.05 μm to 1 μm. According to the studies of the present inventors, when the relief structure is formed to have an aspect ratio exceeding a certain level, a reduction in sensitivity was observed. This is thought to result from an increase in an optical path length of a light condensing structure with the increase in the aspect ratio of the relief structure.

According to the formation method disclosed in JP-A-2004-47682, patterns which are 100 nm in width are patterned by electron beam lithography so that the patterns are spaced by 100 nm from adjacent patterns. Thereafter, reactive ion etching (RIE) is performed, whereby protrusion patterns are formed. In this formation method, when the protrusion patterns are arranged on light-receiving elements disposed at a pitch of 2.0 μm, 400 protrusion patterns are required for each light-receiving element.

In recent solid-state image sensors, it is common that more than one million light-receiving elements are mounted on one chip. In this case, 400 million protrusion patterns are required for each chip. When such many patterns are formed by electron beam lithography, if a rendering time is 100 nsec per one protrusion pattern, it may take 11 hours or longer for one sheet of 300-mm wafer and it is thus not practical.

Moreover, the relief structure disclosed in JP-A-2006-147991 is fabricated by lithography so that relief structures have a height ranging from 100 Å to 5000 Å and are arranged at a pitch such that an incident light is not diffracted. However, this disclosure does not teach the details of the fabrication method using lithography.

Moreover, the relief structure disclosed in WO2005/109042 is characterized in that relief structure units have a pitch and a height, satisfying an expression $0.1\lambda<\text{pitch}<0.8\lambda$ and an expression $0.5\lambda<\text{height}<5\lambda$ (where $\lambda$ is a wavelength of an incident light).

However, when pitch=$0.11\lambda$ and height=$4.4\lambda$, an aspect ratio will become 40, which will lead to a sensitivity reduction as described above. Moreover, such a structure is not practical from the perspective of preventing shading (which is a phenomenon where the light collecting characteristics of pixels disposed on the border of a light-receiving region where light enters at oblique angles are more degraded than pixels disposed on the center of an optical axis).

Although it is described that the structure can be fabricated by a nanoimprinting method, when relief structure units of which an aspect ratio is high (namely, the structure is tall) are fabricated, convex parts are hard to separate from a mold. Therefore, there is a problem with the separability of a mold, and it is not practical.

SUMMARY OF THE INVENTION

One existing problem with the related art is that it is difficult to stably form the protrusion pattern which is suitable for an anti-reflection structure.

Another existing problem with the related art is that sensitivity decreases when the relief structure is formed exceeding a certain aspect ratio. In addition, if the aspect ratio is too large, the formation of the protrusion pattern according to the nanoimprinting method is difficult due to the difficulties in mold separation.

It is therefore desirable to enable stable formation of a protrusion pattern which is suitable for an anti-reflection structure.

Embodiments of the present invention enable suppressing sensitivity reduction caused by formation of an anti-reflection structure, and on the contrary, enables increasing sensitivity, suppressing shading, and preventing reflections. In addition, embodiments of the present invention enable fabrication of an anti-reflection structure according to a nanoimprinting method.

According to an embodiment of the present invention, there is provided a fabrication method of an anti-reflection structure (first fabrication method), including the steps of: forming a resin film having micro-particles dispersed therein on a surface of a substrate; forming a protrusion dummy pattern on the resin film by etching the resin film using the micro-particles in the resin film as a mask while gradually etching the micro-particles; and forming a protrusion pattern on the surface of the substrate by etching back the surface of the substrate together with the resin film having the protrusion dummy pattern formed thereon, and transferring a surface shape of the protrusion dummy pattern formed on a surface of the resin film to the surface of the substrate.

In the first fabrication method of the anti-reflection structure according to the embodiment of the present invention, since the micro-particles are dispersed in the resin film, when the resin film is etched in this state, etching of the surface of the resin film progresses with the micro-particles used as a mask. At this time, since the micro-particles are also etched gradually, when the etching progresses, the micro-particles are thinned with the etching and are finally removed. As a result, a protrusion dummy pattern is formed on the surface of the resin film. In this way, since the micro-particles serving as the etching mask are thinned with the progress of the etching, the protrusion dummy pattern is formed into a conical protrusion structure (moth-eye structure).

When the surface shape of the protrusion dummy pattern is transferred to the surface of the substrate in such a state, thus forming the protrusion pattern on the surface of the substrate, the protrusion pattern is formed with the same shape as the protrusion dummy pattern.

According to another embodiment of the present invention, there is provided a fabrication method of an anti-reflection structure (second fabrication method), including the steps of: arranging micro-particles on a surface of a substrate; and forming a protrusion pattern on the surface of the substrate by performing anisotropic etching in which an etching rate for the substrate is higher than an etching rate for the micro-particles.

In the second fabrication method of the anti-reflection structure according to the embodiment of the present invention, anisotropic etching in which the etching rate for the substrate is higher than the etching rate for the micro-particles is performed in a state where the micro-particles are arranged on the surface of the substrate. In this way, it is possible to etch the surface of the substrate while using the micro-particles as an etching mask. Moreover, since the micro-particles are etched at a lower etching rate than that for the substrate, the protrusion pattern is formed into a shape such that a volume of each protrusion increases in an approximately linear fashion from the apex to the bottom of each protrusion when the protrusion is divided into equal thicknesses in a height direction thereof.

According to still another embodiment of the present invention, there is provided a fabrication method of a solid-state imaging device (first fabrication method), including the steps of: forming an interlayer insulating film on a semiconductor substrate, in which a photoelectric conversion portion that converts an incident light to signal charges and a charge transfer portion that reads out and transfers the signal charges from the photoelectric conversion portion are formed, and forming a planarization insulating film thereon; forming a resin film having micro-particles dispersed therein on the planarization insulating film; forming a protrusion dummy pattern on the resin film by etching the resin film using the micro-particles in the resin film as a mask while gradually etching the micro-particles; and forming a protrusion pattern on the surface of the planarization insulating film by etching back the surface of the planarization insulating film together with the resin film having the protrusion dummy pattern formed thereon, and transferring a surface shape of the protrusion dummy pattern formed on a surface of the resin film to the surface of the planarization insulating film and.

In the first fabrication method of the solid-state imaging device according to the embodiment of the present invention, since the micro-particles are dispersed in the resin film, when the resin film is etched in this state, etching of the surface of the resin film progresses with the micro-particles used as a mask. At this time, since the micro-particles are also etched gradually, when the etching progresses, the micro-particles are thinned with the etching and are finally removed. As a result, a protrusion dummy pattern is formed on the surface of the resin film. In this way, since the micro-particles serving as the etching mask are thinned with the progress of the etching, the protrusion dummy pattern is formed into a conical protrusion structure (moth-eye structure).

When the surface shape of the protrusion dummy pattern is transferred to the surface of the planarization insulating film in such a state, thus forming the protrusion pattern on the surface of the planarization insulating film, the protrusion pattern is formed with the same shape as the protrusion dummy pattern.

According to yet another embodiment of the present invention, there is provided a fabrication method of a solid-state imaging device (second fabrication method), including the steps of: forming an interlayer insulating film on a semiconductor substrate, in which a photoelectric conversion portion that converts an incident light to signal charges and a charge transfer portion that reads out and transfers the signal charges from the photoelectric conversion portion are formed, and forming a planarization insulating film thereon; arranging micro-particles on a surface of the planarization insulating film; and forming a protrusion pattern on the surface of the planarization insulating film by performing anisotropic etching in which an etching rate for the planarization insulating film is higher than an etching rate for the micro-particles.

In the second fabrication method of the solid-state imaging device according to the embodiment of the present invention, anisotropic etching in which the etching rate for the planarization insulating film is higher than the etching rate for the micro-particles is performed in a state where the micro-particles are arranged on the surface of the planarization insulating film. In this way, it is possible to etch the surface of the planarization insulating film while using the micro-particles as an etching mask. Moreover, since the micro-particles are etched at a lower etching rate than that for the planarization insulating film, the protrusion pattern is formed into a shape such that a volume of each protrusion increases in an approximately linear fashion from the apex to the bottom of each protrusion when the protrusion is divided into equal thicknesses in a height direction thereof.

According to still yet another embodiment of the present invention, there is provided a solid-state imaging device including: a photoelectric conversion portion that is disposed in a semiconductor region so as to obtain signal charges by performing photoelectric conversion on an incident light; and a plurality of layers of light transmissive films formed on the photoelectric conversion portion, wherein an anti-reflection structure is formed on a surface of the semiconductor region or a surface of a first light transmissive film on at least one layer of the plurality of layers of the light transmissive films; the anti-reflection structure is constructed from spindle-shaped protrusions which have light transmissive properties and a sinusoidal curved surface and are arranged on the surface of the first light transmissive film or the surface of the semiconductor region; and the protrusions have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm.

In the solid-state imaging device according to the embodiment of the present invention, since the anti-reflection structure is constructed from the spindle-shaped protrusions which have light transmissive properties and a sinusoidal curved surface and are arranged on an entire surface thereof, a volume variation of the substances on both sides of an interface of the anti-reflection structure changes in a linear fashion. For this reason, when a widthwise dimension of the protrusion is smaller than a wavelength of light, a spatial occupancy of a substance on one side of the interface changes gradually so that the substance is switched to a substrate on the other side of the interface, whereby an effective refractive index changes continuously. Since a variation in spatial occupancy has the same meaning as a volume variation between the substances on both sides of the interface, a variation in refractive indices of the anti-reflection structure becomes linear, and thus light reflections are reduced. Moreover, the protrusions have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm. With such regulations, the aspect ratio of the protrusion is suppressed to be low and the reduction of sensitivity can be suppressed.

According to further another embodiment of the present invention, there is provided a fabrication method of a solid-state imaging device (third fabrication method), including the step of: forming an anti-reflection structure on a surface of a first light transmissive film on at least one layer of a plurality of layers of light transmissive films when the plurality of layers of the light transmissive films are formed on a photoelectric conversion portion that is disposed in a semiconductor region so as to obtain signal charges by performing photoelectric conversion on an incident light, wherein the anti-reflection structure forming step includes the steps of forming a UV-curable film on the surface of the first light transmissive film, transferring a shape of spindle-shaped protrusions having a sinusoidal curved surface to a surface of the UV-curable film by pressing a UV-transmitting nanoimprint mold, in which spindle-shaped depressions having a sinusoidal curved surface are arranged on an entire surface, against the UV-curable film, curing the UV-curable film by irradiation with ultraviolet rays in a state where the nanoimprint mold is pressed; separating the nanoimprint mold from the UV-curable film; and etching back the UV-curable film and an upper portion of the first light transmissive film, and transferring a shape of spindle-shaped protrusions having a sinusoidal curved surface formed on the UV-curable film to the surface of the first light transmissive film by etching back the UV-curable film and an upper portion of the first light transmissive film, and the protrusions are formed to have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm.

In the third fabrication method according to the embodiment of the present invention, since the protrusions of the anti-reflection structure are formed into a spindle shape having a sinusoidal curved surface, a volume variation of the substances on both sides of the interface of the anti-reflection structure changes in a linear fashion. For this reason, when a widthwise dimension of the protrusion is smaller than a wavelength of light, a spatial occupancy of a substance on one side of the interface changes gradually so that the substance is switched to a substrate on the other side of the interface, whereby an effective refractive index changes continuously. Therefore, a variation in refractive indices of the anti-reflection structure becomes linear, and thus light reflections are reduced. Moreover, the protrusions have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm. With such regulations, since the aspect ratio of the protrusion can be suppressed as low as 4 at the maximum, it is possible to suppress the reduction of sensitivity and enable application of a nanoimprinting method.

According to further another embodiment of the present invention, there is provided a fabrication method of a solid-state imaging device (fourth fabrication method), including the step of: forming an anti-reflection structure on a surface of a first light transmissive film on at least one layer of a plurality of layers of light transmissive films when the plurality of layers of the light transmissive films are formed on a photoelectric conversion portion that is disposed in a semiconductor region so as to obtain signal charges by performing photoelectric conversion on an incident light, wherein the anti-reflection structure forming step includes the steps of forming the first light transmissive film from a UV-curable or heat-curable coating film, transferring a shape of spindle-shaped protrusions having a sinusoidal curved surface to a surface of the first light transmissive film by pressing a UV-transmitting nanoimprint mold, in which spindle-shaped depressions having a sinusoidal curved surface are arranged on an entire surface, against the first light transmissive film, curing the first light transmissive film by irradiation with ultraviolet rays in a state where the nanoimprint mold is pressed, and separating the nanoimprint mold from the first light transmissive film, and the protrusions are formed to have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm.

In the fourth fabrication method according to the embodiment of the present invention, since the protrusions of the anti-reflection structure are formed into a spindle shape having a sinusoidal curved surface, a volume variation of the substances on both sides of the interface of the anti-reflection structure changes in a linear fashion. For this reason, when a widthwise dimension of the protrusion is smaller than a wavelength of light, a spatial occupancy of a substance on one side of the interface changes gradually so that the substance is switched to a substrate on the other side of the interface, whereby an effective refractive index changes continuously. Therefore, a variation in refractive indices of the anti-reflection structure becomes linear, and thus light reflections are reduced. Moreover, the protrusions have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm. With such regulations, since the aspect ratio of the protrusion can be suppressed as low as 4 at the maximum, it is possible to suppress the reduction of sensitivity and enable application of a nanoimprinting method.

According to still further another embodiment of the present invention, there is provided an imaging apparatus including a light-condensing optical unit that condenses an incident light; an imaging unit having a solid-state imaging device which receives the light condensed by the light-condensing optical unit and performs photoelectric conversion on the light; and a signal processing portion that processes signals having been subjected to the photoelectric conversion, wherein the solid-state imaging device includes a photoelectric conversion portion that is disposed in a semiconductor region so as to obtain signal charges by performing photoelectric conversion on an incident light, and a plurality of layers of light transmissive films formed on the photoelectric conversion portion; an anti-reflection structure is formed on a surface of the semiconductor region or a surface of a first light transmissive film on at least one layer of the plurality of layers of the light transmissive films; the anti-reflection structure is constructed from spindle-shaped protrusions which have light transmissive properties and a sinusoidal curved surface and are arranged on the surface of the first light transmissive film or the surface of the semiconductor region; and the spindle-shaped protrusions have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm.

In the imaging apparatus according to the embodiment of the present invention, since the solid-state imaging device according to the embodiment of the present invention is used for the solid-state imaging device of the imaging unit, the reduction in sensitivity is suppressed.

In the first fabrication method of the anti-reflection structure according to the embodiment of the present invention, it is possible to form the protrusion dummy pattern by etching the resin film having the micro-particles dispersed therein. Moreover, since the protrusion pattern is formed on the surface of the substrate by transferring the shape of the protrusion dummy pattern, it is possible to provide an advantage that the protrusion pattern suitable for the anti-reflection structure can be formed stably and easily.

In the second fabrication method of the anti-reflection structure according to the embodiment of the present invention, since the protrusion pattern is formed on the surface of the substrate by etching the surface of the substrate having the micro-particles dispersed therein, it is possible to provide an advantage that the micro-particles suitable for the anti-reflection structure can be formed stably and easily.

In the first fabrication method of the solid-state imaging device according to the embodiment of the present invention, since the anti-reflection structure fabricated by the fabrication method of the anti-reflection structure according to the embodiment of the present invention is used, it is possible to provide an advantage that the anti-reflection structure suitable for the anti-reflection structure can be formed stably and easily.

In the second fabrication method of the solid-state imaging device according to the embodiment of the present invention, since the anti-reflection structure fabricated by the fabrication method of the anti-reflection structure according to the embodiment of the present invention is used, it is possible to provide an advantage that the anti-reflection structure suitable for the anti-reflection structure can be formed stably and easily.

In the solid-state imaging device according to the embodiment of the present invention, it is possible to prevent the reduction in sensitivity of all the pixels, prevent shading, and prevent reflections. Therefore, since noise such as flare or ghost can be reduced, it is possible to provide an advantage that high-quality images can be obtained with high sensitivity.

In the fabrication method of the solid-state imaging device according to the embodiment of the present invention, since a nanoimprinting method can be employed, it is possible to provide an advantage that a solid-state imaging device capable of obtaining high-quality images with high sensitivity in which noise such as flare or ghost is reduced can be fabricated at low cost.

In the imaging apparatus according to the embodiment of the present invention, since a solid-state imaging device capable of obtaining high-quality images with high sensitivity is used, it is possible to provide an advantage that high-quality images can be obtained with high sensitivity.

DESCRIPTION OF THE PREFERRED EMBODIMENTS

Figure 1:
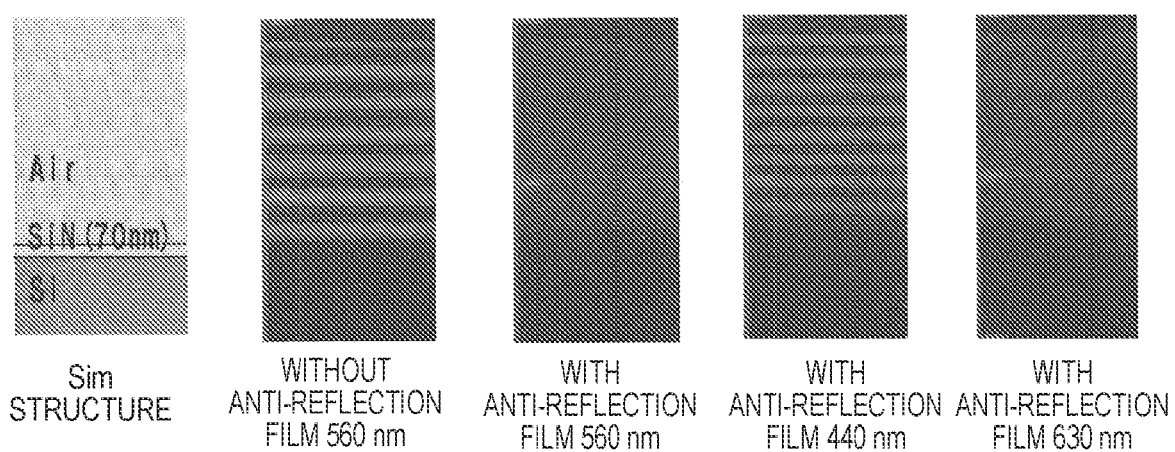
FIG. 1 is a diagram illustrating an interference pattern resulting from reflection when a silicon nitride film of an anti-reflection film is formed on a silicon-air interface.
Figure 2:
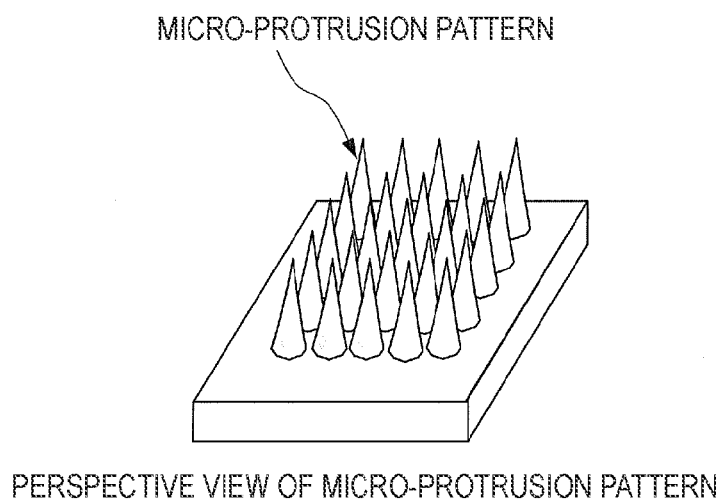
FIG. 2 is a diagram illustrating a related art.
Figure 2:
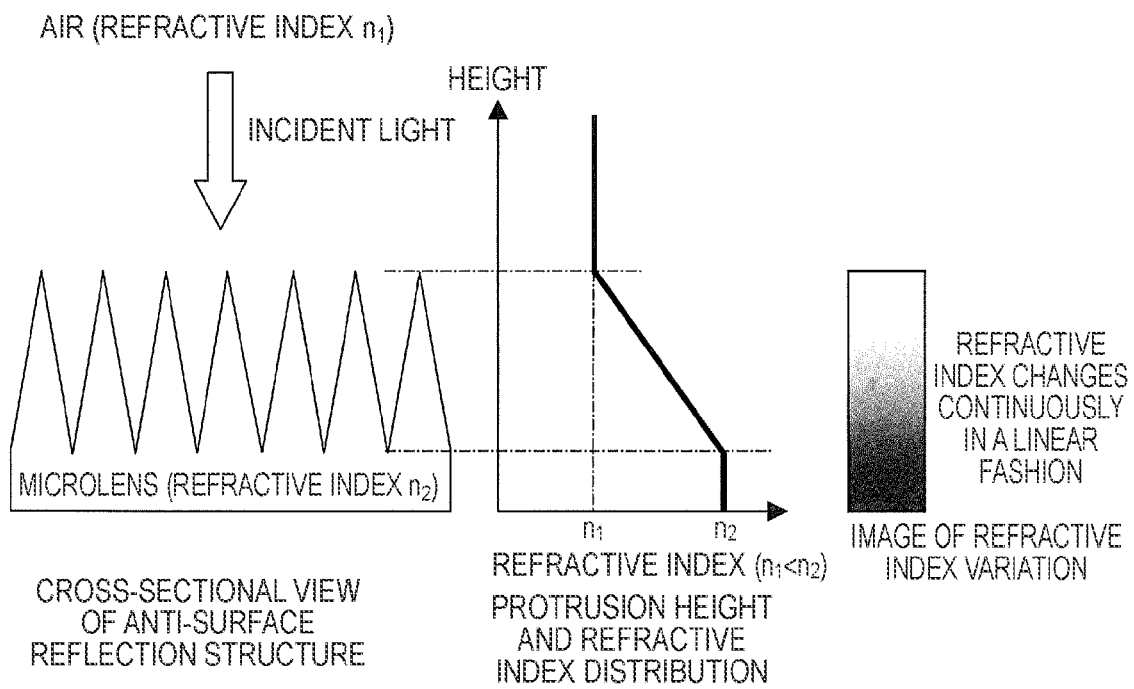

Hereinafter, modes for carrying out the present invention (hereinafter referred to as embodiments) will be described.

In the following description, reference numeral 10 is an anti-reflection structure, 11 is a target substrate, 12 is a resin film, 13 is a micro-particle, 14 is a micro-protrusion dummy pattern, 15 is a micro-protrusion pattern, 21 is a semiconductor substrate, 22 is a photoelectric conversion portion, 23 is a vertical charge transfer portion, 41 is an interlayer insulating film, and 42 is a planarization insulating film.

1. First Embodiment

Example of First Fabrication Method of Anti-Reflection Structure

An example of a first fabrication method of an anti-reflection structure according to a first embodiment of the present invention will be described with reference to the cross-sectional views and SEM images shown in FIG. 4.

Figure 4:
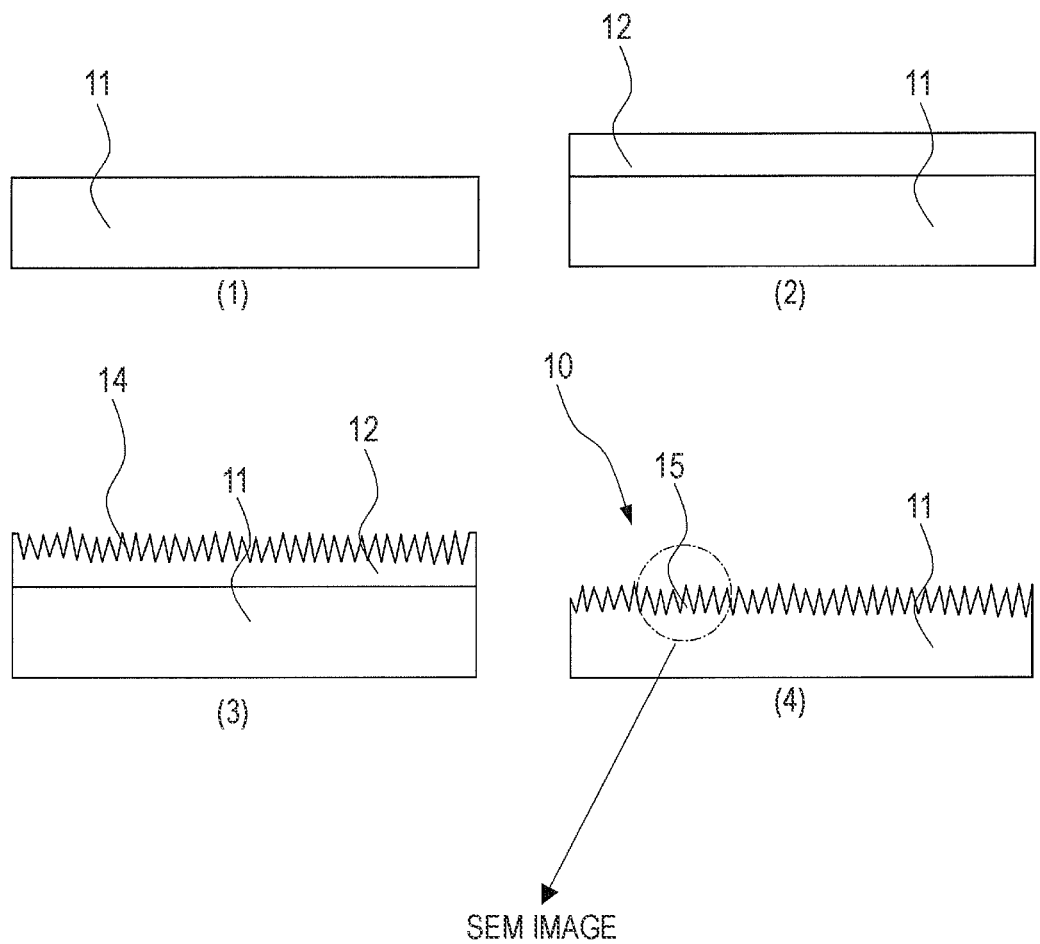
FIG. 4 is a cross-sectional view illustrating the fabricating process of an example of a first fabrication method of an anti-reflection structure according to a first embodiment of the present invention, also showing SEM images.
Figure 4:
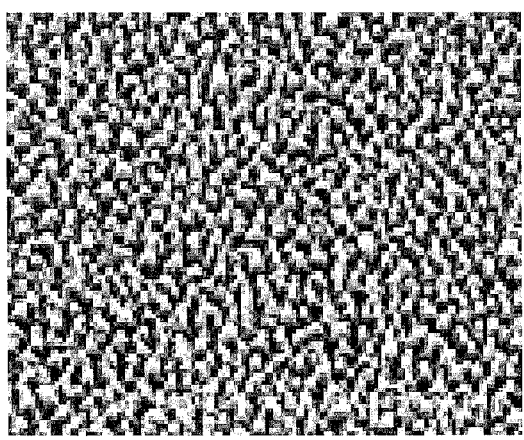
Figure 4:
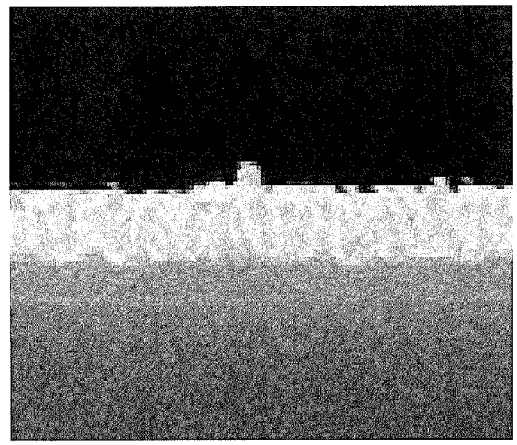

As illustrated in (1) in FIG. 4, a target substrate 11 on which a micro-protrusion pattern is to be formed is prepared.

As the target substrate 11, a silicon oxide film, a silicon nitride film, a silicon oxynitride, and the like may be used. Such a film may be applicable to an inorganic passivation film which is formed below a color filter of a solid-state imaging device, for example.

Subsequently, as illustrated in (2) in FIG. 4, a resin film 12 having micro-particles (not shown) dispersed therein is formed on a surface of the target substrate 11. The resin film 12 may be formed by preparing a resin serving as a base material of the resin film 12 and a solvent that dissolves the resin, dissolving the resin in the solvent, uniformly dispersing the micro-particles (not shown) in a solution obtained thus, and coating a material obtained thus onto the surface of the target substrate 11 according to a coating method, for example.

Examples of the resin of the resin film 12 include a novolac-based resin, a styrene-based resin, an acrylic resin, a polysiloxane-based resin, and a polyimide-based resin. These resins may be used either solely or in a mixed form. Among them, a novolac-based resin is preferred because it is cheap and excellent in coating properties.

As the micro-particles (not shown), silicon oxide ($SiO_2$) may be used. Alternatively, metal oxides such as aluminum oxides ($Al_2O_3$), antimony oxides ($Sb_2O_3$), stannic oxides ($SnO_2$), titanium oxides ($TiO_2$), manganese oxides ($MnO_2$), or zirconium oxides ($ZrO_2$) may be used. These resins may be used either solely or in a mixed form.

Alternatively, a phthalocyanine compound which is a colorant pigment containing inorganic substances and expressed by the following formula (1) can be used. As a central metal of the phthalocyanine compound, one selected from the group consisting of copper (Cu), iron (Fe), cobalt (Co), nickel (Ni), zinc (Zn), platinum (Pt), and palladium (Pd) is used. Among them, a copper-phthalocyanine compound is preferred because it is cheap and excellent in coating properties.

Formula 1

Examples of the solvent include methyl cellusolve, ethyl cellusolve, methyl cellusolve acetate, ethyl cellusolve acetate, diethylene glycol dimethyl ether, ethylene glycol monoisopropyl ether, propylene glycol monomethyl ether, propylene glycol monomethyl ether acetate, N-methyl pyrrolidone, γ-buthyolactone, dimethyl sulfoxide, N,N-dimethyl formamide, cyclohexanone, ethyl acetate, n-buthyl acetate, pyruvic ethyl, ethyl lactate, n-buthyl lactate, and diacetone alcohol. Among these examples, γ-buthyolactone, N,N-dimethyl formamide, cyclohexanone, pyruvic ethyl, ethyl lactate, n-buthyl lactate, and diacetone alcohol are preferred.

These solvents may be used either solely or in a mixed form.

Particularly, as the solvent, ethyl acetate is preferred because it is cheap and excellent in coating properties.

A curing agent may be added to the solvent. Examples of the curing agent include an epoxy-based curing agent and a melamine-based curing agent, and these curing agents may be used either solely or in a mixed form. Moreover, the curing agent may not be added.

Subsequently, as illustrated in (3) in FIG. 4, the micro-particles (not shown) are etched using the micro-particles in the resin film 12 as a mask while gradually etching the micro-particles, thus forming a micro-protrusion dummy pattern 14 on the resin film 12.

Subsequently, as illustrated in (4) in FIG. 4, the surface of the target substrate 11 is etched back together with the resin film 12 having the micro-protrusion dummy pattern 14 formed thereon. As a result, a surface shape of the micro-protrusion dummy pattern 14 formed on the surface of the resin film 12 is transferred to the surface of the target substrate 11, and thus a micro-protrusion pattern 15 is formed on the surface of the target substrate 11.

Next, a specific example of the case of forming an anti-reflection structure according to the fabrication method described above will be described.

As the target substrate 11, a plasma-CVD silicon nitride (P—SiN) film is used. A resin film 12 having micro-particles dispersed therein is formed thereon. The resin film 12 is formed to a thickness of 0.5 μm, for example. Thereafter, heat treatment is performed for 5 minutes at a temperature of 200° C., whereby the resin film 12 is cured.

A coating solution for forming the resin film 12 is prepared from a mixture of 5 parts of a copper-phthalocyanine colorant, 15 parts of polyhydroxystyrene in solid content, 5 parts of hexamethoxy methyl melamine as a curing agent, and 70 parts of ethyl lactate as a solvent. Thereafter, a mixture solution obtained thus is filtered through a membrane filter having a pore size of 0.1 μm, and a coating solution is obtained.

As the copper-phthalocyanine colorant, C.I.SB67: Oleosol Fast Blue RL (manufactured by Taoka Chemical Co., Ltd.) is used, for example. As the polyhydroxystyrene, Marukalyncur-M (manufactured by Maruzen Petrochemical Co., Ltd.) is used, for example. The Marukalyncur-M which has a weight-average molecular weight of 4100 (in catalog value) and a dispersivity of 1.98 is used 15 parts in solid content. As the hexamethoxy methylol melamine used as the curing agent, NIKALAC MW-390 (manufactured by Sanwa Chemical Co., Ltd.) is used, for example. This is hexamethoxy methylol melamine having a purity of 98.3 (catalog value).

Thereafter, heat treatment (baking) is performed on the resin film 12 to be cured.

Subsequently, the resin film 12 is etched under the following dry etching conditions, whereby a micro-protrusion dummy pattern 14 is formed having a shape such that it is 120 nm in height and 50 nm in width and depth.

In the dry etching, a magnetron reactive ion etching device is used. As the etching conditions, a bias peak power is set to −150 W. Oxygen ($O_2$) and chlorine ($Cl_2$) are used as an etching gas. The flow rates for the oxygen (O) and the chlorine ($Cl_2$) are set to 70 $cm^3$/sec and 40 $cm^3$/sec, respectively, and etching duration is 20 seconds.

Isotropic dry etching is performed further, whereby a micro-protrusion pattern 15 is formed in which the shape of the micro-protrusion dummy pattern 14 has been transferred to the surface of the plasma-CVD silicon nitride (P—SiN) film of the target substrate 11.

In this way, an anti-reflection structure 10 is formed from the micro-protrusion pattern 15 which is formed on the entire surface of the target substrate 11.

In the dry etching, a magnetron reactive ion etching device is used. In addition, as the etching conditions, a bias peak power is set to −150 W. Oxygen ($O_2$) and chlorine ($Cl_2$) are used as an etching gas. The flow rates for the oxygen ($O_2$) and the chlorine ($Cl_2$) are set to 70 $cm^3$/sec and 40 $cm^3$/sec, respectively, and etching duration is 40 seconds.

By the fabrication method described above, the micro-protrusion pattern 15 is formed on the surface of the plasma-CVD silicon nitride (P—SiN) film of the target substrate 11. Referring to (5) and (6) in FIG. 4, the bird's eye-view SEM image and the cross-sectional SEM image of the surface of the target substrate 11 having the micro-protrusion pattern 15 formed thereon are illustrated, respectively.

In the first example of the fabrication method, since the micro-particles (not shown) are dispersed in the resin film 12, when the resin film 12 is etched in this state, etching of the surface of the resin film 12 progresses with the micro-particles used as a mask. At this time, since the micro-particles are also etched gradually, when the etching progresses, the micro-particles are thinned with the etching and are finally removed. As a result, the micro-protrusion dummy pattern 14 is formed on the surface of the resin film 12.

In this way, since the micro-particles serving as the etching mask are thinned with the progress of the etching, the micro-protrusion dummy pattern 14 is formed into a conical protrusion structure (moth-eye structure).

When the surface shape of the micro-protrusion dummy pattern 14 is transferred to the surface of the target substrate 11 in such a state, thus forming the micro-protrusion pattern on the surface of the target substrate 11, the micro-protrusion pattern 15 is formed with the same shape as the micro-protrusion dummy pattern 14.

Therefore, a highly reliable anti-reflection structure can be fabricated at low cost and by a simple method.

Moreover, by changing the size and material of the micro-particles, the kind of the etching gas, an atmospheric pressure of the etching, the supply flow rate of the etching gas, the etching temperature, the etching method, and the like, it is possible to fabricate an optimum anti-reflection structure.

Moreover, the use of the coating method enables the micro-particles to be uniformly dispersed in the resin film 12. Therefore, since the micro-protrusion dummy pattern can be uniformly or substantially uniformly arranged on the surface of the resin film 12, it is possible to form the micro-protrusion pattern uniformly and substantially uniformly on the surface of the target substrate 11.

Furthermore, since a heat-curing agent is contained in the resin film 12, it is easy to cure the resin film 12 by heat treatment (baking) when the resin film 12 is formed by a coating method.

In addition, even when the micro-particles serving as a mask are metallic particles, since the metallic particles are removed by etching, there is no concern that the metallic particles will remain as contaminating substances. Furthermore, since the metallic particles are removed by dry etching, the etched metal will be discharged outside an etching chamber.

2. Second Embodiment

First Example of Second Fabrication Method of Anti-Reflection Structure

Next, a first example of a second fabrication method of an anti-reflection structure according to a second embodiment of the present invention will be described with reference to the cross-sectional views shown in FIGS. 5 and 6.

Figure 5:
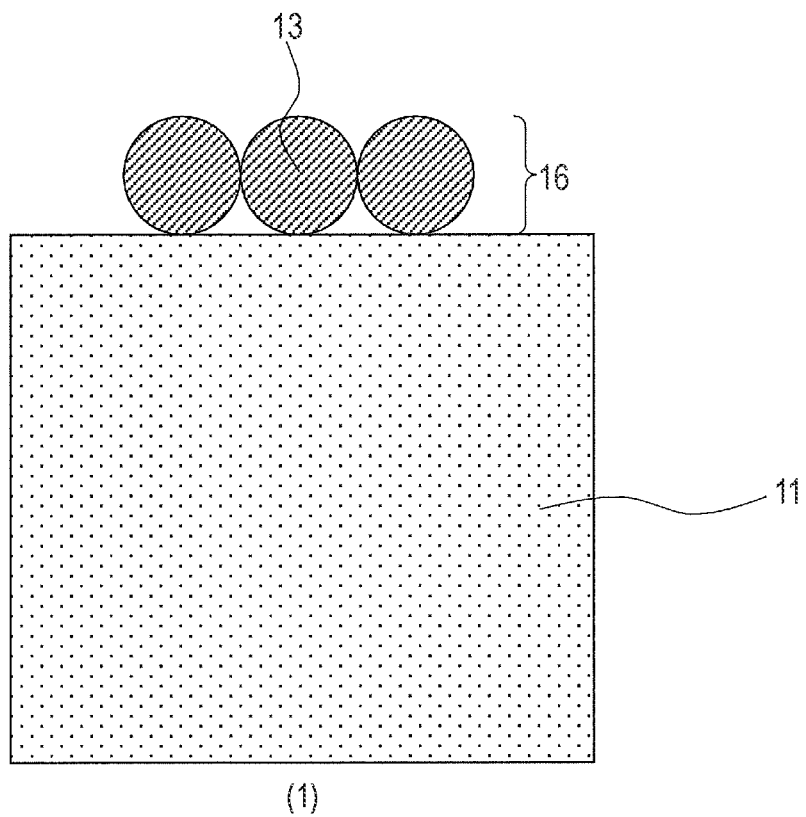
FIG. 5 is a cross-sectional view illustrating the fabricating process of a first example of a second fabrication method of an anti-reflection structure according to a second embodiment of the present invention.
Figure 5:
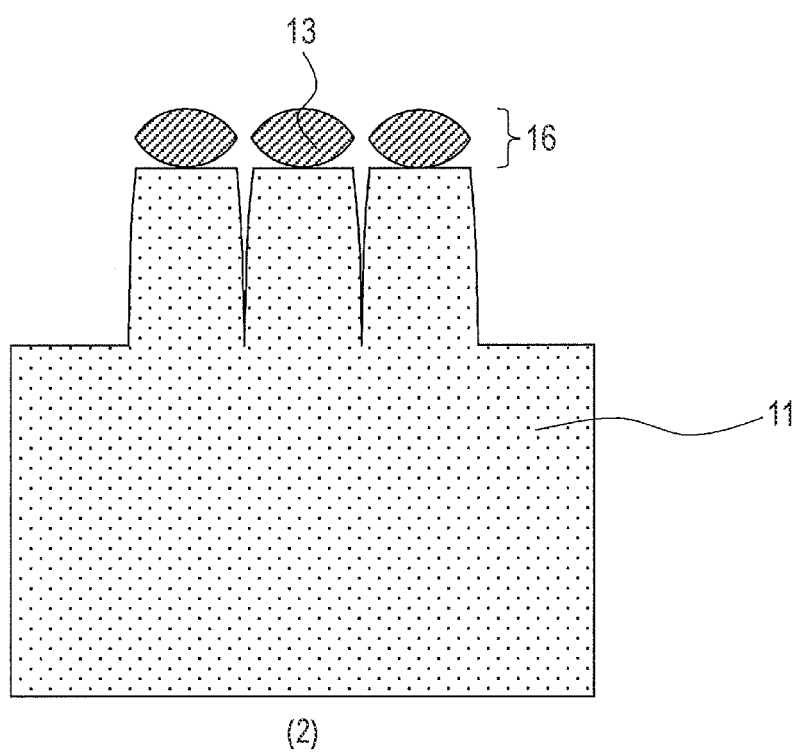

As illustrated in (1) in FIG. 5, micro-particles 13 are arranged on a surface of a target substrate 11.

For example, a solvent (not shown) having the micro-particles 13 dispersed therein is formed into a film form on the surface of the target substrate 11 so that the micro-particles 13 are arranged on the surface of the target substrate 11.

Specifically, the solvent (not shown) having the micro-particles 13 dispersed therein is applied into a film form onto the surface of the target substrate 11 by a coating method, and the solvent is then evaporated, whereby only the micro-particles 13 are arranged on the surface of the target substrate 11.

Examples of a specific film formation method include dry solidification, electrophoresis absorption film, air-liquid interface mono-particle film, spin coating, photo-coupling method, and other liquid thin-film method.

For example, a silicon nitride film used as a passivation film of a solid-state imaging device is used as the target substrate 11, and silicon oxide particles (silica particles) are used as the micro-particles 13 serving as a mask. As the solvent, a coating solution is prepared using an aqueous solution (density: 0.1 to 1.0 wt %) of water and silica particles having a particle size of about 100 nm. For example, the coating solution is applied using a spin coater onto the target substrate 11 of the silicon nitride film which has been formed on the uppermost surface of a silicon substrate (not shown).

It should be noted that the particle size of the silica particles is not necessary to be controlled strictly. Although the particle size is determined depending on the wavelength of light that should be prevented from reflection, there will be no substantial problem if the size is smaller than about 300 nm and can be stably processed, that is to say, about 10 nm or larger. Moreover, a coating device is not limited to the spin coater, and a nozzle spray coating device may be used.

Thereafter, the solvent is dried and evaporated by baking or the like, whereby a mono-particle layer 16 is obtained (which is a state where the silica particles are arranged in a single layer).

Subsequently, as illustrated in (2) in FIG. 5 to (4) in FIG. 6, anisotropic etching in which an etching rate for the target substrate 11 is higher than an etching rate for the micro-particles 13 is performed, whereby a micro-protrusion pattern 15 is formed on the surface of the target substrate 11. In the anisotropic etching, the etching selectivity between the target substrate 11 and the micro-particles 13 is controlled to be constant.

Specifically, anisotropic etching is performed on the target substrate 11 having the mono-particle layer 16 formed thereon using a parallel-plate plasma etching device. As an etching gas of the anisotropic etching, carbon tetrafluoride ($CF_4$), argon (Ar), and oxygen ($O_2$) are used. For example, the flow rates for $CF_4$, Ar, and $O_2$ are set to 10 $cm^3$/min, 100 $cm^3$/min, and 6 $cm^3$/min, respectively. Moreover, an atmospheric pressure (internal pressure of a chamber) of the etching is set to 0.67 Pa, a source power to 1000 W, a bias power to 500 W, and a substrate temperature to 20° C. These conditions are exemplary and can be changed appropriately.

In the etching conditions, the etching selectivity between the silica particles and the silicon nitride film is 3. That is to say, the silica particles and the silicon nitride film are etched in a ratio of 1:3 in terms of per unit area.

(2) in FIG. 5 shows a state where the micro-particles 13 (silica particles) are etched to ½ of its thickness under the above-mentioned conditions. (3) in FIG. 6 shows a state where the micro-particles 13 (silica particles) are etched to ¾ of its thickness. In addition, (4) in FIG. 6 shows a state where the micro-particles 13 (silica particles) are completely etched.

By the etching step described above, a spindle-shaped micro-protrusion pattern 15 which is about 100 nm in width and about 300 nm in height can be formed on the surface of the target substrate 11.

In this way, an anti-reflection structure 10 is formed from a cluster of the micro-protrusion patterns 15 formed on the entire surface of the target substrate 11.

Since the higher the micro-protrusion pattern 15, the smoother becomes a refractive index variation, it is desirable for an anti-reflection structure. However, since the thicker the anti-reflection structure 10, the greater becomes the amount of light absorbed therein, the height of the micro-protrusion pattern 15 may be determined in consideration of light reflection and absorption.

Although in this embodiment, the etching selectivity is controlled so that an aspect ratio (the ratio of height to width dimensions) is 3, the width and height dimensions of the micro-protrusion pattern 15 may be determined depending on the performance needed by a device. Moreover, various conditions for the micro-particles 13 and etching may be determined based on the determined dimensions.

Even when a film of a material having a different refractive index from that of the silicon nitride film is formed on the micro-protrusion pattern 15 which are formed on the surface of the target substrate 11 made from the silicon nitride film, reflection will be made very difficult to occur. Moreover, even when an air layer is disposed on the micro-protrusion pattern 15 rather than a film of another material, reflection will be made very difficult to occur.

The micro-particles 13 that can be used in the embodiment of the present invention are not limited to silicon oxide particles (silica particles). Examples of inorganic particles include particles made from compounds of oxides, nitrides, carbides, borides, sulfides, and the like, and metallic particles.

Examples of the oxides include silicon oxides (silica), aluminum oxides (alumina), zirconium oxides (zirconia), titanium oxides (titania), cerium oxides (ceria), zinc oxides, and tin oxides.

Examples of the nitrides include silicon nitrides, aluminum nitrides, and boron oxides.

Examples of the carbides include silicon carbides, boron carbides, diamond, graphite, and fullerene series.

Examples of the borides include zirconium borides ($ZrB_2$) and chrome borides ($CrB_2$).

Examples of the metallic particles include gold, solver, platinum, palladium, copper, nickel, cobalt, and iron.

However, more suitably, micro-particles are preferable which are made from materials containing on metallic elements which may cause contaminations. Therefore, suitable examples include silicon, silica, diamond, silicon nitrides, and silicon carbides (SiC).

Examples of organic material include styrene-based resin such as polystyrene, acryl-based resin such as polymethylmethacrylate, polymer obtained by coordination polymerization of polyethylene, polypropylene, or the like, polymer obtained by condensation polymerization of polycarbonate, polyamide (for example, Nylon 66 (Registered Trademark)), polyesther, polyimide, polyphenylene ether, polyarylene sulfide, polyetherketone, polyetheretherketone, or the like, polymer obtained by ring-opening polymerization of Nylon 6 (Registered Trademark), polycaprolactone, or the like, and organic crystal such as pigment.

Although a suitable particle shape of the micro-particles 13 includes a polyhedral shape, and a spherical shape, among them, a spherical shape is preferable because it allows easy arrangement control and it is easy to obtain a closest packed structure. Although a particle size can be appropriately chosen depending on a desired anti-reflection structure, an average particle size is preferably in a range of equal to or greater than 10 nm and equal to or less than 300 nm.

Although there is no particular limitation on a particle size distribution of the micro-particles 13, particles exhibiting a sharp size distribution, particularly, monodisperse particles are preferable to those exhibiting a great size distribution from the perspective of easiness in obtaining the mono-particle layer.

All materials used for a solid-state imaging device and a camera module can be used for the target substrate 11. Examples of such materials include a silicon substrate, a single-crystalline silicon film, a poly-crystalline silicon film, an amorphous silicon film, a silicon oxide film, a silicon nitride film, a silicon oxynitride film, a resin film, a tungsten film, an aluminum film, a copper (Cu) film, glass, quartz, and a resin board.

The materials of the micro-particles 13 may be chosen so as to comply with the etching conditions suitable for the target substrate 11, and the etching conditions may be adjusted so that an etching selectivity complies with formation of the anti-reflection structure described above.

In the first example of the second fabrication method of the anti-reflection structure 10 described above, anisotropic etching in which the etching rate for the target substrate 11 is higher than the etching rate for the micro-particles 13 is performed in a state where the micro-particles 13 are arranged on the surface of the target substrate 11.

As a result, it is possible to etch the surface of the target substrate 11 while using the micro-particles 13 as an etching mask. Moreover, since the micro-particles 13 are etched at a lower etching rate than that for the target substrate 11, the micro-protrusion pattern 15 is formed into a shape such that a volume of each protrusion increases in an approximately linear fashion from the apex to the bottom of each protrusion when the protrusion is divided into equal thicknesses in a height direction thereof.

Moreover, since the micro-particles 13 are spherical in shape, when the surface of the target substrate 11 is etched while the micro-particles 13 are etched, a spindle-shaped micro-protrusion pattern 15 is formed on the surface of the target substrate 11.

Therefore, the use of spherical or approximately spherical micro-particles enables formation of a microscopic 2-dimensional pattern necessary for an anti-reflection structure without using expensive lithographic means.

Moreover, since the micro-particles 13 are dispersed in a solvent, it is possible to uniformly distribute the micro-particles 13. Therefore, the micro-particles 13 in the solvent having the micro-particles 13 dispersed therein, which are formed on the surface of the target substrate 11 can be arranged in a uniform distribution on the surface of the target substrate 11. Moreover, when the solvent has a viscosity of around 0.01 Pa·s, for example, it is possible to arrange the micro-particles 13 in a curved surface shape.

Figure 7:
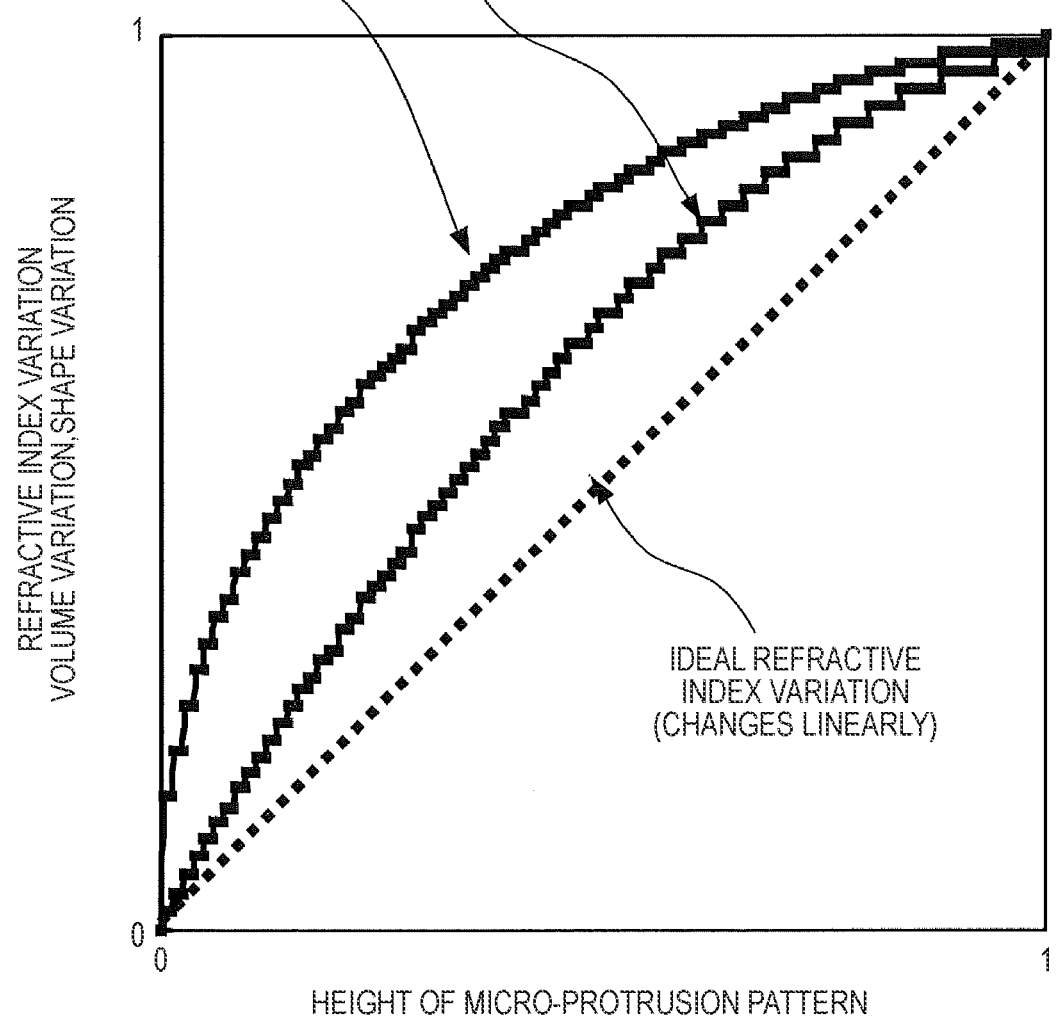
FIG. 7 is a graph showing the relationship between refractive index variation, volume variation, shape variation, and height of a micro-protrusion pattern.

According to the first example of the second fabrication method, although it is possible to obtain an anti-reflection structure, as illustrated in FIG. 7, the micro-protrusion pattern 15 does not have a shape such that it exhibits a most suitable volume variation.

Figure 6:
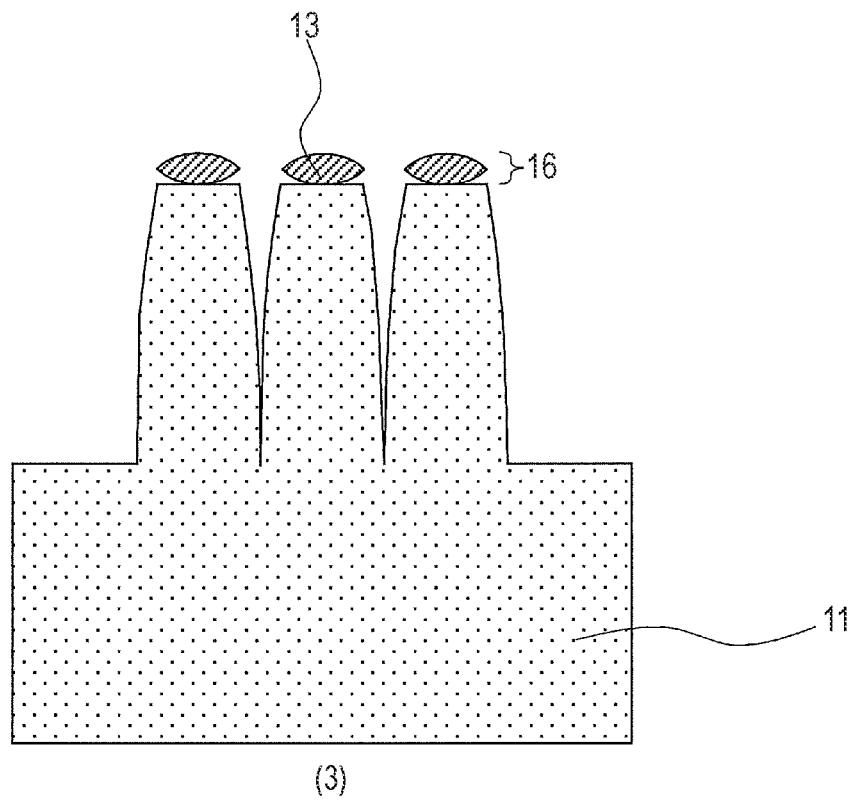
FIG. 6 is a cross-sectional view illustrating the fabricating process of the first example of the second fabrication method of the anti-reflection structure.
Figure 6:
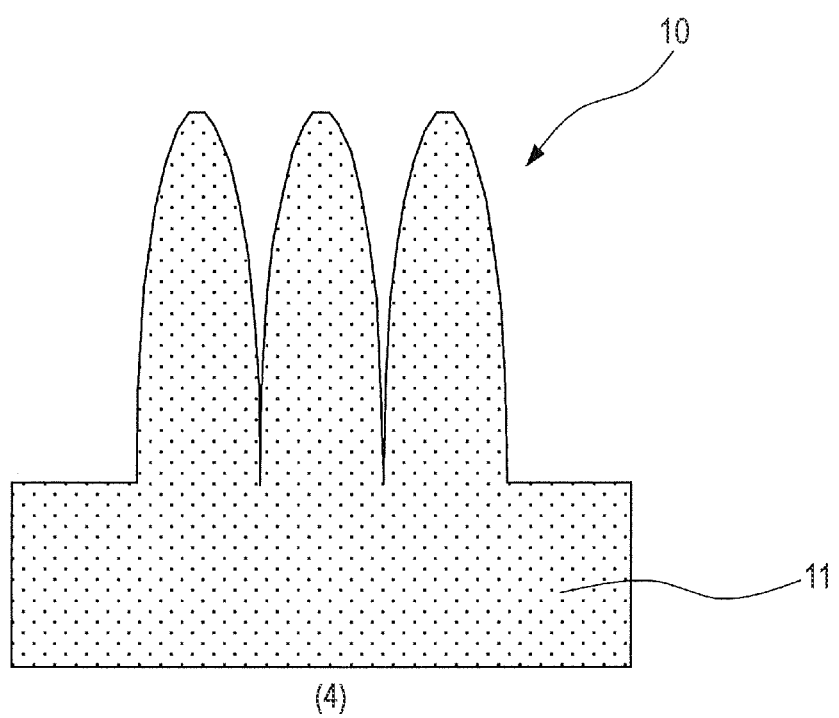

Referring to FIG. 7, a shape variation of the micro-protrusion pattern 15 shown in (4) in FIG. 6 and a volume variation, namely a refractive index variation, are illustrated. It is preferable that the volume variation, namely the refractive index variation changes linearly from 0 to 1.

In FIG. 7, the vertical axis represents a refractive index variation, a volume variation, and a shape variation, and the horizontal axis represents a height of the micro-protrusion pattern. In the figure, since the height is normalized to the radius of the micro-particle 13, the variations are not dependent on the aspect ratio of the micro-protrusion pattern 15. Moreover, the degree of variation of the refractive index ranges from 0 to 1, and thus, in an actual anti-reflection structure, this variation corresponds to a change from the refractive index of the silicon nitride film to the refractive index of a substance on an upper layer thereof.

Second Example of Second Fabrication Method of Anti-Reflection Structure

Next, a second example of the second fabrication method of an anti-reflection structure according to the second embodiment of the present invention will be described with reference to the cross-sectional views shown in FIGS. 8 and 9.

Figure 8:
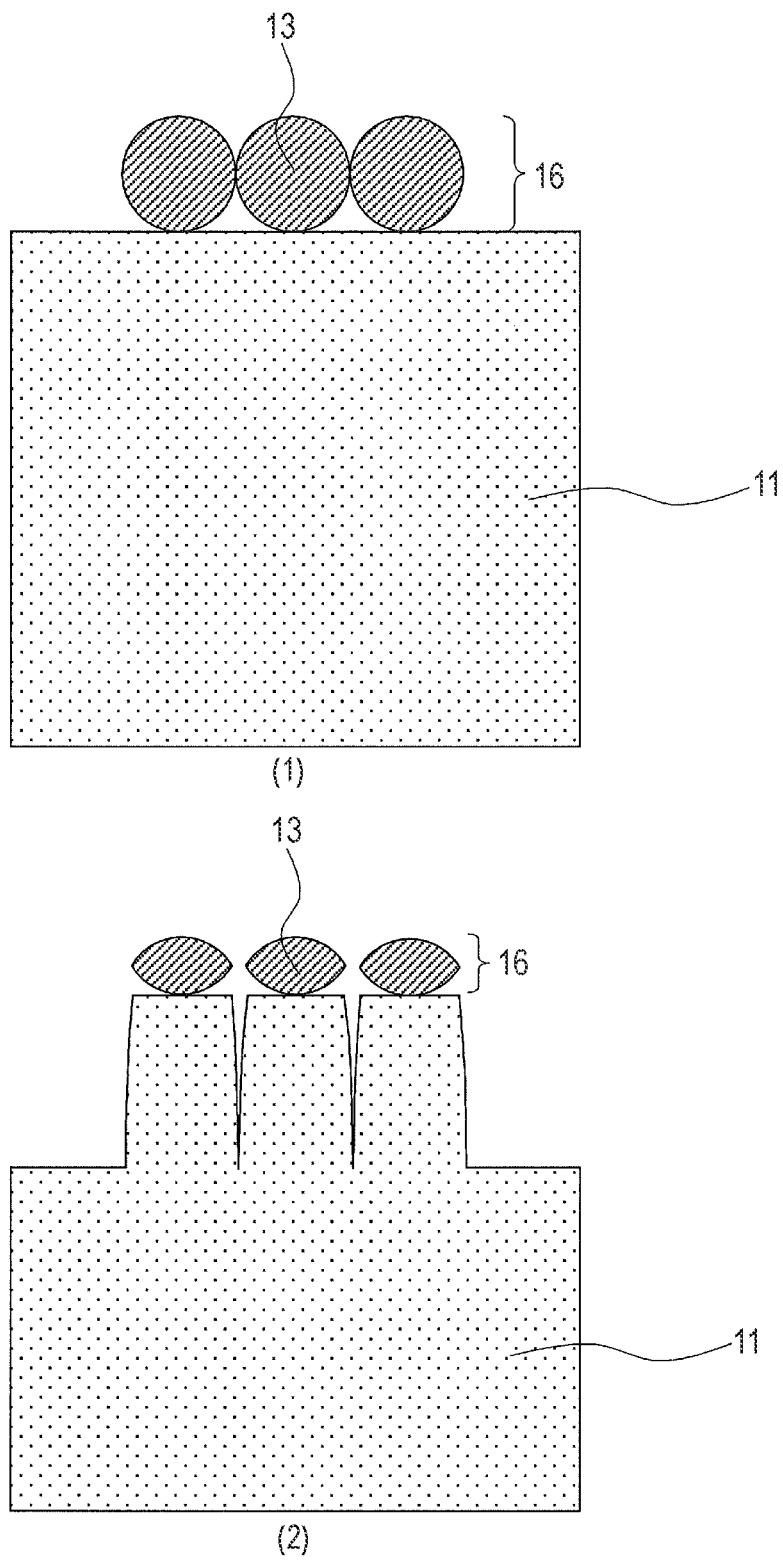
FIG. 8 is a cross-sectional view illustrating the fabricating process of a second example of the second fabrication method of the anti-reflection structure according to the second embodiment of the present invention.

As illustrated in (1) in FIG. 8, similar to the first example described above, micro-particles 13 are arranged on a surface of a target substrate 11.

For example, a solvent (not shown) having the micro-particles 13 dispersed therein is formed into a film form on the surface of the target substrate 11 so that the micro-particles 13 are arranged on the surface of the target substrate 11.

Specifically, the solvent (not shown) having the micro-particles 13 dispersed therein is applied into a film form onto the surface of the target substrate 11 by a coating method, and the solvent is then evaporated, whereby only the micro-particles 13 are arranged on the surface of the target substrate 11.

Examples of a specific film formation method include dry solidification, electrophoresis absorption film, air-liquid interface mono-particle film, spin coating, photo-coupling method, and other liquid thin-film method.

For example, a silicon nitride film used as a passivation film of a solid-state imaging device is used as the target substrate 11, and silicon oxide particles (silica particles) are used as the micro-particles 13 serving as a mask. As the solvent, a coating solution is prepared using an aqueous solution (density: 0.1 to 1.0 wt %) of water and silica particles having a particle size of about 100 nm. For example, the coating solution is applied using a spin coater onto the target substrate 11 of the silicon nitride film which has been formed on the uppermost surface of a silicon substrate (not shown).

It should be noted that the particle size of the silica particles is not necessary to be controlled strictly. Although the particle size is determined depending on the wavelength of light that should be prevented from reflection, there will be no substantial problem if the size is smaller than about 300 nm and can be stably processed, that is to say, about 10 nm or larger. Moreover, a coating device is not limited to the spin coater, and a nozzle spray coating device may be used. Thereafter, the solvent is dried and evaporated by baking or the like, whereby a mono-particle layer 16 is obtained (which is a state where the spindle-shaped are arranged in a single layer).

Subsequently, as illustrated in (2) in FIG. 8 to (4) in FIG. 9, anisotropic etching in which an etching rate for the target substrate 11 is higher than an etching rate for the micro-particles 13 is performed, whereby a micro-protrusion pattern 15 is formed on the surface of the target substrate 11. In the anisotropic etching, a relationship of etching selectivity between the target substrate 11 and the micro-particles 13 is varied, and an etching rate for the target substrate 11 is higher than an etching rate for the micro-particles 13. In this way, a height-wise volume variation of the micro-protrusion pattern 15 changes in an approximately linear fashion.

Specifically, anisotropic etching is performed on the target substrate 11 having the mono-particle layer 16 formed thereon using a parallel-plate plasma etching device. As an etching gas of the anisotropic etching, carbon tetrafluoride ($CF_4$), argon (Ar), and oxygen ($O_2$) are used. For example, the flow rates for $CF_4$, Ar, and $O_2$ are initially set to 4 cm$^3$/min, 100 cm$^3$/min, and 6 cm$^3$/min, respectively. Moreover, an atmospheric pressure (internal pressure of a chamber) of the etching is set to 0.67 Pa, a source power to 1000 W, a bias power to 500 W, and a substrate temperature to 20° C. These conditions are exemplary and can be changed appropriately.

(2) in FIG. 8 shows a state where the micro-particles 13 (silica particles) are etched to ½ of its thickness under the above-mentioned conditions.

Subsequently, as illustrated in (3) in FIG. 9, the etching selectivity is set to 3 while maintaining the flow rate for oxygen ($O_2$) to 6 cm$^3$/min until 700 of the micro-particles 13 (silica particles) is etched. The figure illustrates a state where the micro-particles 13 (silica particles) are etched to 70 of its thickness.

Subsequently, as illustrated in (4) in FIG. 9, the etching selectivity is set to 4 while maintaining the flow rate for oxygen ($O_2$) to 8 cm$^3$/min until the micro-particles 13 (silica particles) are etched to 90 of its thickness. Furthermore, the etching selectivity is set to 5 while maintaining the flow rate for oxygen (O$_2$) to 10 cm$^3$/min until the micro-particles 13 (silica particles) are completely etched. The figure illustrates a state where the micro-particles 13 (silica particles) are etched completely.

By these steps described above, a spindle-shaped micro-protrusion pattern 15 which is about 100 nm in width and about 300 nm in height can be formed on the surface of the target substrate 11.

In this way, an anti-reflection structure 10 is formed from a cluster of the micro-protrusion patterns 15 formed on the entire surface of the target substrate 11.

Figure 10:
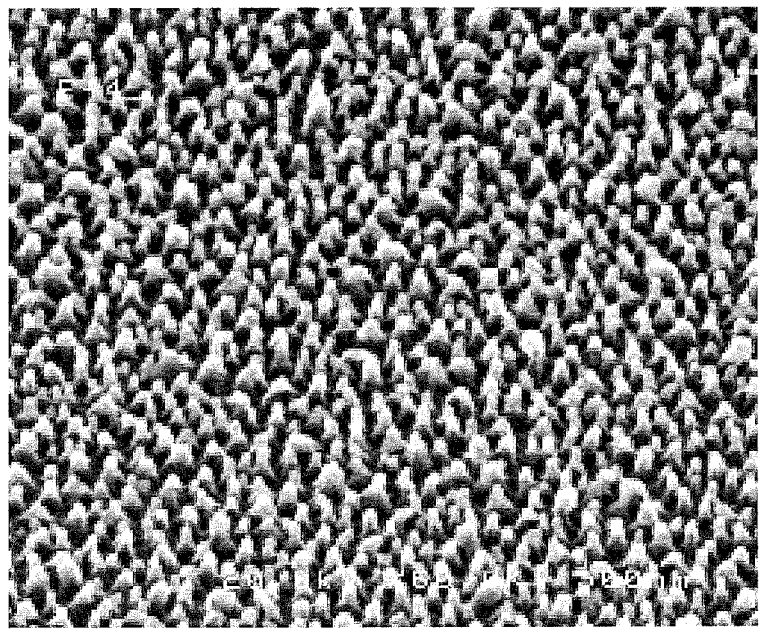
FIG. 10 shows cross-sectional SEM images of the anti-reflection structure.
Figure 10:
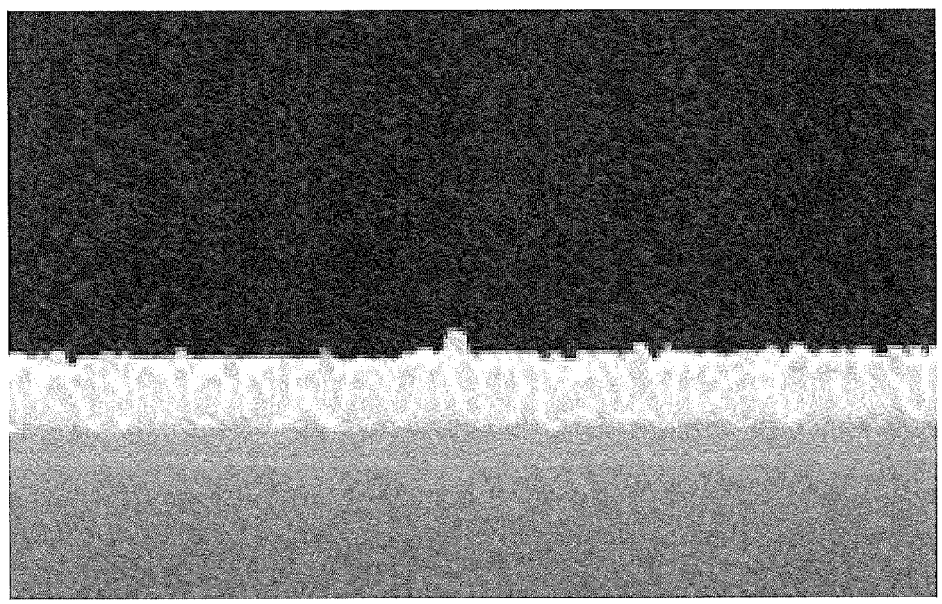

The anti-reflection structure 10 is formed as illustrated in the bird's eye-view SEM image in (1) in FIG. 10 and the cross-sectional SEM image in (2) in FIG. 10.

Since the higher the micro-protrusion pattern 15, the smoother becomes a refractive index variation, it is desirable for an anti-reflection structure. However, since the thicker the anti-reflection structure 10, the greater becomes the amount of light absorbed therein, the height of the micro-protrusion pattern 15 may be determined in consideration of light reflection and absorption.

Figure 11:
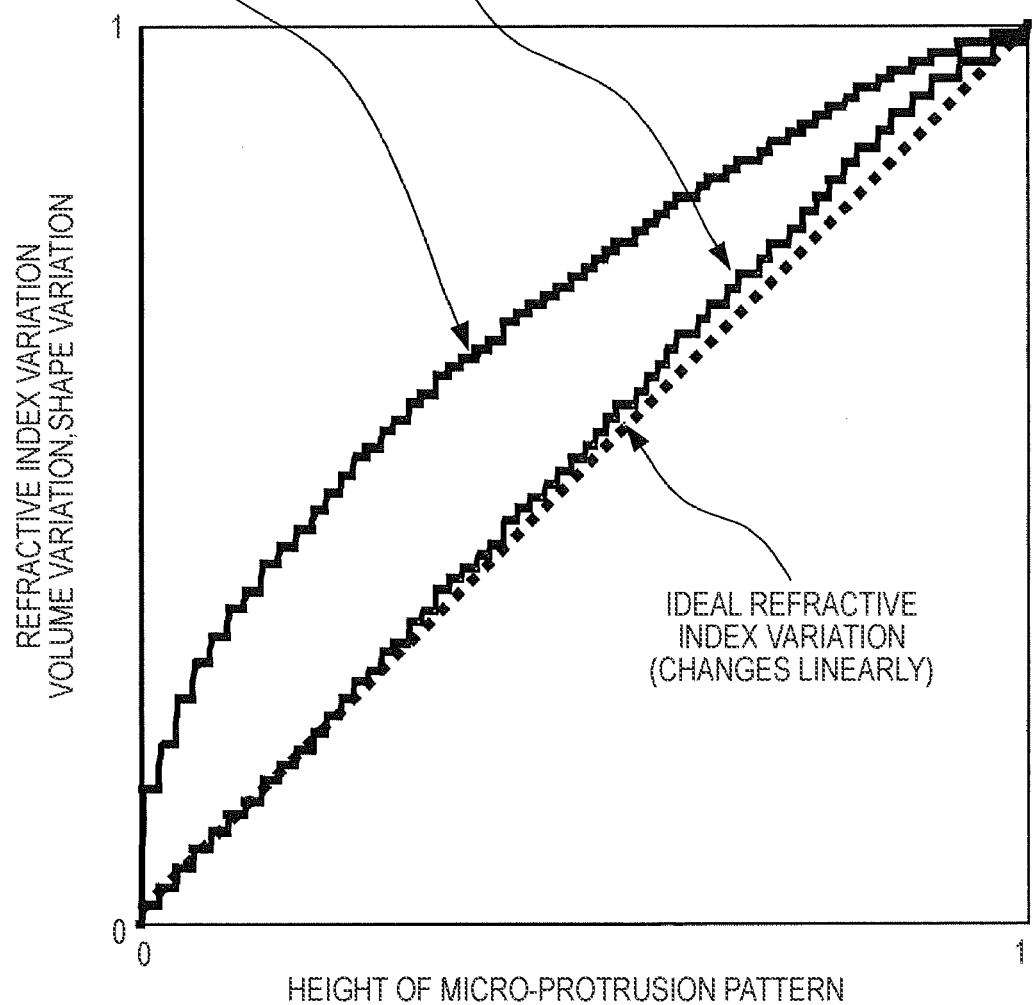
FIG. 11 is a graph showing the relationship between refractive index variation, volume variation, shape variation, and height of a micro-protrusion pattern.

Referring to FIG. 11, a refractive index variation of the micro-protrusion pattern 15 obtained by the fabrication method described above is illustrated.

Figure 3:
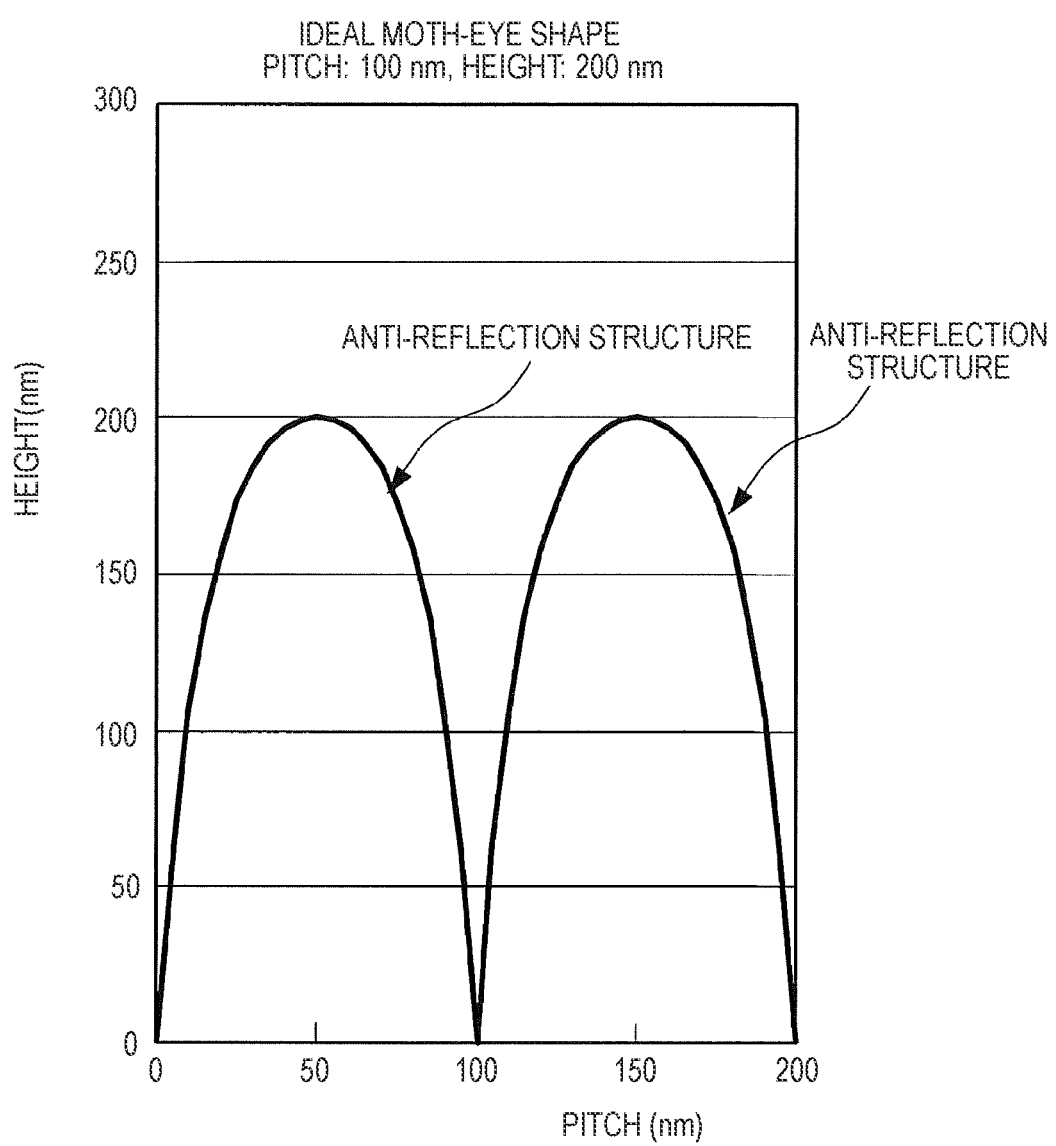
FIG. 3 is a diagram illustrating an ideal shape of a moth-eye structure.

As illustrated in FIG. 11, since the refractive index variation changes in an approximately linear fashion from 0 to 1, by varying the etching selectivity as described above, it is possible to form a suitable anti-reflection structure. That is to say, the micro-protrusion pattern 15 is formed with approximately the same shape as an ideal shape as illustrated in FIG. 3.

In FIG. 11, the vertical axis represents a refractive index variation, a volume variation, and a shape variation, and the horizontal axis represents a height of the micro-protrusion pattern. In the figure, since the height is normalized to the radius of the micro-particle 13, the variations are not dependent on the aspect ratio of the micro-protrusion pattern 15. Moreover, the degree of variation of the refractive index ranges from 0 to 1, and thus, in an actual anti-reflection structure, this variation corresponds to a change from the refractive index of the silicon nitride film to the refractive index of a substance on an upper layer thereof.

Although in this example, the etching selectivity between the micro-particles 13 (silica particles) and the target substrate 11 (silicon nitride film) is changed by changing the flow rate for oxygen (O$_2$), it is similarly possible to control the etching selectivity by changing a chamber pressure. Although the etching rate for the micro-particles 13 (silica particles) does not change much even when the chamber pressure is changed, the etching rate for the silicon nitride film changes. For example, when the chamber pressure is changed from 0.27 Pa to 13.3 Pa, the etching rate for the silicon nitride film can be increased by about three times.

Therefore, the etching conditions are set so that an initial etching selectivity is set to 2 (i.e., the micro-particles 13 (silica particles) and the silicon nitride film are etched in a ratio of 1:2 in terms of per unit area). Moreover, as described above, by increasing the chamber pressure to that the final etching selectivity becomes 5, it is similarly possible to form a suitable anti-reflection structure.

In the second example of the second fabrication method of the anti-reflection structure 10 described above, anisotropic etching in which the etching rate for the target substrate 11 is higher than the etching rate for the micro-particles 13 is performed in a state where the micro-particles 13 are arranged on the surface of the target substrate 11. As a result, it is possible to etch the surface of the target substrate 11 while using the micro-particles 13 as an etching mask.

In the anisotropic etching, a relationship of etching selectivity between the target substrate 11 and the micro-particles 13 is varied, and an etching rate for the target substrate 11 is higher than an etching rate for the micro-particle 13. In this way, a height-wise volume variation of the micro-protrusion pattern 15 changes in an approximately linear fashion as described above in FIG. 7.

Therefore, the refractive index changes in a linear fashion in the height direction of the micro-protrusion pattern 15 in the anti-reflection structure 10. That is to say, the refractive index decreases in a linear fashion from base to apex of the micro-protrusion pattern 15.

Moreover, the spherical shape of the micro-particles 13 makes the height-wise volume variation of the micro-protrusion pattern 15 easy to change in an approximately linear fashion. That is to say, this is because when the micro-particles 13 are thinned while being etched, the surface of the target substrate 11 is etched into a spindle-shape, whereby the micro-protrusion pattern 15 is formed. For example, if the micro-particles 13 have a planar shape, although the thickness of the micro-particles 13 decreases, since the size thereof remains almost unchanged, the target substrate 11 will be formed into a pillar-like shape in which the planar shape of the micro-particles 13 is transferred. Thus, the target substrate 11 will not have a spindle-shape.

Moreover, since the micro-particles 13 are dispersed in a solvent, it is possible to uniformly distribute the micro-particles 13. Therefore, the micro-particles 13 in the solvent having the micro-particles 13 dispersed therein, which are formed on the surface of the target substrate 11 can be arranged in a uniform distribution on the surface of the target substrate 11. In addition, the use of spherical or approximately spherical micro-particles enables formation of a microscopic 2-dimensional pattern necessary for an anti-reflection structure without using expensive lithographic means.

Similarly to the second example of the second fabrication method described above, the method of determining the etching conditions so that the etching selectivity increases with the progress of etching may be applied to the etching for forming the micro-protrusion dummy pattern 14 in the first fabrication method. In this case, it is possible to form the micro-protrusion dummy pattern 14 into a spindle-shape.

Third Example of Second Fabrication Method of Anti-Reflection Structure

Next, a third example of the second fabrication method of an anti-reflection structure according to the second embodiment of the present invention will be described with reference to the cross-sectional views shown in FIGS. 8 and 9.

As illustrated in (1) in FIG. 8, a transparent resin film such as polymethylmethacrylate (typically, PMMA) is used as a target substrate 11, and silicon oxides (silica particles) are used as micro-particles 13.

The transparent resin film which is the target substrate 11 is used for a planarization insulating film of a solid-state imaging device, a light emitting device, and a display device, a microlens, and the like.

A mono-particle layer 16 made from the micro-particles 13 is formed on a surface of the target substrate 11. A formation method thereof is the same as that described in the second example of the second fabrication method with reference to (1) in FIG. 5.

Figure 9:
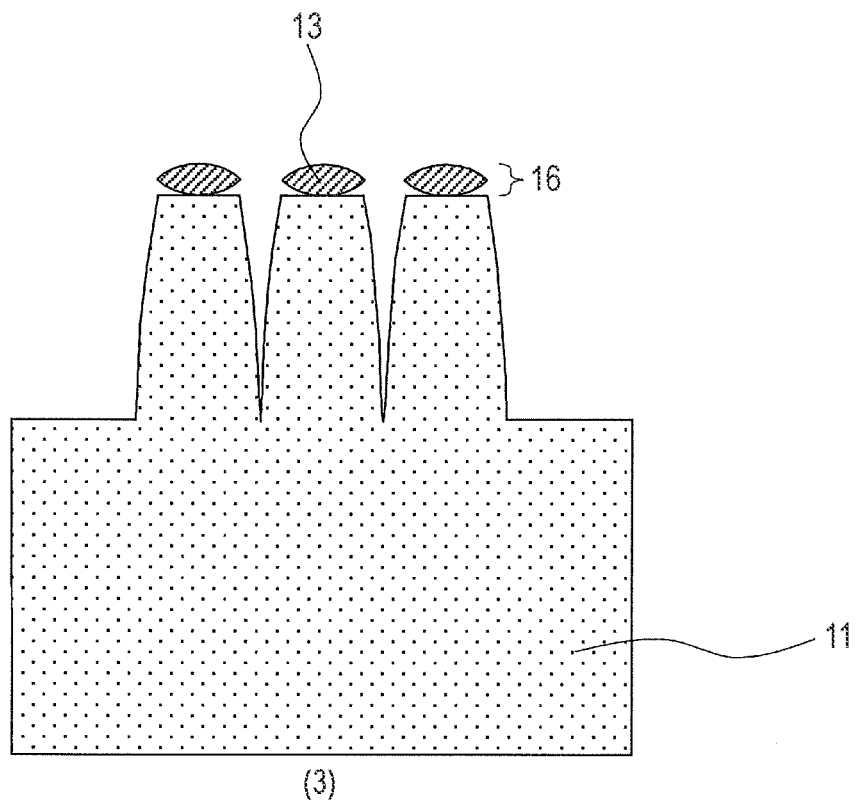
FIG. 9 is a cross-sectional view illustrating the fabricating process of the second example of the second fabrication method of the anti-reflection structure.
Figure 9:
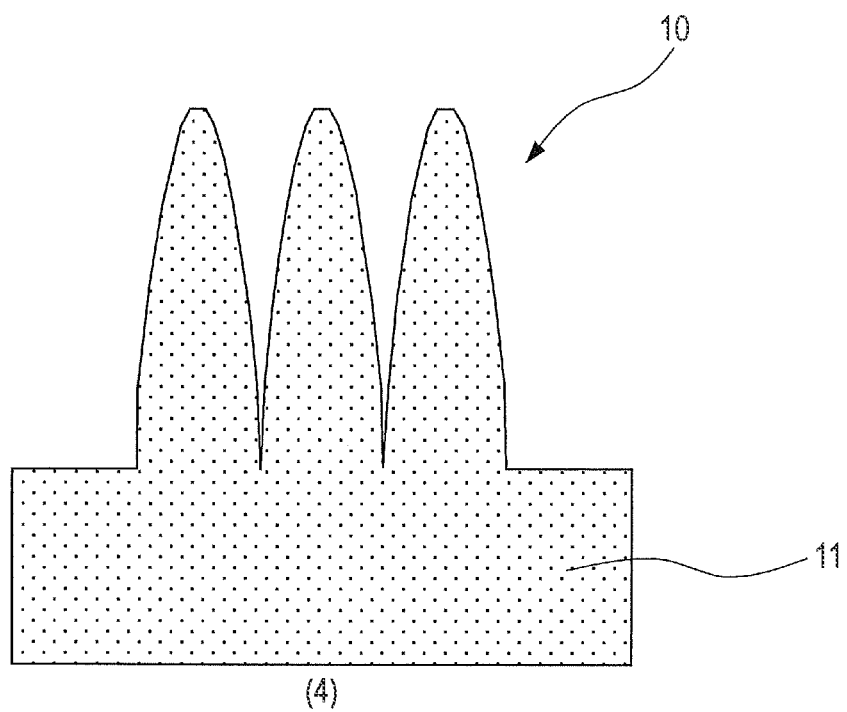

Thereafter, as illustrated in (2) in FIG. 8 to (4) in FIG. 9, anisotropic etching is performed on the micro-particles and the surface of the target substrate 11 using a parallel-plate plasma etching device.

The etching conditions are that sulfur hexafluoride ($SF_6$) and oxygen ($O_2$) are used as an etching gas. The initial flow rates for $SF_6$ and $O_2$ are set to 50 $cm^3$/min and 10 $cm^3$/min, respectively. Moreover, an atmospheric pressure (pressure of an etching chamber) of the etching is set to 4.0 Pa, a source power to 500 W, a bias power to 100 W, and a substrate temperature to 50° C.

Moreover, the initial flow rate for oxygen ($O_2$) is set to 10 $cm^3$/min until the micro-particles 13 (silica particles) are etched to 50% of its thickness. In this way, the etching selectivity is set to 2 (i.e., the micro-particles 13 (silica particles) and the PMMA are etched in a ratio of 1:2 in terms of per unit area).

Subsequently, the etching selectivity is set to 3 while maintaining the flow rate for oxygen ($O_2$) to 15 $cm^3$/min until the micro-particles 13 (silica particles) are etched to 70% of its thickness.

Subsequently, the etching selectivity is set to 4 while maintaining the flow rate for oxygen ($O_2$) to 20 $cm^3$/min until the micro-particles 13 (silica particles) are etched to 90% of its thickness. Furthermore, the etching selectivity is set to 5 while maintaining the flow rate for oxygen ($O_2$) to 25 $cm^3$/min until the micro-particles 13 (silica particles) are completely etched.

In the third example of the second fabrication method of the anti-reflection structure, similarly to the second example, the height-wise volume variation of the micro-protrusion pattern 15 changes in an approximately linear fashion.

Therefore, the refractive index changes in a linear fashion in the height direction of the micro-protrusion pattern 15 in the anti-reflection structure 10. That is to say, the refractive index decreases in a linear fashion from base to apex of the micro-protrusion pattern 15.

3. Third Embodiment

Example of First Fabrication Method of Solid-State Imaging Device

An example of a first fabrication method of a solid-state imaging device according to a third embodiment of the present invention will be described with reference to the cross-sectional views of FIGS. 12 to 13.

Figure 12:
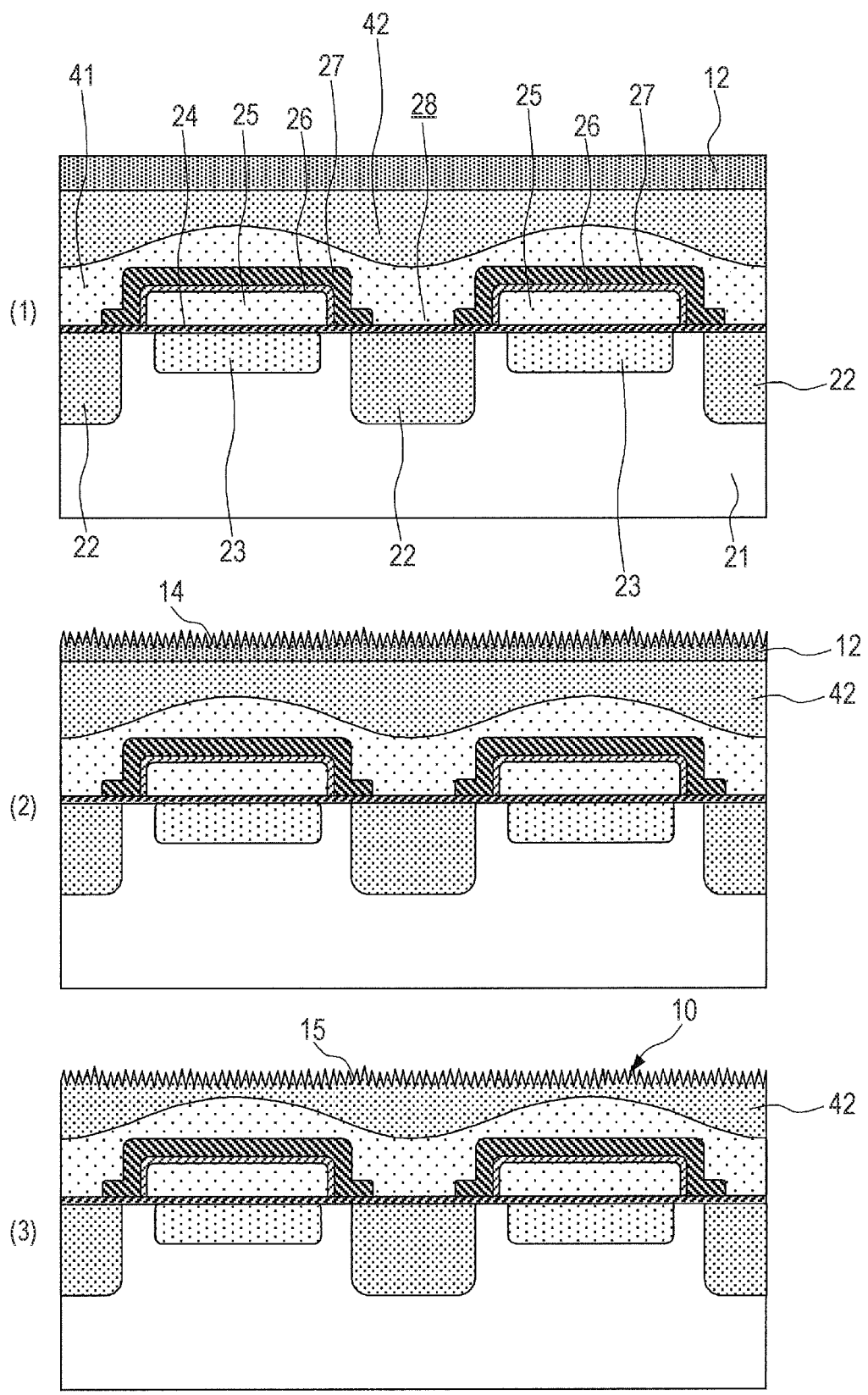
FIG. 12 is a cross-sectional view illustrating the fabricating process of an example of a first fabrication method of a solid-state imaging device according to a third embodiment of the present invention.
Figure 13:
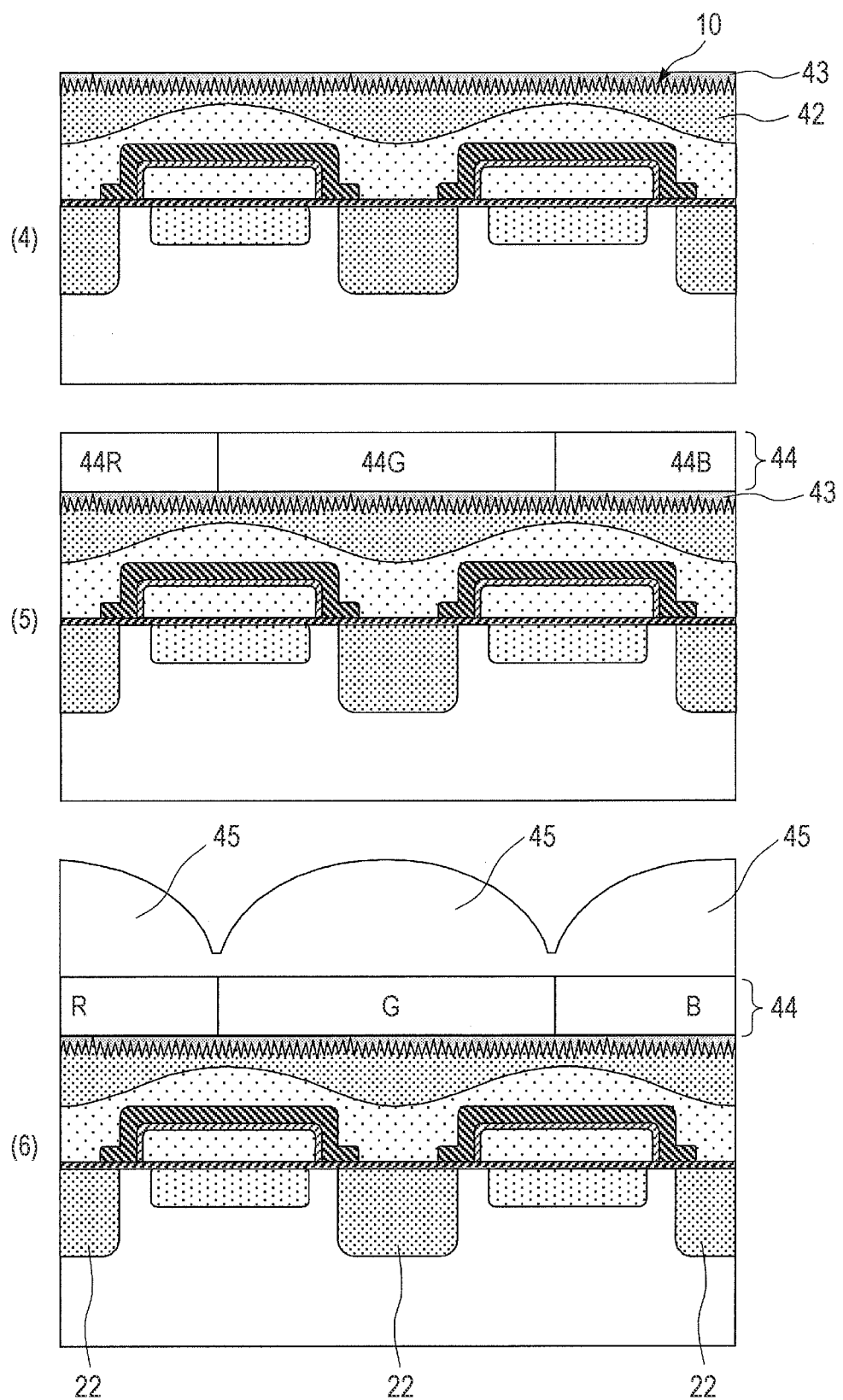
FIG. 13 is a cross-sectional view illustrating the fabricating process of an example of the first fabrication method of the solid-state imaging device.

As illustrated in (1) in FIG. 12, a photoelectric conversion portion 22 that converts an incident light to signal charges is formed in a semiconductor substrate 21. Moreover, a vertical charge transfer portion 23 that reads and transfers the signal charges from the photoelectric conversion portion 22 is formed in the semiconductor substrate 21. At the same time, a horizontal charge transfer portion (not shown) that transfers and outputs the signal charges transferred from the vertical charge transfer portion 23 in the horizontal direction is formed. On the vertical charge transfer portion 23 (the horizontal charge transfer portion as well) of the semiconductor substrate 21, a transfer gate 25 is formed via a gate insulating film 24. Furthermore, the transfer gate 25 is covered with a light shielding film 27 via an insulating film 26. An aperture portion 28 is provided on the light shielding film 27 and the photoelectric conversion portion 22.

Furthermore, an interlayer insulating film 41 is formed on the semiconductor substrate 21 so as to cover the photoelectric conversion portion 22, the light shielding film 27, and the like. The interlayer insulating film 41 is formed from a silicon oxide-based insulating film, for example, and is specifically formed from a BPSG (boron phosphorous silicate glass) film, for example. The interlayer insulating film 41 may be formed from other silicon oxide-based insulating films.

In addition, a planarization insulating film 42 serving as a passivation film is formed. For example, the planarization insulating film 42 is formed from a plasma-CVD silicon nitride (P—SiN) film. The surface of the planarization insulating film 42 is planarized by CMP (chemical mechanical polishing).

In this embodiment, the planarization insulating film 42 corresponds to the target substrate 11 described in the fabrication method of the anti-reflection structure.

Subsequently, a resin film 12 having micro-particles 13 dispersed therein is formed on the surface of the planarization insulating film 42. In order to form the resin film 12, a resin serving as a base material of the resin film 12 and a solvent that dissolves the resin are prepared first. Then, the resin serving as the base material of the resin film 12 is dissolved in the solvent, and the micro-particles (not shown) are uniformly dispersed in a solution obtained thus, whereby a coating solution is prepared. The coating solution is applied onto the surface of the planarization insulating film 42 by a coating method, for example, whereby the resin film 12 is formed.

The resin film 12 is formed to a thickness of 0.5 μl, for example. Thereafter, heat treatment is performed for 5 minutes at a temperature of 200° C., whereby the resin film 12 is cured.

A coating solution for forming the resin film 12 is prepared, for example, from a mixture of 5 parts of a copper-phthalocyanine colorant, 15 parts of polyhydroxystyrene in solid content, 5 parts of hexamethoxy methylol melamine as a curing agent, and 70 parts of ethyl lactate as a solvent. Thereafter, a mixture solution obtained thus is filtered through a membrane filter having a pore size of 0.1 μl, and a coating solution is obtained.

Examples of the resin of the resin film 12 include a novolac-based resin, a styrene-based resin, an acrylic resin, a polysiloxane-based resin, and a polyimide-based resin. These resins may be used either solely or in a mixed form. Among them, a novolac-based resin is preferred because it is cheap and excellent in coating properties.

As the micro-particles (not shown), silicon oxide ($SiO_2$) may be used. Alternatively, metal oxides such as aluminum oxides ($Al_2O_3$), antimony oxides ($Sb_2O_3$), stannic oxides ($SnO_2$), titanium oxides ($TiO_2$), manganese oxides ($MnO_2$), or zirconium oxides ($ZrO_2$) may be used. These resins may be used either solely or in a mixed form. Alternatively, a phthalocyanine compound which is a colorant pigment containing inorganic substances and expressed by the following formula (1) can be used. As a central metal of the phthalocyanine compound, one selected from the group consisting of copper (Cu), iron (Fe), cobalt (Co), nickel (Ni), zinc (Zn), platinum (Pt), and palladium (Pd) is used. Among them, a copper-phthalocyanine compound is preferred because it is cheap and excellent in coating properties.

Examples of the solvent include methyl cellusolve, ethyl cellusolve, methyl cellusolve acetate, ethyl cellusolve acetate, diethylene glycol dimethyl ether, ethylene glycol monoisopropyl ether, propylene glycol monomethyl ether, propylene glycol monomethyl ether acetate, N-methyl pyrrolidone, γ-buthyolactone, dimethyl sulfoxide, N,N-dimethyl formamide, cyclohexanone, ethyl acetate, n-butyl acetate, pyruvic ethyl, ethyl lactate, n-buthyl lactate, and diacetone alcohol. Among these examples, γ-buthyolactone, N,N-dimethyl formamide, cyclohexanone, pyruvic ethyl, ethyl lactate, n-buthyl lactate, and diacetone alcohol are preferred. These solvents may be used either solely or in a mixed form. Particularly, as the solvent, ethyl acetate is preferred because it is cheap and excellent in coating properties.

A curing agent may be added to the solvent. Examples of the curing agent include an epoxy-based curing agent and a melamine-based curing agent, and these curing agents may be used either solely or in a mixed form. Moreover, the curing agent may not be added.

Subsequently, as illustrated in (2) in FIG. 12, the resin serving as the base material is etched (dry-etched) using the micro-particles (not shown) in the resin film 12 as a mask while gradually etching the micro-particles, thus forming a micro-protrusion dummy pattern 14 on the entire surface of the resin film 12.

The micro-protrusion dummy pattern 14 is formed into an approximately conical protrusion structure (moth-eye structure) which is 120 nm in height and 50 nm in width and depth.

In the dry etching, a magnetron reactive ion etching device is used. As the etching conditions, a bias peak power is set to −150 W. Oxygen ($O_2$) and chlorine ($Cl_2$) are used as an etching gas. The flow rates for the oxygen ($O_2$) and the chlorine ($Cl_2$) are set to 70 $cm^3$/sec and 40 $cm^3$/sec, respectively, and etching duration is 20 seconds.

Subsequently, as illustrated in (3) in FIG. 12, the surface of the target substrate 11 is etched back (dry-etched) together with the resin film 12 having the micro-protrusion dummy pattern 14 (see (2) in FIG. 12) formed thereon.

As a result, the surface shape of the micro-protrusion dummy pattern 14 formed on the surface of the resin film 12 (see (2) in FIG. 12) is transferred to the surface of the planarization insulating film 42, whereby a micro-protrusion pattern 15 is formed on the surface of the planarization insulating film 42. The micro-protrusion pattern 15 is formed into an approximately conical protrusion structure (moth-eye structure).

In the dry etching, a magnetron reactive ion etching device is used. In addition, as the etching conditions, a bias peak power is set to −150 W. Oxygen ($O_2$) and chlorine ($Cl_2$) are used as an etching gas. The flow rates for the oxygen ($O_2$) and the chlorine ($Cl_2$) are set to 70 $cm^3$/sec and 40 $cm^3$/sec, respectively, and etching duration is 40 seconds.

In this way, an anti-reflection structure 10 is formed from a cluster of the micro-protrusion patterns 15 formed on the entire surface of the planarization insulating film 42. The cluster of the micro-protrusion patterns 15 is formed as illustrated in the bird's eye-view SEM image in (5) in FIG. 4 and the cross-sectional SEM image in (6) in FIG. 4.

Subsequently, as illustrated in (4) in FIG. 13, a planarization film 43 is formed on the planarization insulating film 42 having the anti-reflection structure 10 formed thereon. The planarization film 43 is formed from a material having excellent light transmissive properties, for example, a silicon oxide film.

Subsequently, as illustrated in (5) in FIG. 13, a color filter layer 44 is formed on the planarization film 43. The color filter layer 44 is formed by a general fabrication method, for example, a coating method and a lithography technique such that a green color filter layer 44G, a red color filter layer 44R, and a blue color filter layer 44B are formed sequentially. However, the formation order is arbitrary.

In this way, when the color filter layer 44 is formed via the planarization film 43, since damage during the patterning to form the color filter layer 44 is not applied to the micro-protrusion pattern 15, the shape of the micro-protrusion pattern 15 can be maintained.

Subsequently, as illustrated in (6) in FIG. 13, by a general lens formation technique, a microlens 45 is formed on the color filter layer 44 so as to guide an incident light towards the photoelectric conversion portion 22.

In the first fabrication method of the solid-state imaging device, since the micro-particles are dispersed in the resin film 12, when the resin film 12 is etched in this state, etching of the surface of the resin film 12 progresses with the micro-particles used as a mask. At this time, since the micro-particles are also etched gradually, when the etching progresses, the micro-particles are thinned with the etching and are finally removed.

As a result, the micro-protrusion dummy pattern 14 is formed on the surface of the resin film 12.

In this way, since the micro-particles serving as the etching mask are thinned with the progress of the etching, the micro-protrusion dummy pattern 14 is formed into an approximately conical protrusion structure (moth-eye structure).

When the surface shape of the micro-protrusion dummy pattern 14 is transferred to the surface of the planarization insulating film 42 in such a state, thus forming the micro-protrusion pattern 15 on the surface of the planarization insulating film 42, the micro-protrusion pattern 15 is formed with the same shape as the micro-protrusion dummy pattern 14.

Therefore, it is possible to provide an advantage that the anti-reflection structure 10 can be stably and easily formed on the surface of the planarization insulating film 42.

Moreover, since the incident light is converted to electrical signals by the photoelectric conversion portion 22 without reflections, higher sensitivity can be provided. Furthermore, the reduced interfacial reflection results in the reduction in noise light such as flare or ghost which is generated when light reflected once is reflected again from another member such as a protective glass and then enters the lens.

Therefore, it is possible to provide an advantage that a solid-state imaging device capable of obtaining high-quality images can be fabricated.

4. Fourth Embodiment

First Example of Second Fabrication Method of Solid-State Imaging Device

A first example of a second fabrication method of a solid-state imaging device according to a fourth embodiment of the present invention will be described with reference to the cross-sectional views shown in FIGS. 14 and 15.

Figure 14:
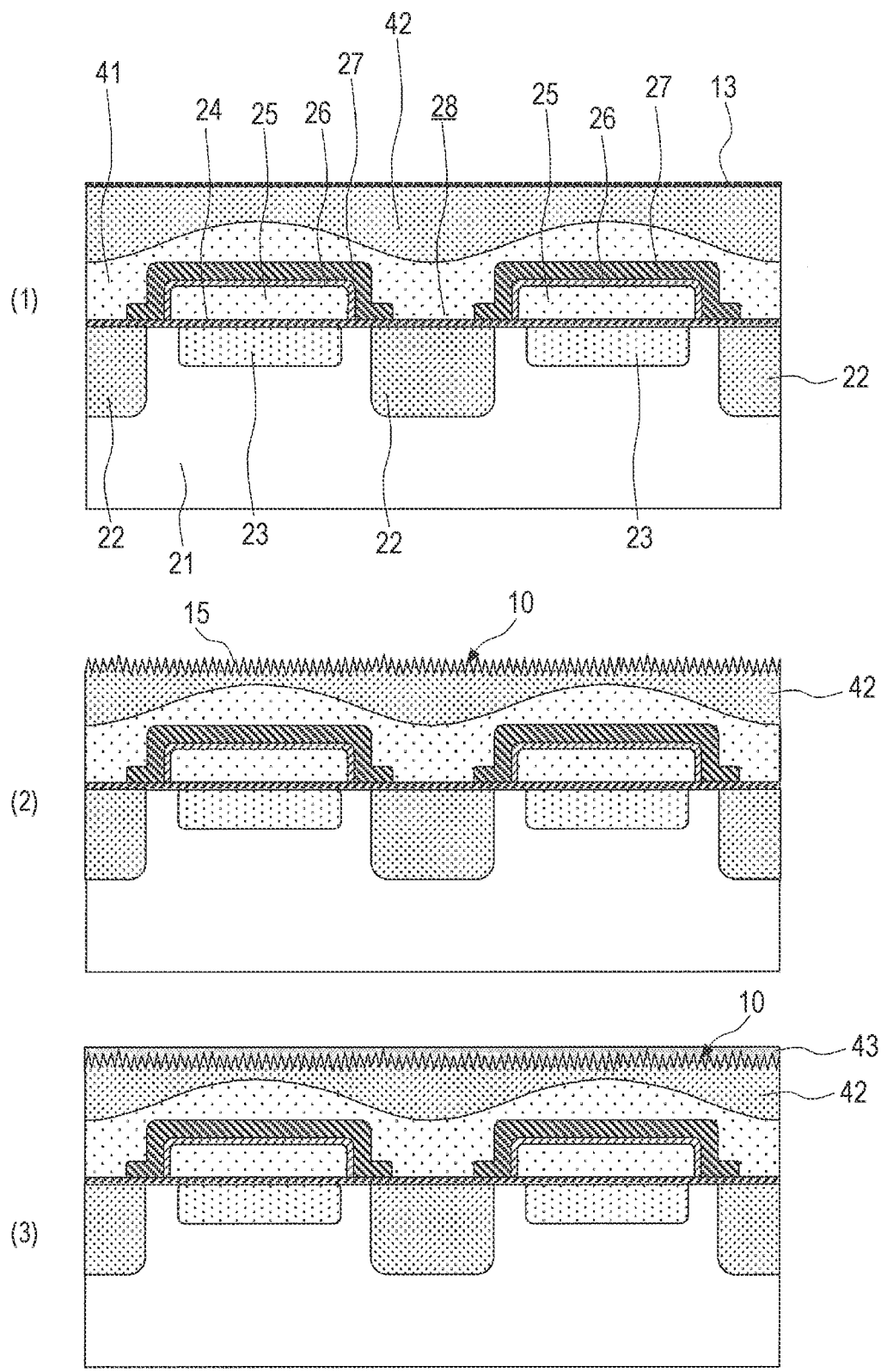
FIG. 14 is a cross-sectional view illustrating the fabricating process of a first example of a first fabrication method of a solid-state imaging device according to a fourth embodiment of the present invention.
Figure 15:
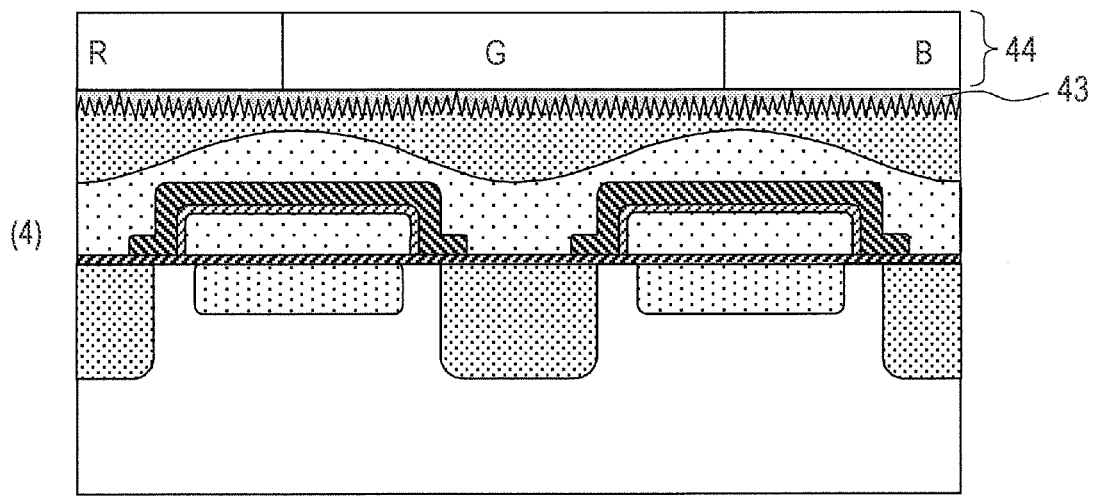
FIG. 15 is a cross-sectional view illustrating the fabricating process of the first example of the first fabrication method of the solid-state imaging device.
Figure 15:
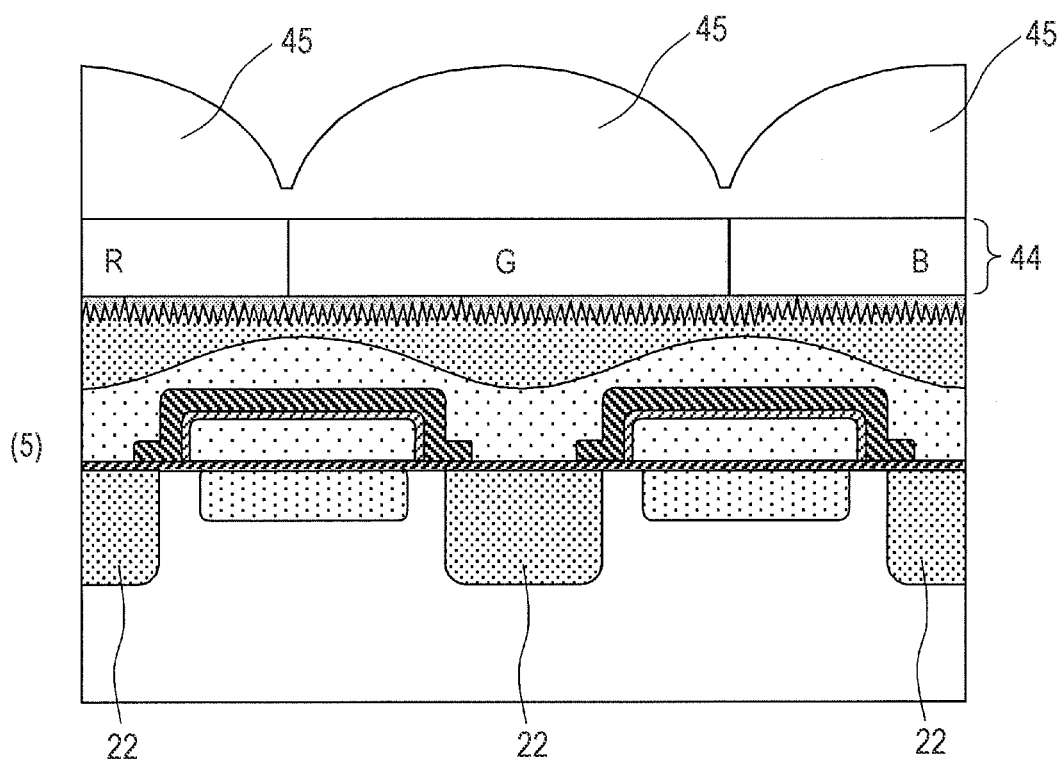

As illustrated in (1) in FIG. 14, a photoelectric conversion portion 22 that converts an incident light to signal charges is formed in a semiconductor substrate 21. Moreover, a vertical charge transfer portion 23 that reads and transfers the signal charges from the photoelectric conversion portion 22 is formed in the semiconductor substrate 21. At the same time, a horizontal charge transfer portion (not shown) that transfers and outputs the signal charges transferred from the vertical charge transfer portion 23 in the horizontal direction is formed. On the vertical charge transfer portion 23 (the horizontal charge transfer portion as well) of the semiconductor substrate 21, a transfer gate 25 is formed via a gate insulating film 24. Furthermore, the transfer gate 25 is covered with a light shielding film 27 via an insulating film 26. An aperture portion 28 is provided on the light shielding film 27 and the photoelectric conversion portion 22.

Furthermore, an interlayer insulating film 41 is formed on the semiconductor substrate 21 so as to cover the photoelectric conversion portion 22, the light shielding film 27, and the like. The interlayer insulating film 41 is formed from a silicon oxide-based insulating film, for example, and is specifically formed from a BPSG (boron phosphorous silicate glass) film, for example. The interlayer insulating film 41 may be formed from other silicon oxide-based insulating films.

In addition, a planarization insulating film 42 serving as a passivation film is formed. For example, the planarization insulating film 42 is formed from a plasma-CVD silicon nitride (P—SiN) film. The surface of the planarization insulating film 42 is planarized by CMP (chemical mechanical polishing).

In this embodiment, the planarization insulating film 42 corresponds to the target substrate 11 described in the fabrication method of the anti-reflection structure.

Subsequently, micro-particles 13 are arranged on the surface of the planarization insulating film 42. In this embodiment, the second example of the second fabrication method of the anti-reflection structure is used. The first example of the second fabrication method of the anti-reflection structure may be used. Therefore, for the details of the fabrication method of the anti-reflection structure 10, the second example of the second fabrication method of the anti-reflection structure should be referenced.

Examples of a specific film formation method include dry solidification, electrophoresis absorption film, air-liquid interface mono-particle film, spin coating, photo-coupling method, and other liquid thin-film methods.

For example, a solvent (not shown) having the micro-particles 13 dispersed therein is formed into a film form on the surface of the planarization insulating film 42 so that the micro-particles 13 are arranged on the surface of the planarization insulating film 42.

Specifically, the solvent (not shown) having the micro-particles 13 dispersed therein is applied into a film form onto the surface of the planarization insulating film 42 by a coating method, and the solvent is then evaporated, whereby only the micro-particles 13 are arranged on the surface of the planarization insulating film 42.

For example, silicon oxide particles (silica particles) are used as the micro-particles 13. As the solvent, a coating solution is prepared using an aqueous solution (density: 0.1 to 1.0 wt %) of water and silica particles having a particle size of about 100 nm. For example, the coating solution is applied using a spin coater onto the planarization insulating film 42. It should be noted that the particle size of the silica particles is not necessary to be controlled strictly. Although the particle size is determined depending on the wavelength of light that should be prevented from reflection, there will be no substantial problem if the size is smaller than about 300 nm and can be stably processed, that is to say, about 10 nm or larger. Moreover, a coating device is not limited to the spin coater, and a nozzle spray coating device may be used. Thereafter, the solvent is dried and evaporated by baking or the like, whereby a mono-particle layer 16 is obtained (which is a state where the silica particles are arranged in a single layer).

Subsequently, as illustrated in (2) in FIG. 14, etching (isotropic dry etching) is performed on the planarization insulating film 42 using the micro-particles 13 as a mask while gradually etching the micro-particles 13, whereby a micro-protrusion pattern 15 is formed on the entire surface of the planarization insulating film 42.

In the anisotropic dry etching, a relationship of etching selectivity between the planarization insulating film 42 and the micro-particles 13 is varied, and an etching rate for the planarization insulating film 42 is higher than an etching rate for the micro-particles 13. In this way, a height-wise volume variation of the micro-protrusion pattern 15 changes in an approximately linear fashion.

Specifically, anisotropic etching is performed on the planarization insulating film 42 having the mono-particle layer 16 formed thereon using a parallel-plate plasma etching device. As an etching gas of the anisotropic etching, carbon tetrafluoride ($CF_4$), argon (Ar), and oxygen ($O_2$) are used. For example, the flow rates for $CF_4$, Ar, and $O_2$ are initially set to 4 $cm^3$/min, 100 $cm^3$/min, and 6 $cm^3$/min, respectively. Moreover, an atmospheric pressure (internal pressure of a chamber) of the etching is set to 0.67 Pa, a source power to 1000 W, a bias power to 500 W, and a substrate temperature to 20° C. These conditions are exemplary and can be changed appropriately.

The micro-particles 13 (silica particles) are etched to ½ of its thickness under the above-mentioned conditions.

Subsequently, the etching selectivity is set to 3 while maintaining the flow rate for oxygen ($O_2$) to 6 $cm^3$/min until 700 of the micro-particles 13 (silica particles) is etched.

Subsequently, the etching selectivity is set to 4 while maintaining the flow rate for oxygen ($O_2$) to 8 $cm^3$/min until the micro-particles 13 (silica particles) are etched to 90% of its thickness. Furthermore, the etching selectivity is set to 5 while maintaining the flow rate for oxygen ($O_2$) to 10 $cm^3$/min until the micro-particles 13 (silica particles) are completely etched.

By these steps described above, a spindle-shaped micro-protrusion pattern 15 which is about 100 nm in width and about 300 nm in height can be formed on the surface of the planarization insulating film 42.

In this way, an anti-reflection structure 10 is formed from a cluster of the micro-protrusion patterns 15 formed on the entire surface of the planarization insulating film 42.

Since the higher the micro-protrusion pattern 15, the smoother becomes a refractive index variation, it is desirable for an anti-reflection structure. However, since the thicker the anti-reflection structure 10, the greater becomes the amount of light absorbed therein, the height of the micro-protrusion pattern 15 may be determined in consideration of light reflection and absorption.

Subsequently, as illustrated in (3) in FIG. 14, a planarization film 43 is formed on the planarization insulating film 42 having the anti-reflection structure 10 formed thereon. The planarization film 43 is formed from a material having excellent light transmissive properties, for example, a silicon oxide film.

Subsequently, as illustrated in (4) in FIG. 15, a color filter layer 44 is formed on the planarization film 43. The color filter layer 44 is formed by a general fabrication method, for example, a coating method and a lithography technique such that a green color filter layer 44G, a red color filter layer 44R, and a blue color filter layer 44B are formed sequentially. However, the formation order is arbitrary.

In this way, when the color filter layer 44 is formed via the planarization film 43, since damage during the patterning to form the color filter layer 44 is not applied to the micro-protrusion pattern 15, the shape of the micro-protrusion pattern 15 can be maintained.

Subsequently, as illustrated in (5) in FIG. 15, by a general lens formation technique, a microlens 45 is formed on the color filter layer 44 so as to guide an incident light towards the photoelectric conversion portion 22.

In the second fabrication method of the solid-state imaging device described above, anisotropic etching in which the etching rate for the planarization insulating film 42 is higher than the etching rate for the micro-particles 13 is performed in a state where the micro-particles 13 are arranged on the surface of the planarization insulating film 42. In this way, it is possible to etch the surface of the planarization insulating film 42 while using the micro-particles 13 as an etching mask. Moreover, since the micro-particles 13 are etched at a lower etching rate than that for the planarization insulating film 42, the micro-protrusion pattern 15 is formed into a shape such that a volume of each protrusion increases in an approximately linear fashion from the apex to the bottom of each protrusion when the protrusion is divided into equal thicknesses in a height direction thereof.

Therefore, it is possible to provide an advantage that the anti-reflection structure 10 can be stably and easily formed on the surface of the planarization insulating film 42.

Moreover, since the incident light is converted to electrical signals by the photoelectric conversion portion 22 without reflections, higher sensitivity can be provided. Furthermore, the reduced interfacial reflection results in the reduction in noise light such as flare or ghost which is generated when light reflected once is reflected again from another member such as a protective glass and then enters the lens.

Therefore, it is possible to provide an advantage that a solid-state imaging device capable of obtaining high-quality images can be fabricated.

A solid-state imaging device fabricated by the fabrication method of the solid-state imaging device described above may be incorporated into a camera module. Therefore, an electronic circuit mounted on the camera module may be formed on the semiconductor substrate 21 by a fabrication process of a MOS transistor, for example. For example, the transfer gate 25 and a gate electrode of a MOS transistor may be formed with an electrode formation film on the same layer.

5. Fifth Embodiment

Exemplary Configuration of Solid-State Imaging Device

An exemplary configuration of a solid-state imaging device according to a fifth embodiment of the present invention will be described with reference to a schematic cross-sectional view shown in FIG. 16 and a partly enlarged view shown in FIG. 17.

In the following description, reference numeral 1 is a solid-state imaging device, 11 is a semiconductor substrate (semiconductor region), 112 is a photoelectric conversion portion, 122 is a passivation film (first light transmissive film), 131 is an anti-reflection structure, 132 is a protrusion, 151 is a UV-curable film, 153 is a coating film, 161 is a nanoimprint mold, 162 is a depression, 200 is an imaging apparatus, 201 is an imaging unit, 202 is a light-condensing optical unit, 203 is a signal processing portion, and 210 is a solid-state imaging device (solid-state imaging device 1).

Figure 16:
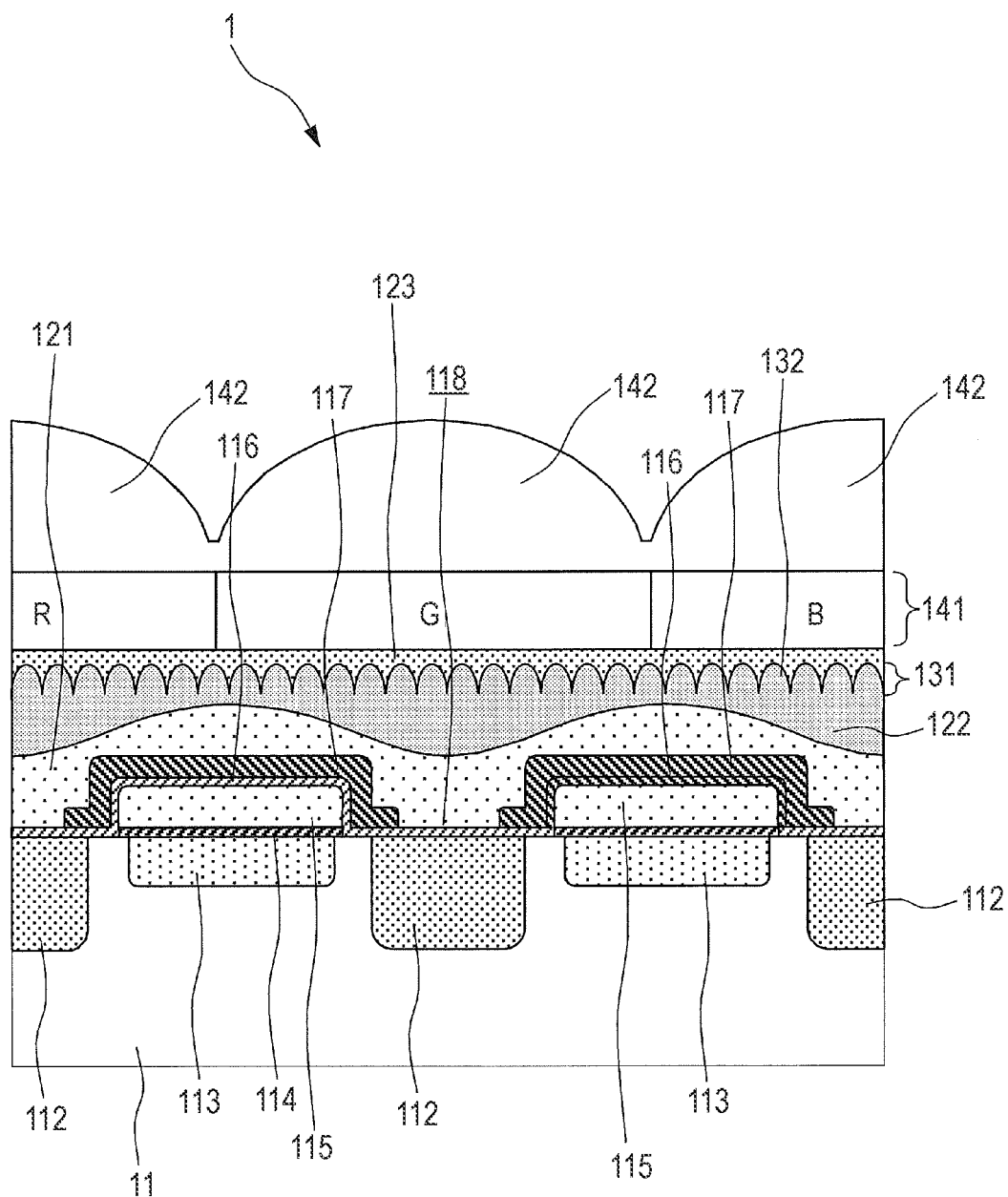
FIG. 16 is a schematic cross-sectional view illustrating an exemplary configuration of a solid-state imaging device according to a fifth embodiment of the present invention.

As illustrated in FIG. 16, a photoelectric conversion portion 112 that converts an incident light to signal charges is formed in a semiconductor substrate (semiconductor region) 11. A silicon substrate, for example, is used for the semiconductor substrate 11. Moreover, a vertical charge transfer portion 113 that reads and transfers the signal charges from the photoelectric conversion portion 112 is formed in the semiconductor substrate 11. On the vertical charge transfer portion 113 of the semiconductor substrate 11, a transfer gate 115 is formed via a gate insulating film 114. Furthermore, the transfer gate 115 is covered with a light shielding film 117 via an insulating film 116. The insulating film 116 may have a function of an anti-reflection film which has light transmissive properties and is made from an inorganic material, for example.

An aperture portion 118 is provided on a part of the light shielding film 117 above the photoelectric conversion portion 112.

Furthermore, a plurality of layers of interlayer insulating films is formed on the semiconductor substrate 11 so as to cover the photoelectric conversion portion 112, the light shielding film 117, and the like. For example, an interlayer insulating film 121 is formed. The interlayer insulating film 121 is formed from a silicon oxide-based insulating film, for example, and is specifically formed from a BPSG (boron phosphorous silicate glass) film, for example. The interlayer insulating film 121 may be formed from other silicon oxide-based insulating films.

In addition, a passivation film 122 is formed. For example, the passivation film 122 is formed from a plasma-CVD silicon nitride (P—SiN) film. The surface of the passivation film 122 is planarized by CMP (chemical mechanical polishing). A planarization film 123 is formed on the surface of the passivation film 122. The planarization film 123 is formed from an organic film or an inorganic film having light transmissive properties, for example.

An anti-reflection structure 131 is formed on the surface of the passivation film 122 which is one layer of the plurality of layers of the light transmissive films.

The anti-reflection structure 131 is constructed from spindle-shaped protrusions 132 which have light transmissive properties and a sinusoidal curved surface and are arranged in a matrix on the surface of the passivation film 122.

Figure 17:
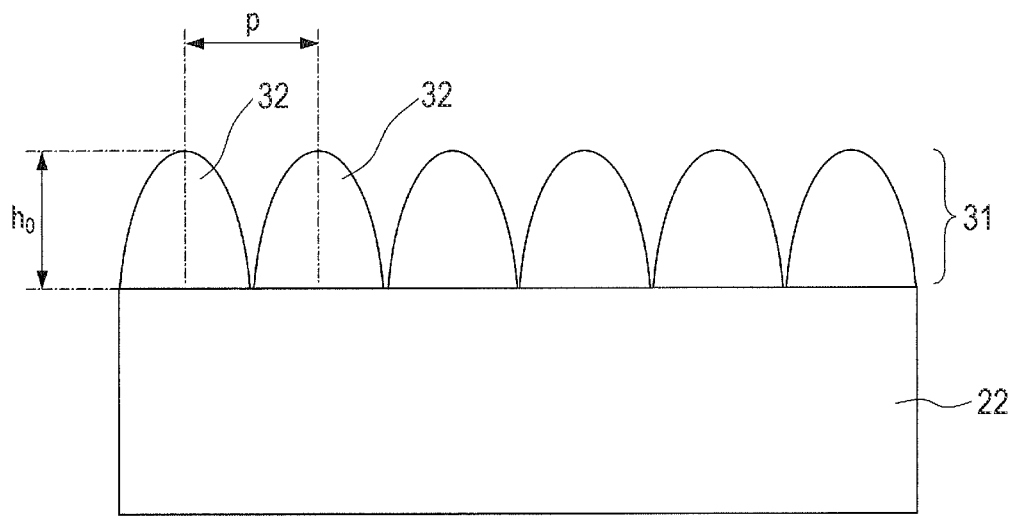
FIG. 17 is a partly enlarged view of FIG. 16.

As illustrated in FIG. 17, the protrusions 132 arranged on the entire surface of the passivation film 122 are formed with a height $h_0$ which is equal to or greater than 50 nm and equal to or less than 100 nm for an arrangement pitch p of 40 nm. Moreover, the height $h_0$ is equal to or greater than 200 nm and equal to or less than 400 nm for an arrangement pitch p of 100 nm. Furthermore, the height $h_0$ is equal to or greater than 50 nm and equal to or less than 400 nm for an arrangement pitch p of 200 nm.

The protrusions 132 are formed into a spindle shape having a sinusoidal curved surface for the following reasons.

That is to say, since light reflections are caused by an abrupt change in refractive index, by forming a structure such that refractive indices are distributed continuously at an interface of different substances with a micro-protrusion pattern such as the protrusions 132, it is possible to reduce the light reflections. When a widthwise dimension of the protrusion 132 is smaller than a wavelength of light, a spatial occupancy of a substance (e.g., the planarization film 123) on one side of the interface changes gradually so that the substance is switched to a substrate (e.g., the passivation film 122) on the other side of the interface, whereby an effective refractive index changes continuously. Since a variation in spatial occupancy has the same meaning as a volume variation between the substances on both sides of the interface, a spindle-shaped anti-reflection structure is suitable which has a sinusoidal curved surface where a volume variation is smooth. In other words, the protrusions 132 have a shape such that a heightwise volume variation of each protrusion 132 decreases in a linear fashion from the bottom to the apex of each protrusion 132.

In addition, as illustrated in FIG. 16, a color filter layer 141 is formed on the planarization film 123, and a microlens 142 that guides an incident light towards the photoelectric conversion portion 112 is formed thereon. The color filter layer 141 is composed of a red color filter layer R, a green color filter layer G, and a blue color filter layer B so as to correspond to respective one of the photoelectric conversion portions 112, for example. The color filter layer 141 may be composed of color filter layers of colors different from these colors, for example, complementary colors. Moreover, the color filter layer may be omitted if a solid-state imaging device is designed to obtain black and white pictures.

In this way, a solid-state imaging device 1 is obtained.

Next, the pitch and height of the protrusions 132 will be described.

Figure 18:
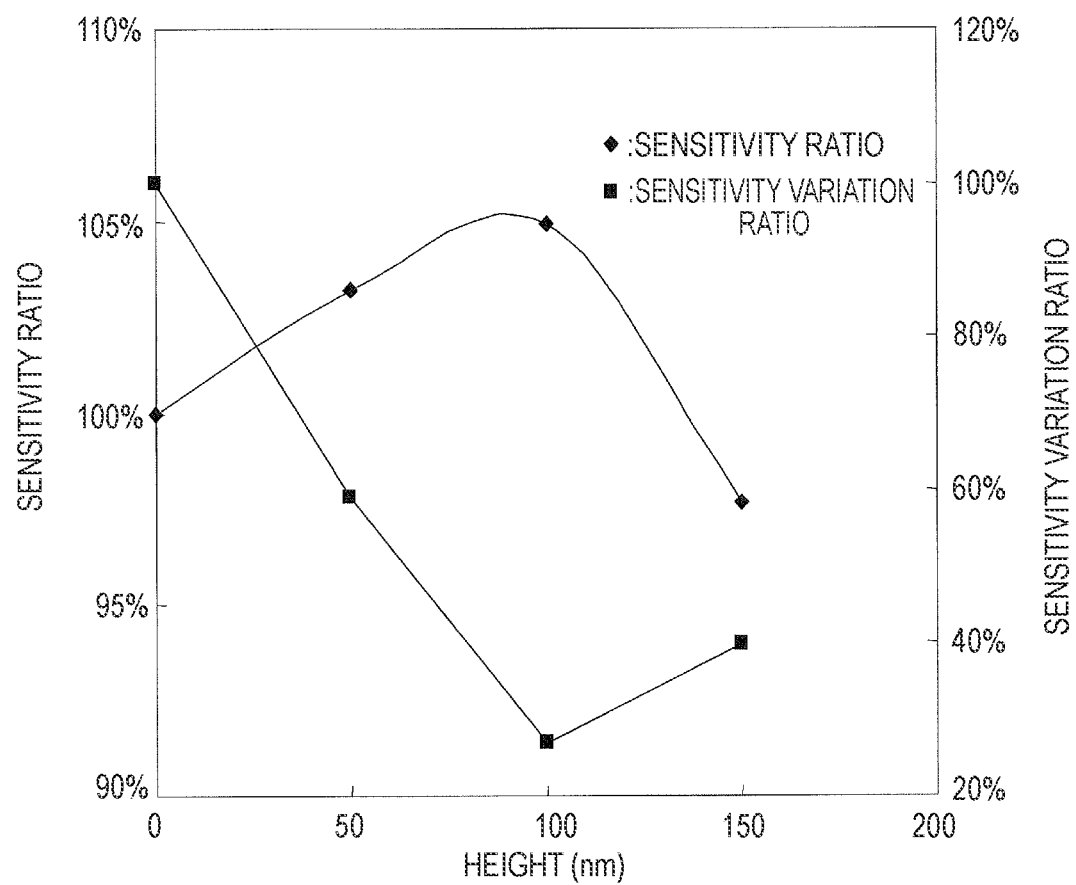
FIG. 18 is a graph showing the relationship between a sensitivity ratio and a sensitivity variation ratio relative to a height of a protrusion for a protrusion arrangement pitch of 40 nm.

It can be understood from FIG. 18 that when the protrusions 132 have an arrangement pitch p of 40 nm, the height $h_0$ where a sensitivity ratio is 100% or higher is equal to or greater than 50 nm and equal to or less than 100 nm, and the height $h_0$ where a sensitivity variation ratio is 60% or lower is equal to or greater than 50 nm and equal to or less than 150 nm. Therefore, the height $h_0$ is set in the range of equal to or greater than 50 nm and equal to or less than 100 nm for the arrangement pitch p of 40 nm. Although in this embodiment, the sensitivity variation ratio is set to be lower than 60%, this value may be appropriately determined depending on product or process.

Here, the sensitivity ratio is plotted by calculating a ratio of an average sensitivity within a range of production variations of the passivation film 122 to the sensitivity (100%) obtained without the relief structure. Similarly, the sensitivity variation ratio is plotted by dividing a range of sensitivities obtained under the production variations of the passivation film 122 by a sensitivity at that level and calculating the degree of improvement thereof from the sensitivity (100%) obtained without the relief structure. The sensitivity variation ratio means a width of sensitivity variation with respect to a film thickness variation, resulting from the reduction of interfacial reflection due to application of the relief structure and thus represents the performance of the relief structure. In the evaluation, 440 nm wavelength light is used. This wavelength is used because it is known that the pitch necessary for the relief structure should be smaller than the wavelength of light. Therefore, it will be obvious that a relief structure optimized to the wavelength 440 nm which is the shorter wavelength of visible light may also be effective for the longer wavelength light.

Here, the sensitivity ratio and the sensitivity variation ratio are based on the above definition.

Figure 19:
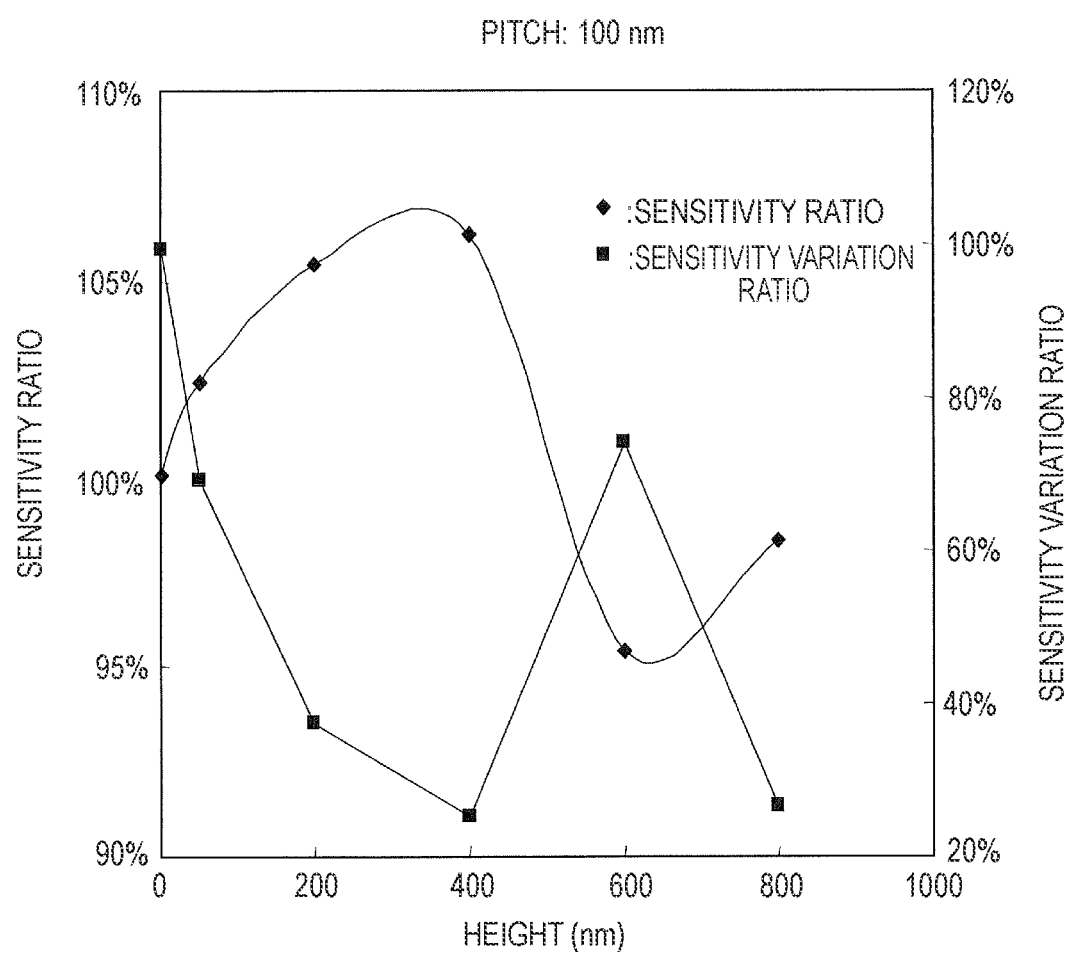
FIG. 19 is a graph showing the relationship between a sensitivity ratio and a sensitivity variation ratio relative to a height of a protrusion for a protrusion arrangement pitch of 100 nm.

It can be understood from FIG. 19 that when the protrusions 132 have an arrangement pitch p of 100 nm, the height $h_0$ where a sensitivity ratio is 100% or higher is in the range of equal to or greater than 50 nm and equal to or less than 400 nm, and the height $h_0$ where a sensitivity variation ratio is 60% or lower is in the range of equal to or greater than 200 nm and equal to or less than 400 nm. Therefore, the height $h_0$ is set in the range of equal to or greater than 200 nm and equal to or less than 400 nm for the arrangement pitch p of 100 nm.

Figure 20:
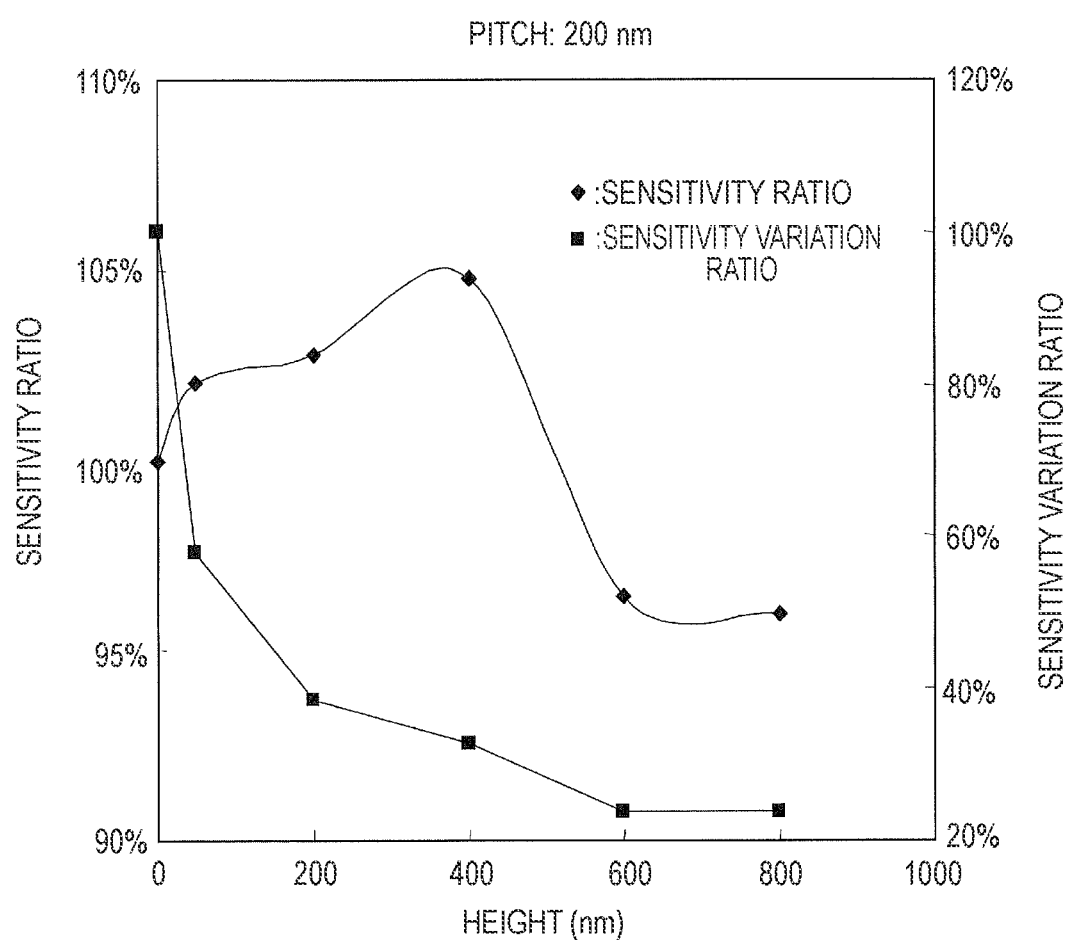
FIG. 20 is a graph showing the relationship between a sensitivity ratio and a sensitivity variation ratio relative to a height of a protrusion for a protrusion arrangement pitch of 200 nm.

It can be understood from FIG. 20 that when the protrusions 132 have an arrangement pitch p of 200 nm, the height $h_0$ where a sensitivity ratio is 100% or higher is in the range of equal to or greater than 50 nm and equal to or less than 400 nm, and the height $h_0$ where a sensitivity variation ratio is 60% or lower is in the range of equal to or greater than 50 nm and equal to or less than 800 nm. Therefore, the height $h_0$ is set in the range of equal to or greater than 50 nm and equal to or less than 400 nm for the arrangement pitch p of 100 nm.

Figure 21:
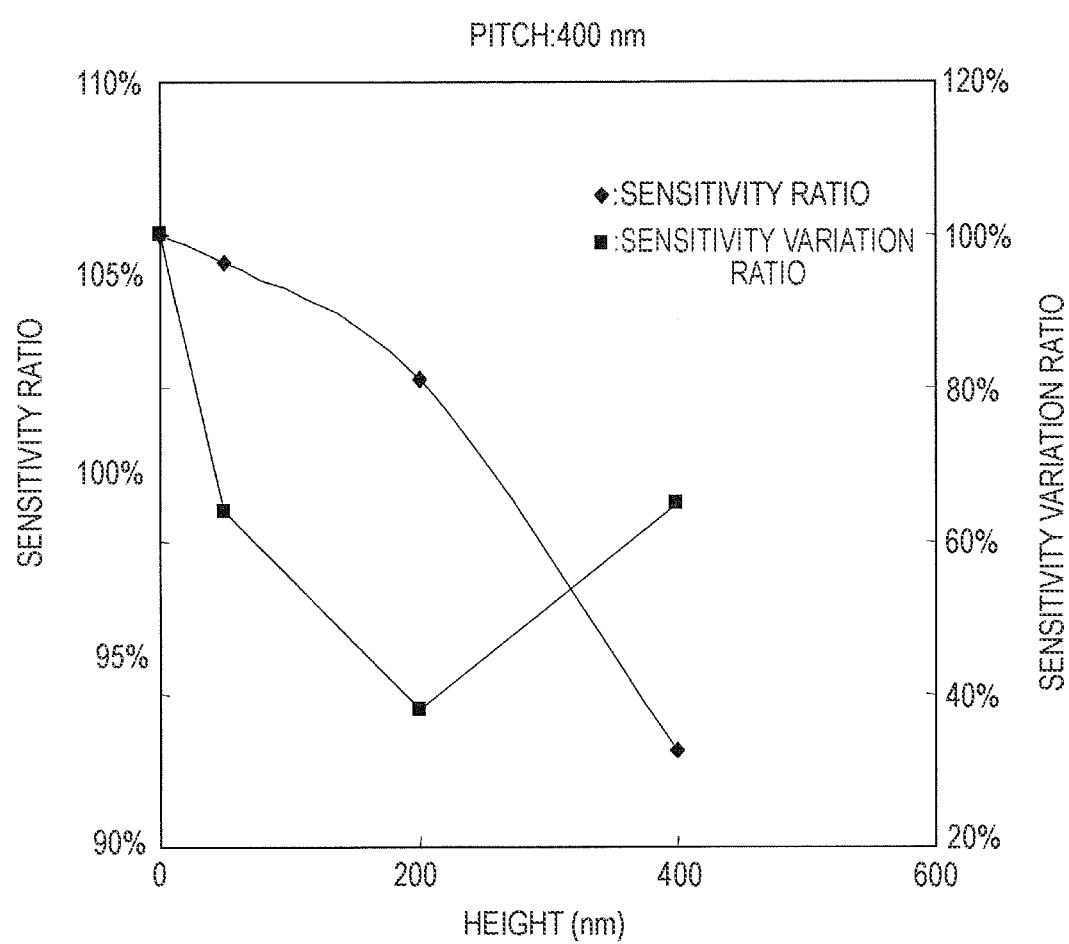
FIG. 21 is a graph showing the relationship between a sensitivity ratio and a sensitivity variation ratio relative to a height of a protrusion for a protrusion arrangement pitch of 400 nm.

It can be understood from FIG. 21 that when the protrusions 132 have an arrangement pitch p of 400 nm, the height $h_0$ where a sensitivity ratio is 100% or higher does not exist, and the height $h_0$ where a sensitivity variation ratio is 60% or lower does not exist. Therefore, it can be understood that when the arrangement pitch p is 400 nm, it is not suitable for the anti-reflection structure 131.

Therefore, the protrusions 132 are formed with a height $h_0$ which is equal to or greater than 50 nm and equal to or less than 100 nm for an arrangement pitch p of 40 nm. Moreover, the height $h_0$ is equal to or greater than 200 nm and equal to or less than 400 nm for an arrangement pitch p of 100 nm. Furthermore, the height $h_0$ is equal to or greater than 50 nm and equal to or less than 400 nm for an arrangement pitch p of 200 nm.

For intermediate pitches of the above-mentioned pitches, the height $h_0$ will be determined based on the heights corresponding to the longer and shorter pitches.

Moreover, it can be seen that the sensitivity decreases when the height exceeds a certain height for each of the pitches. This is because light condensing efficiency decreases with the increase of an optical path in a light condensing structure. Therefore, it can be understood that there is a limit height for the protrusions 132 to be applicable to the solid-state imaging device 1. The limit height changes with the pitch p.

Considering the range of height $h_0$, it is preferable that the aspect ratio of the protrusion 132 is set to 4 or smaller for the pitch of 100 nm. Moreover, the aspect ratio is preferably set to 2 or smaller for the pitch of 200 nm. Furthermore, the aspect ratio is preferably set to 2.5 or smaller for the pitch of 40 nm. Therefore, it can be said that it is more preferable to set the aspect ratio of the protrusion 132 to 2 or smaller.

It is generally said that the performance of the relief structure as an anti-reflection film increases as the aspect ratio increases. However, as described above, it is found that a structure that is too tall is not desirable for the solid-state imaging device 1 from the perspective of sensitivity.

Figure 22:
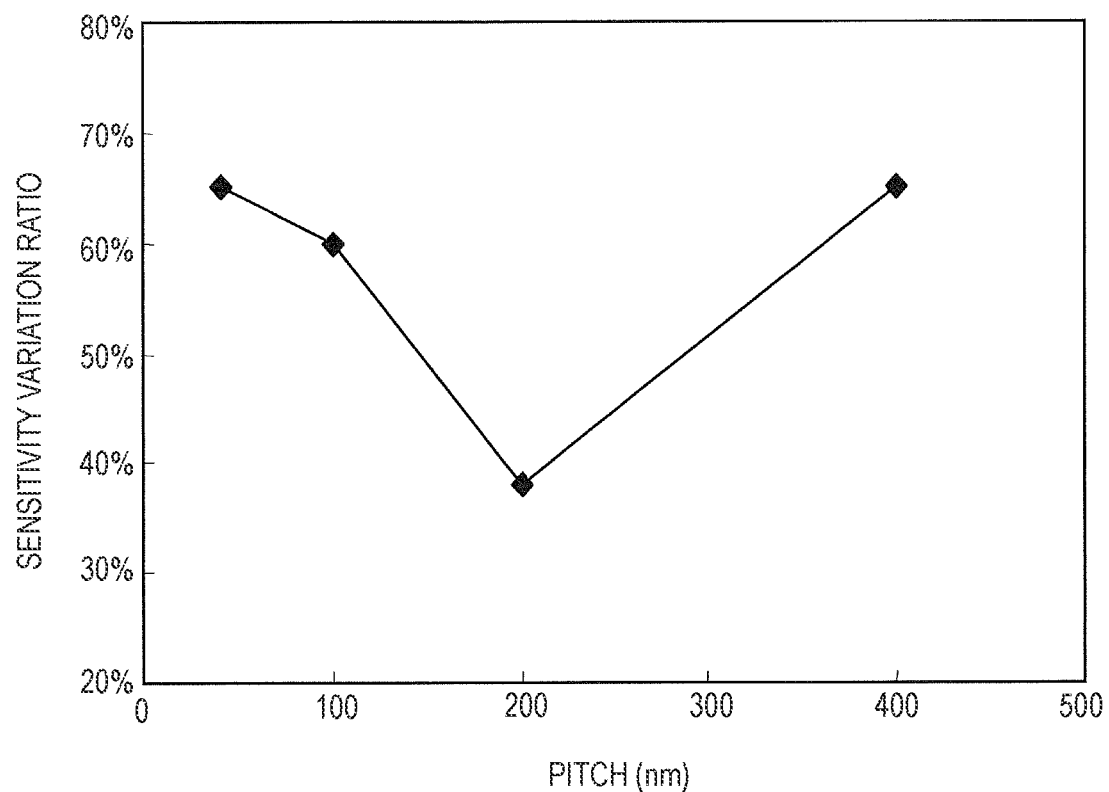
FIG. 22 is a graph showing the relationship between a sensitivity variation ratio and a protrusion arrangement pitch when an aspect ratio of the protrusion is 1.

FIG. 22 shows the relationship between the sensitivity variation ratio and the pitch when the aspect ratio of the protrusions 132 is set to 1. As illustrated in FIG. 22, when the aspect ratio of the protrusions 132 is 1, the pitch of the protrusions 132 is preferably in the range of equal to or greater than 100 nm and equal to or less than 200 nm, most preferably, 200 nm.

In the solid-state imaging device 1 described above, since the anti-reflection structure 131 is constructed from the spindle-shaped protrusions 132 which have light transmissive properties and a sinusoidal curved surface and are arranged on an entire surface of the passivation film 122, a volume variation of the substances on both sides of an interface of the anti-reflection structure 131 changes in a linear fashion. For this reason, when a widthwise dimension of the protrusion 132 is smaller than a wavelength of light, a spatial occupancy of a substance (the planarization film 123) on one side of the interface changes gradually so that the substance is switched to a substrate (the passivation film 122) on the other side of the interface, whereby an effective refractive index changes continuously. Since a variation in spatial occupancy has the same meaning as a volume variation between the substances on both sides of the interface, the refractive index variation in the anti-reflection structure 131 becomes linear, and thus light reflections are reduced. Moreover, the protrusions 132 have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm. With such regulations, the aspect ratio of the protrusion 132 is suppressed to be low, for example, 2 or smaller, and thus, an optical path length of light in the portion of the protrusion 132 decreases, and the reduction of sensitivity can be suppressed.

Therefore, it is possible to prevent the reduction in sensitivity of all the pixels, prevent shading, and prevent reflections. Therefore, since noise such as flare or ghost can be reduced, it is possible to provide an advantage that high-quality images can be obtained with high sensitivity.

Although it has been described that the passivation film 122 is the first light transmissive film on which the anti-reflection structure 131 is formed, the location at which the anti-reflection structure 131 is formed is not limited to the surface of the passivation film 122. For example, it may be effective to form the anti-reflection structure 131 between films, in which the refractive index difference is 0.1 or more, or at an air interface. For example, the anti-reflection structure 131 may be formed on the surface of the microlens 142 or the surface of the insulating film 116 which is an inorganic anti-reflection film. Moreover, although not shown in the figure, the anti-reflection structure 131 may be formed on the surface of a cover glass or infrared cut-off filter that is formed in an outermost portion of a region where the incident light is incident.

Furthermore, the anti-reflection structure 131 may be formed on two layers or more layers, for example, the surface of the passivation film 122 and the surface of the microlens 142.

It is particularly effective when the anti-reflection structure of the embodiment of the present invention is formed between films in which the refractive index difference is 0.1 or more.

For example, it is effective when the anti-reflection structure is formed on the microlens 142 (air interface), the passivation film 122 (interface with the planarization film 123), an inorganic anti-reflection film (the insulating film 116 which is an interface with the interlayer insulating film 121) right above a silicon layer, the photoelectric conversion portion 112 (interlayer insulating film with the insulating film 116), and the like because they exhibit a large refractive index difference.

Moreover, it is effective when the anti-reflection structure is formed on a cover glass and an infrared (IR) cut-off filter on the solid-state imaging device because they have an air interface and thus exhibit a large refractive index difference.

6. Sixth Embodiment

First Example of Fabrication Method of Solid-State Imaging Device

Next, a first example of a fabrication method of a solid-state imaging device according to a sixth embodiment of the present invention will be described with reference to the schematic cross-sectional views shown in FIGS. 23 to 27.

Figure 23:
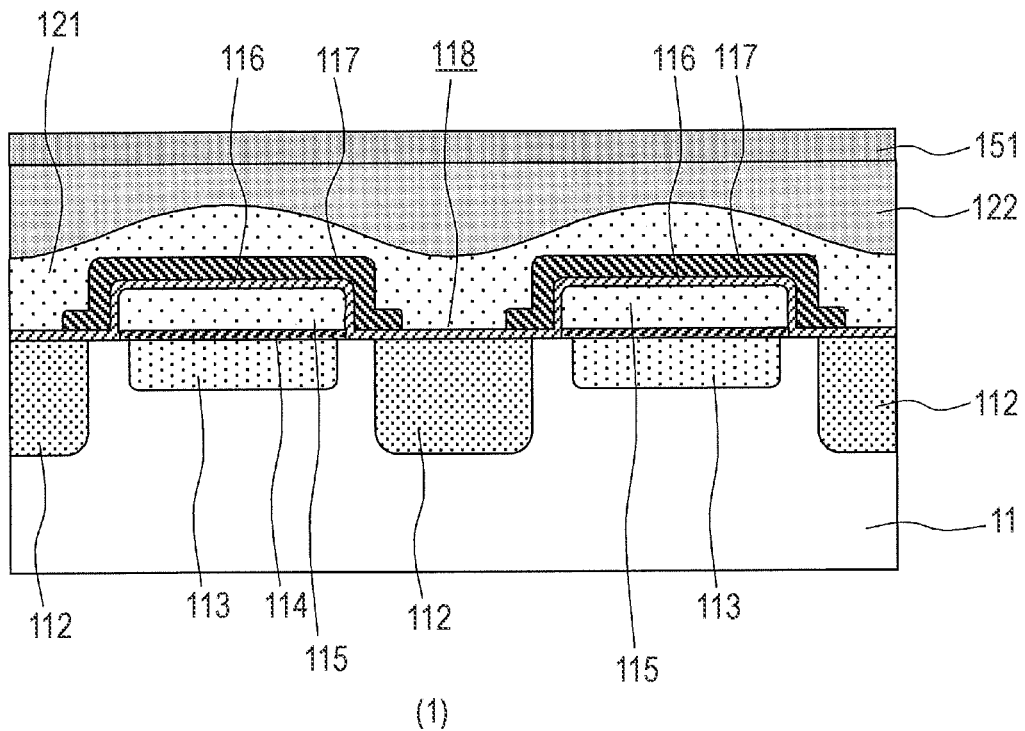
FIG. 23 is a schematic cross-sectional view illustrating a first example of a fabrication method of a solid-state imaging device according to a sixth embodiment of the present invention.
Figure 23:
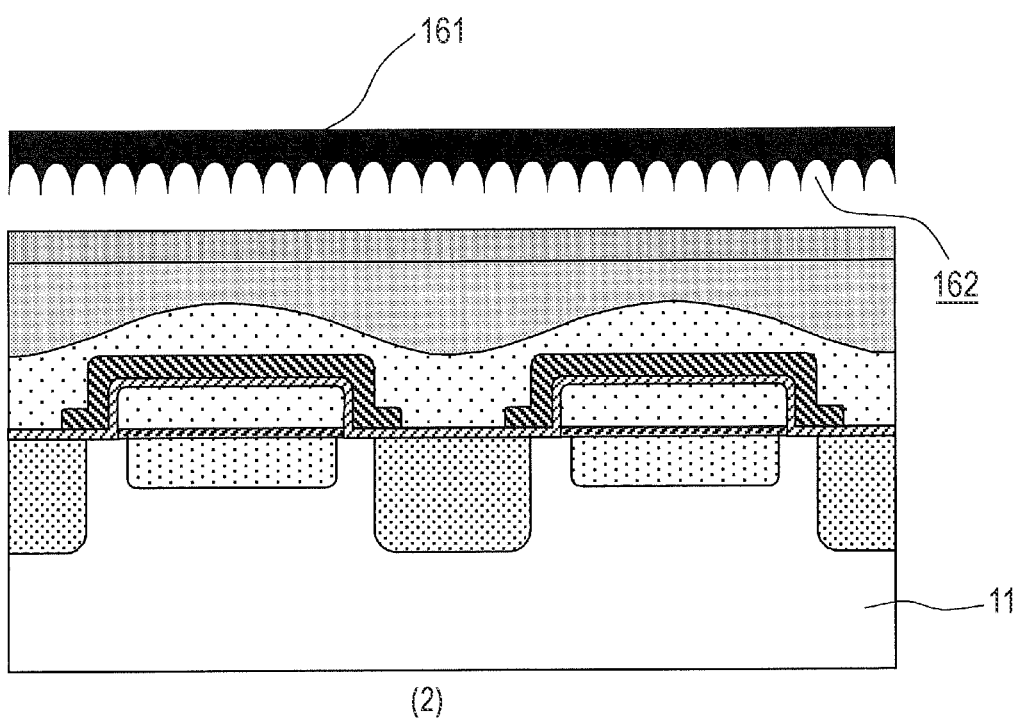

As illustrated in (1) in FIG. 23, a photoelectric conversion portion 112 that converts an incident light to signal charges is formed in a semiconductor substrate 11. A silicon substrate, for example, is used for the semiconductor substrate 11. Moreover, a vertical charge transfer portion 113 that reads and transfers the signal charges from the photoelectric conversion portion 112 is formed in the semiconductor substrate 11. At the same time, a horizontal charge transfer portion (not shown) that transfers and outputs the signal charges transferred from the vertical charge transfer portion 113 in the horizontal direction is formed. On the vertical charge transfer portion 113 (the horizontal charge transfer portion as well) of the semiconductor substrate 11, a transfer gate 115 is formed via a gate insulating film 114. Furthermore, the transfer gate 115 is covered with a light shielding film 117 via an insulating film 116. An aperture portion 118 is provided on the light shielding film 117 and the photoelectric conversion portion 112.

Furthermore, a plurality of layers of interlayer insulating films is formed on the semiconductor substrate 11 so as to cover the photoelectric conversion portion 112, the light shielding film 117, and the like. For example, an interlayer insulating film 121 is formed. The interlayer insulating film 121 is formed from a silicon oxide-based insulating film, for example, and is specifically formed from a BPSG (boron phosphorous silicate glass) film, for example. The interlayer insulating film 121 may be formed from other silicon oxide-based insulating films.

In addition, a passivation film 122 is formed. For example, the passivation film 122 is formed from a plasma-CVD silicon nitride (P—SiN) film. The surface of the passivation film 122 is planarized by CMP (chemical mechanical polishing).

A UV-curable film 151 is formed on the surface of the passivation film 122 which is a first light transmissive film of the plurality of layers of the light transmissive films.

The UV-curable film 151 is formed by coating a uv-curable resin, for example. As a coating method, spin coating, slit coating, nozzle coating, and the like may be used. The thickness of the UV-curable film 151 is optimized by a moth-eye structure formed later, and it is necessary to set a residual thickness considering the effect of contraction.

Figure 24:
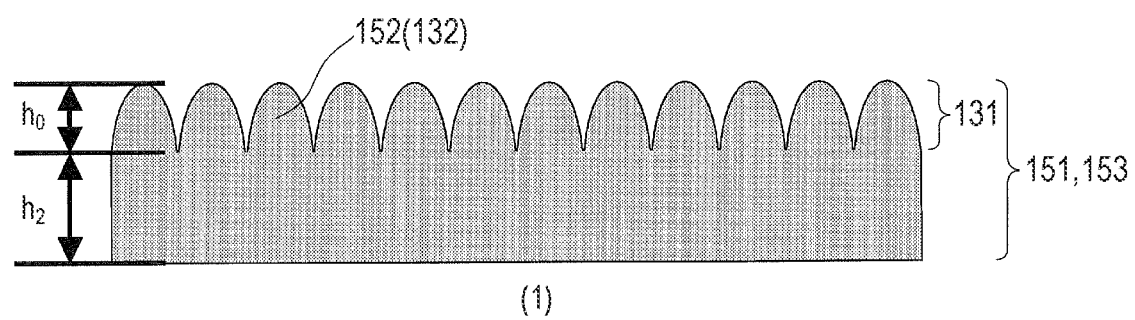
FIG. 24 is a schematic cross-sectional view illustrating the first example of the fabrication method of the solid-state imaging device according to the sixth embodiment of the present invention.
Figure 24:
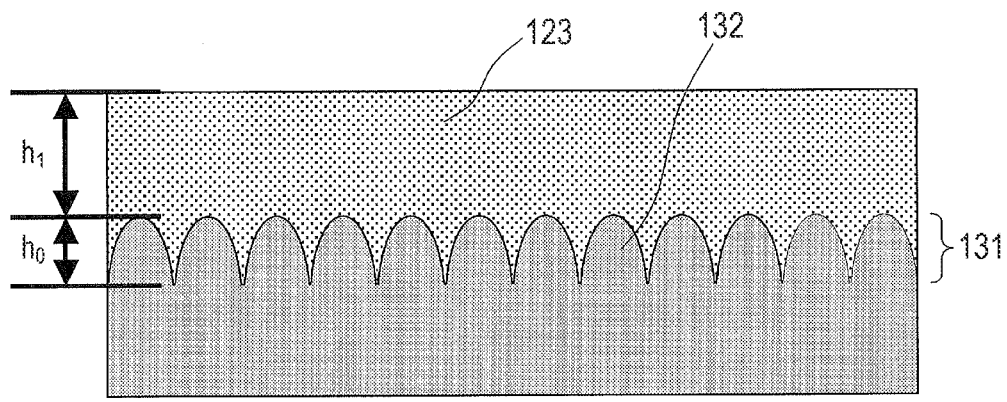

That is to say, as illustrated in (1) FIG. 24, when it is desired to form an anti-reflection structure 131 (moth-eye structure) in which a protrusion structure pattern 152 (protrusions 132) has a height $h_0$ of 200 nm, the thickness $h_0 + h_2$ of the UV-curable film 151 is set to 300 nm or more so that the thickness $h_2$ of a residual thickness portion is about 100 nm.

Subsequently, as illustrated in (2) in FIG. 23, a nanoimprint mold 161 which has a 3-dimensional reverse structure of the moth-eye structure to be formed is loaded above the semiconductor substrate 11. That is to say, on the nanoimprint mold 161, spindle-shaped depressions 162 having a sinusoidal curved surface are arranged on an entire surface thereof.

The nanoimprint mold 161 has a size corresponding to a target substrate (the semiconductor substrate 11), and when a 300 mm-diameter wafer (semiconductor substrate 11) is used for transfer, a 300 mm-diameter nanoimprint mold 161 is prepared. As a material of the nanoimprint mold 161, materials capable of transmitting ultraviolet (UV) light are required, and examples of such materials include quartz, glass, and plastic which are capable of transmitting ultraviolet rays.

Figure 25:
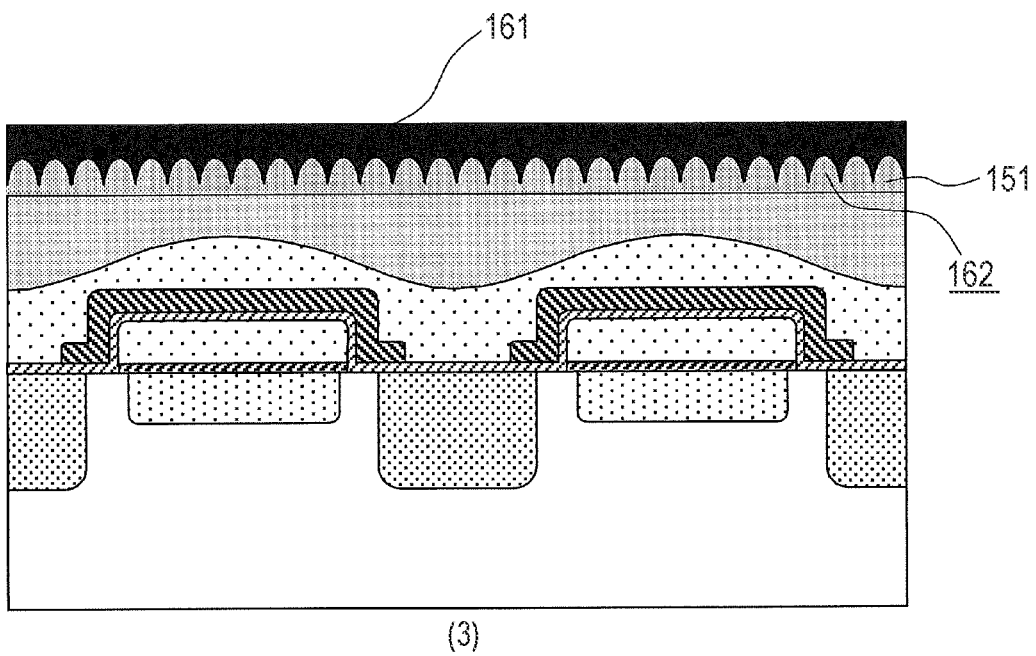
FIG. 25 is a schematic cross-sectional view illustrating the first example of the fabrication method of the solid-state imaging device according to the sixth embodiment of the present invention.
Figure 25:
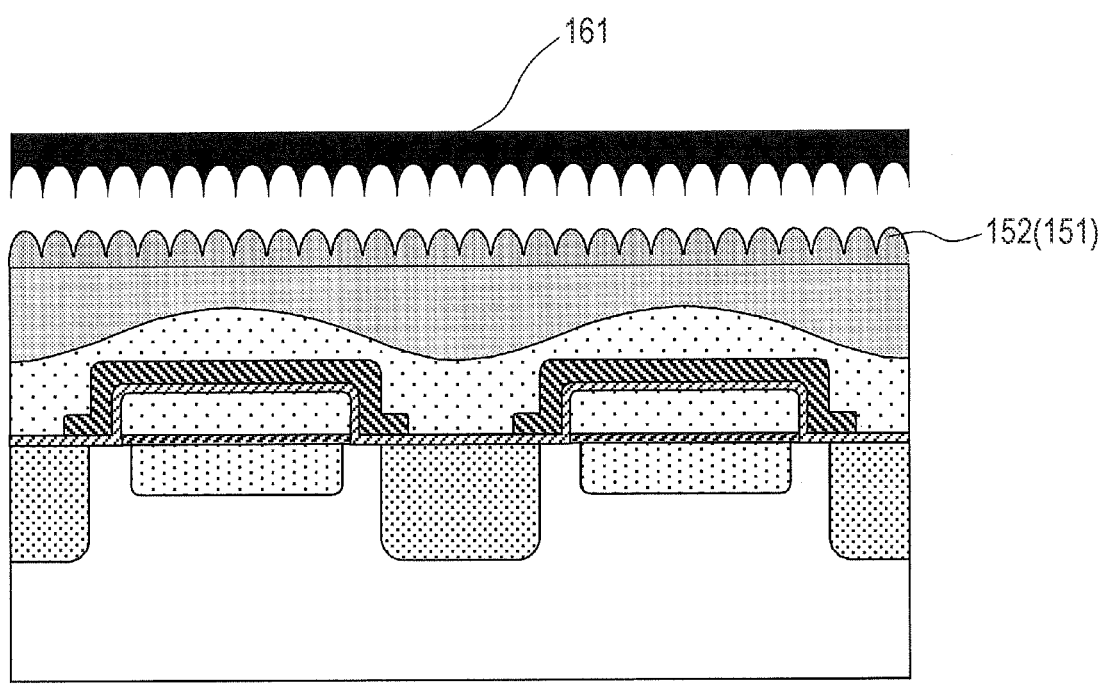

Subsequently, as illustrated in (3) in FIG. 25, the UV-transmitting nanoimprint mold 161 is pressed against the UV-curable film 151, thus transferring the shape of the spindle-shaped depressions 162 having a sinusoidal curved surface to the surface of the UV-curable film 151. That is to say, the UV-curable film 151 is filled into the depressions of the nanoimprint mold 161. At this time, by tilting the nanoimprint mold 161 and the semiconductor substrate 11, it is possible to reduce the filling time. Moreover, although the pressing may be performed by the own weight of the nanoimprint mold 161, for reduction of the filling time, a sealed structure may be formed in the upper portion of the nanoimprint mold 161 so that it can be uniformly pressed by air pressure or the like. When the UV-curable film 151 is filled into the depressions of the nanoimprint mold 161, the UV-curable film 151 is cured by irradiation with UV rays for sufficient time.

Subsequently, as illustrated in (4) in FIG. 25, the nanoimprint mold 161 is demolded from the surface of the UV-curable film 151. As a result, a spindle-shaped protrusion structure pattern 152 having a sinusoidal curved surface is formed on the surface of the UV-curable film 151.

Figure 26:
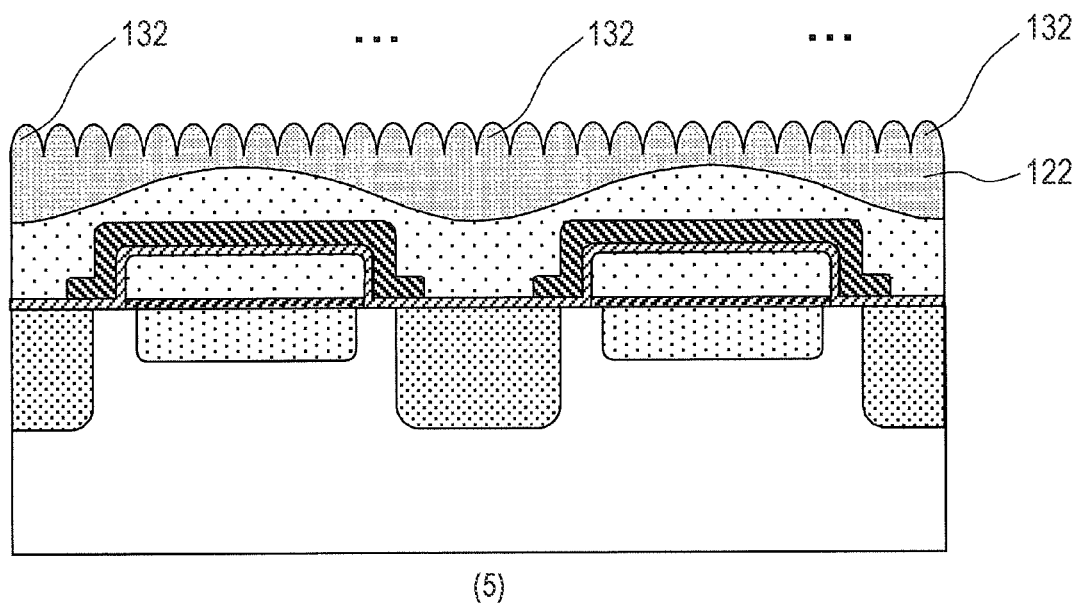
FIG. 26 is a schematic cross-sectional view illustrating the first example of the fabrication method of the solid-state imaging device according to the sixth embodiment of the present invention.
Figure 26:
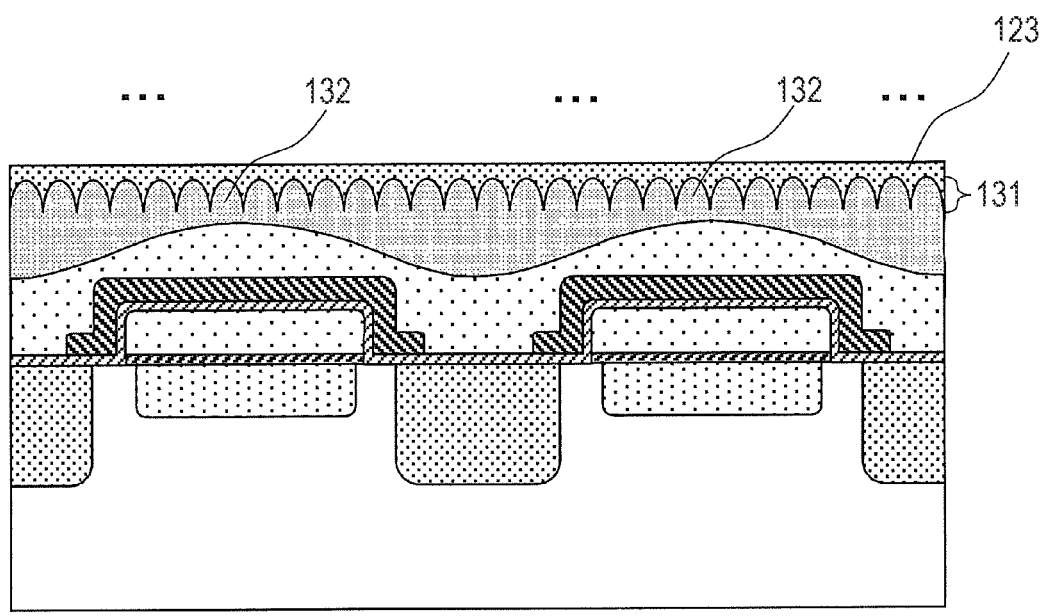

Subsequently, as illustrated in (5) in FIG. 26, the UV-curable film 151 and the upper portion of the passivation film 122 are etched back. In this way, the shape of the spindle-shaped protrusion structure pattern 152 (see (4) in FIG. 25) having a sinusoidal curved surface, formed on the UV-curable film 151 is transferred to the surface of the passivation film 122, whereby spindle-shaped protrusions 132 having a sinusoidal curved surface are formed. That is to say, the protrusions 132 have a shape such that a height-wise volume variation of each protrusion 132 decreases in a linear fashion from the bottom to the apex of each protrusion 132.

In addition, the protrusions 132 are formed to have a height which is equal to or greater than 50 nm and equal to or less than 100 nm for an arrangement pitch of 40 nm. Moreover, the protrusions 132 have a height which is equal to or greater than 200 nm and equal to or less than 400 nm for an arrangement pitch of 100 nm. Furthermore, the protrusions 132 have a height which is equal to or greater than 50 nm and equal to or less than 400 nm for an arrangement pitch of 200 nm.

Since a structure desirable for depressions 162 (see FIG. 25) is already formed in the nanoimprint mold 161 (see FIG. 25), the transfer based on the etch-back is preferably performed such that the shape of the protrusion structure pattern 152 (see FIG. 25) of the UV-curable film 151 (see FIG. 25), to which the structure is transferred, is faithfully transferred to the passivation film 122. For example, it is desirable to process the UV-curable film 151 and the passivation film 122 by dry-etching or the like under conditions such that the selectivity between the UV-curable film 151 and the passivation film 122 is the same.

For example, when TSR-820 (manufactured by Teijin Seiki Co. Ltd.) is used as the UV-curable film 151, and a plasma-CVD silicon nitride (P—SiN) film is used as the passivation film 122, the same etching selectivity can be obtained with anisotropic dry-etching that uses any one of the etching gas combinations: a mixed gas of sulfur hexafluoride ($SF_6$) and oxygen ($O_2$); a mixed gas of carbon tetrafluoride ($CF_4$) and oxygen ($O_2$); trifluoromethane ($CHF_3$) and oxygen ($O_2$).

Subsequently, as illustrated in (6) in FIG. 26, a planarization film 123 is formed on the anti-reflection structure 131 which has a moth-eye structure and is constructed from the protrusions 132. The planarization film 123 is formed by coating an organic film, for example. This step requires planarization to be achieved for formation of a color filter array in a later step.

The degree of flatness of the coated planarization film 123 can be generally improved by coating sufficiently thicker than the height of the relief structure on the underlying layer (in this example, the anti-reflection structure 131).

However, in a solid-state imaging device, the increased thickness of the planarization film 123 may lead to an increase in the optical path length, namely a loss of light condensing efficiency.

Therefore, as illustrated in (2) in FIG. 24, the thickness $h_1$ of the planarization film 123 is determined in conformity with the coating characteristics of the planarization film 123. For the planarization film 123 used in this embodiment, since it has been proven that a thickness $h_1$ of 100 nm is required, a relation of $h_1 \leq_0 +100$ nm is obtained. Here, $h_0$ is the height of the protrusion 132 on the anti-reflection structure 131.

However, since the smaller $h_1$ is preferable from the perspective of light condensing efficiency, it may be desirable to set the height $h_1$ so that $h_1 = h_0 + 100$ nm.

Although it may be cost-effective to nano-imprint 300 mm-diameter wafers by batch processing, demolding properties need be considered too. An aspect ratio suitable for demolding is 1 or smaller.

On the other hand, as described above, to a certain height, a greater aspect ratio provides superior anti-reflection performance.

The embodiment of the present invention presents the optimum values when sensitivity, anti-reflection performance, and fabrication issues are all considered. Referring to FIG. 22, the pitches and sensitivity variation ratios for the aspect ratio of 1 are plotted. In this case, the optimum values for the protrusions 132 are a pitch of 200 nm and a height of 200 nm.

Figure 27:
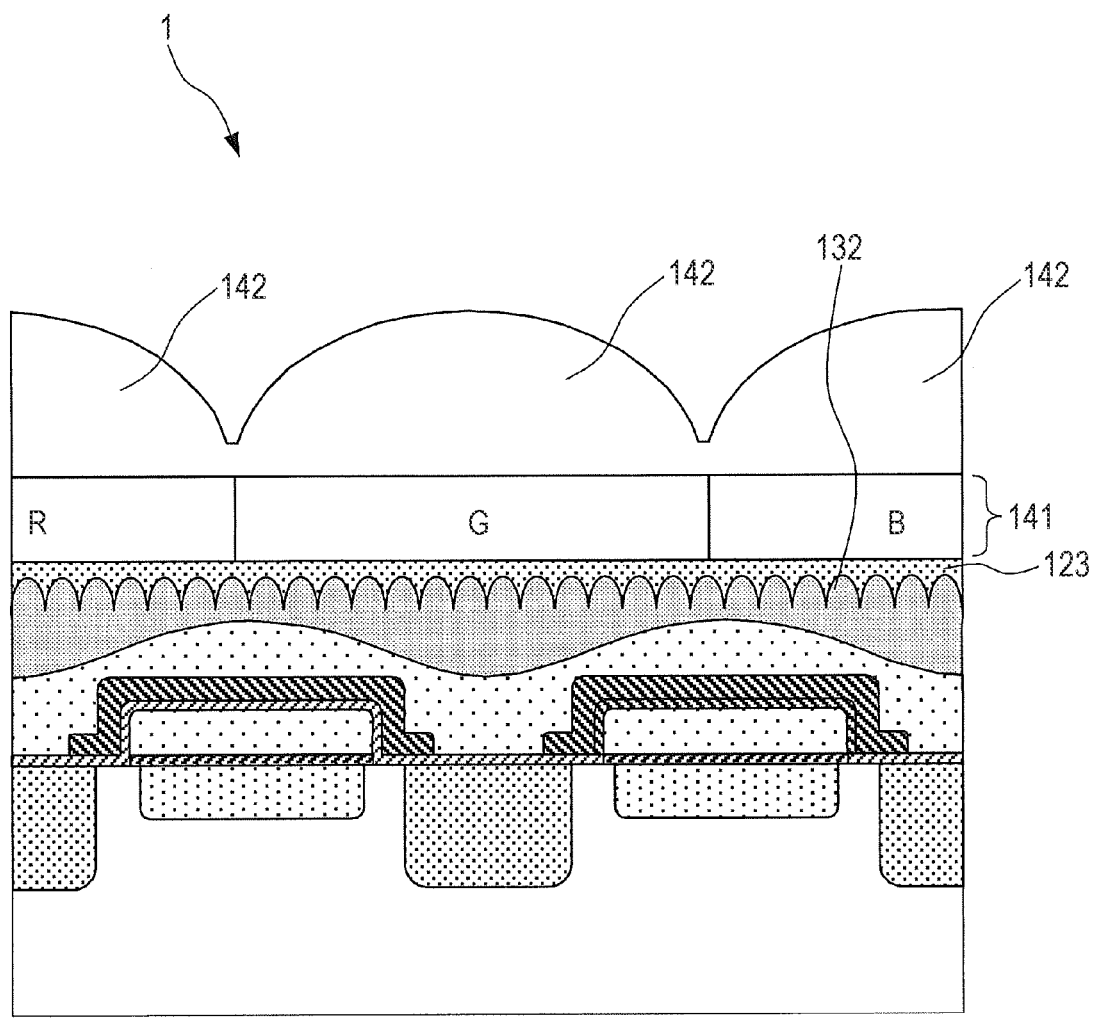
FIG. 27 is a schematic cross-sectional view illustrating the first example of the fabrication method of the solid-state imaging device according to the sixth embodiment of the present invention.

Subsequently, as illustrated in (7) in FIG. 27, a color filter layer 141 is formed on the planarization film 123. The color filter layer 141 is formed by a general fabrication method, for example, a coating method and a lithography technique such that a green color filter layer G, a red color filter layer R, and a blue color filter layer B are formed sequentially. However, the formation order is arbitrary.

In this way, when the color filter layer 141 is formed via the planarization film 123, since damage during the patterning to form the color filter layer 141 is not applied to the protrusions 132, the shape of the protrusions 132 can be maintained.

Furthermore, by a general lens formation technique, a microlens 142 is formed on the color filter layer 141 so as to guide an incident light towards the photoelectric conversion portion 112.

In this way, a solid-state imaging device 1 is obtained.

When the anti-reflection structure 131 having the protrusions 132 arranged thereon is formed on the passivation film 122 by the fabrication method described above, interfacial reflections are reduced to improve the efficiency of the solid-state imaging device 1 condensing light towards the photoelectric conversion portion 112, thus improving the sensitivity. For example, when the protrusions 132 with a pitch of 100 nm and a height of 400 nm ware formed on the surface of the passivation film 122, a sensitivity improvement of 6% is achieved.

Since the passivation film 122 forms a step between a light-receiving pixel portion including the photoelectric conversion portion 112 and a peripheral circuit portion because of the structure of the solid-state imaging device 1, it is very difficult to form the passivation film 122 uniformly on the light-receiving pixel portion. For this reason, an uneven thickness of the light-receiving pixel portion means a variation in interference of visible light, and thus sensitivity fluctuates, thus causing occurrence of color unevenness. In the embodiment of the present invention, the anti-reflection structure 131 formed on the passivation film 122 has an effect of reducing the color unevenness even when a film thickness is uneven.

For example, when the anti-reflection structure 131 having the protrusions 132 with a pitch of 100 nm and a height of 400 nm is formed on the passivation film 122 made from a silicon nitride film, it is possible to reduce the sensitivity variation against a thickness variation to ⅓ of that of a case where no anti-reflection structure is provided.

Moreover, when the anti-reflection structure 131 is formed on any film surface of the solid-state imaging device 1, by using a nanoimprinting method capable of forming 300 mm-diameter wafers by batch processing, it is possible to decrease the costs compared to other formation methods.

As described above, in the first fabrication method, since the protrusions 132 of the anti-reflection structure 131 are formed into a spindle shape having a sinusoidal curved surface, a volume variation of the substances on both sides of the interface of the anti-reflection structure 131 changes in a linear fashion. For this reason, when a widthwise dimension of the protrusion 132 is smaller than a wavelength of light, a spatial occupancy of a substance (the planarization film 123) on one side of the interface changes gradually so that the substance is switched to a substrate (the passivation film 122) on the other side of the interface, whereby an effective refractive index changes continuously. Therefore, the refractive index variation in the anti-reflection structure 131 becomes linear, and thus light reflections are reduced. Moreover, the protrusions 132 have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm. With such regulations, since the aspect ratio of the protrusion can be suppressed as low as 4 at the maximum, it is possible to suppress the reduction of sensitivity. Moreover, preferably, by setting the aspect ratio of the protrusion 132 to 2 or smaller, more preferably, 1 or smaller, it is possible to enable application of the nanoimprinting method.

Therefore, it is possible to prevent the reduction in sensitivity of all the pixels, prevent shading, and prevent reflections. These advantages result from the improved sensitivity with the reduced aspect ratio of the protrusion 132, the improved demolding properties of the nanoimprint mold 161, the improved planarization properties, and the ability to reduce an optical path length. Moreover, since the protrusions 132 are formed into a spindle shape having a sinusoidal curved surface, an improved anti-reflection performance can be provided.

Therefore, since noise such as flare or ghost can be reduced, it is possible to provide an advantage that high-quality images can be obtained with high sensitivity.

Second Example of Fabrication Method of Solid-State Imaging Device

Figure 29:
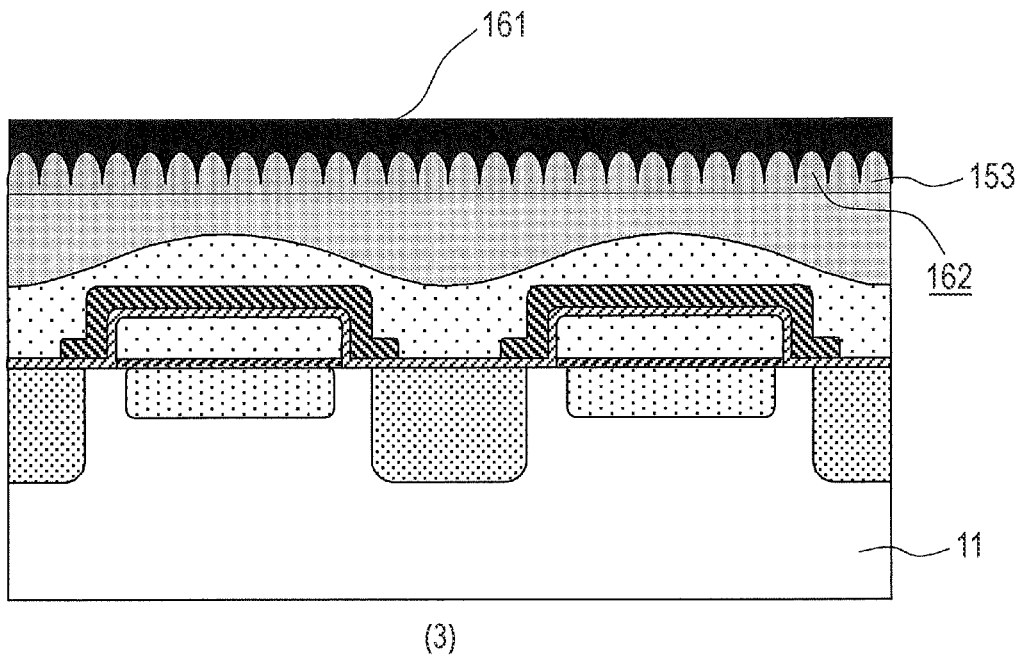
FIG. 29 is a schematic cross-sectional view illustrating the second example of the fabrication method of the solid-state imaging device according to the sixth embodiment of the present invention.
Figure 29:
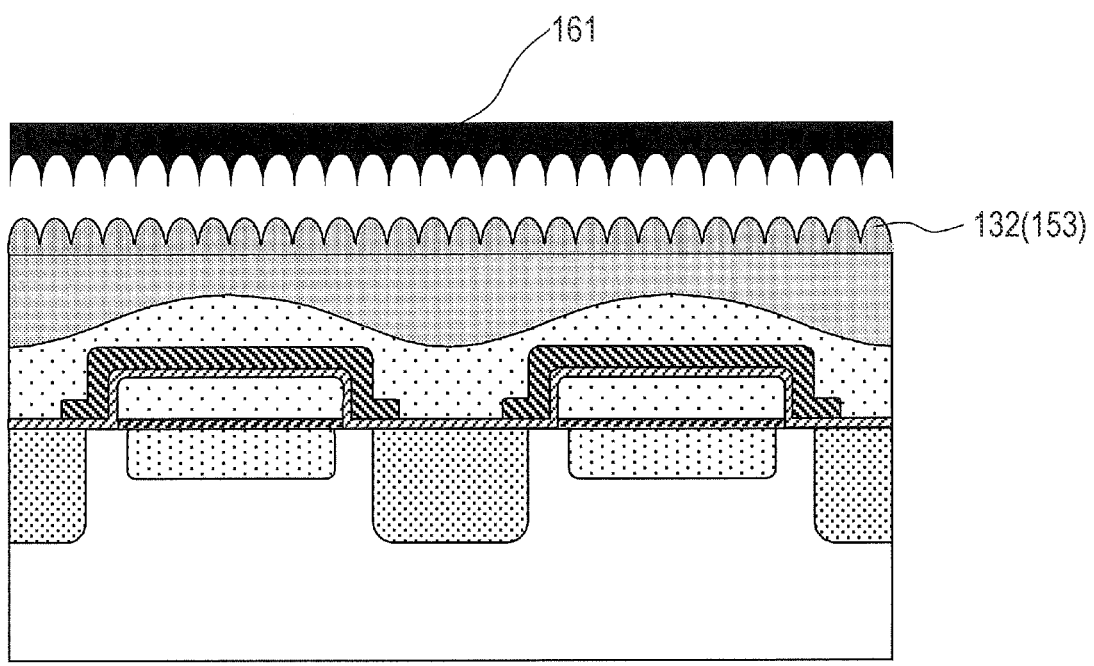
Figure 30:
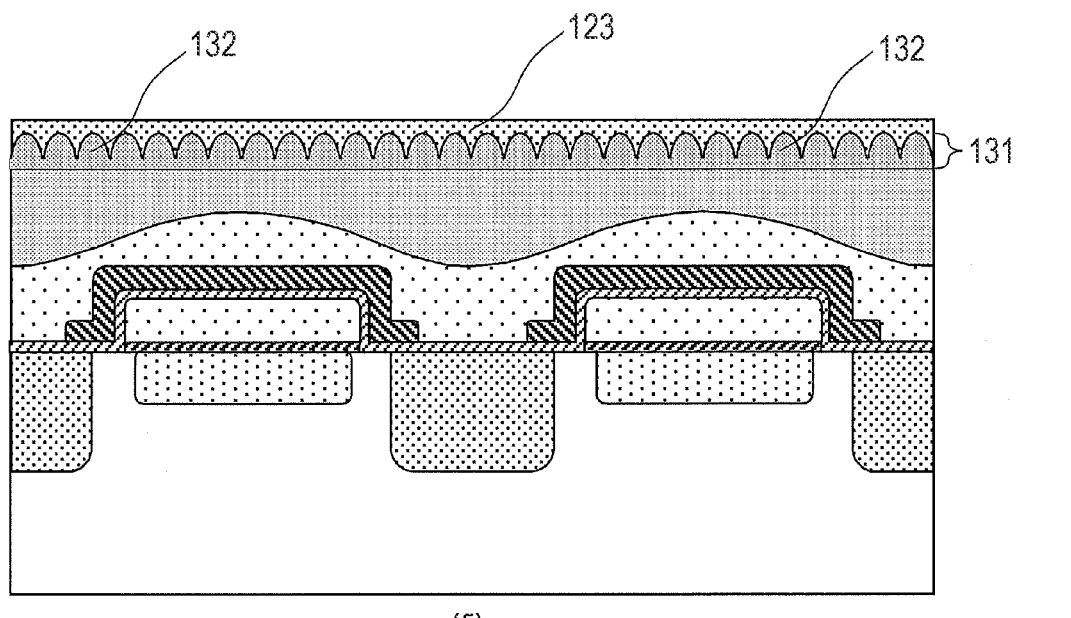
FIG. 30 is a schematic cross-sectional view illustrating the second example of the fabrication method of the solid-state imaging device according to the sixth embodiment of the present invention.
Figure 30:
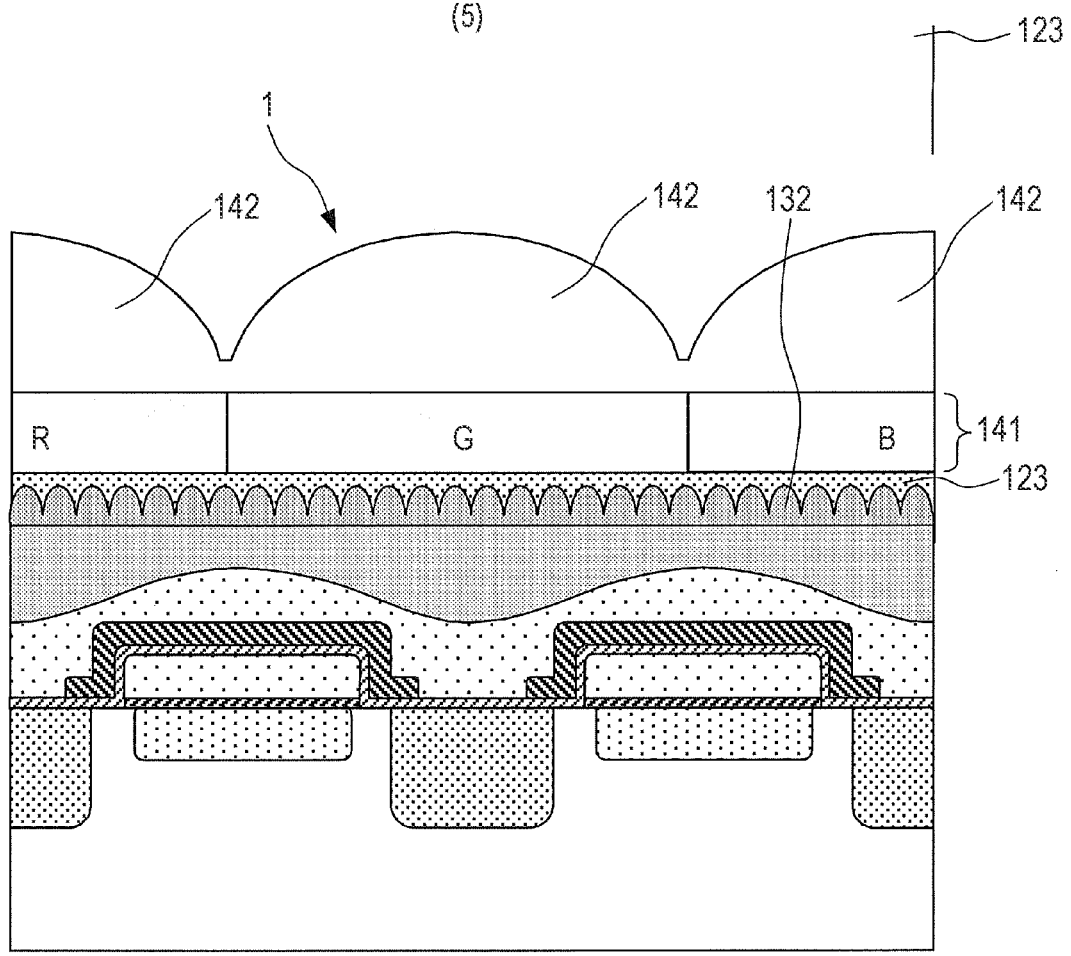
Figure 31:
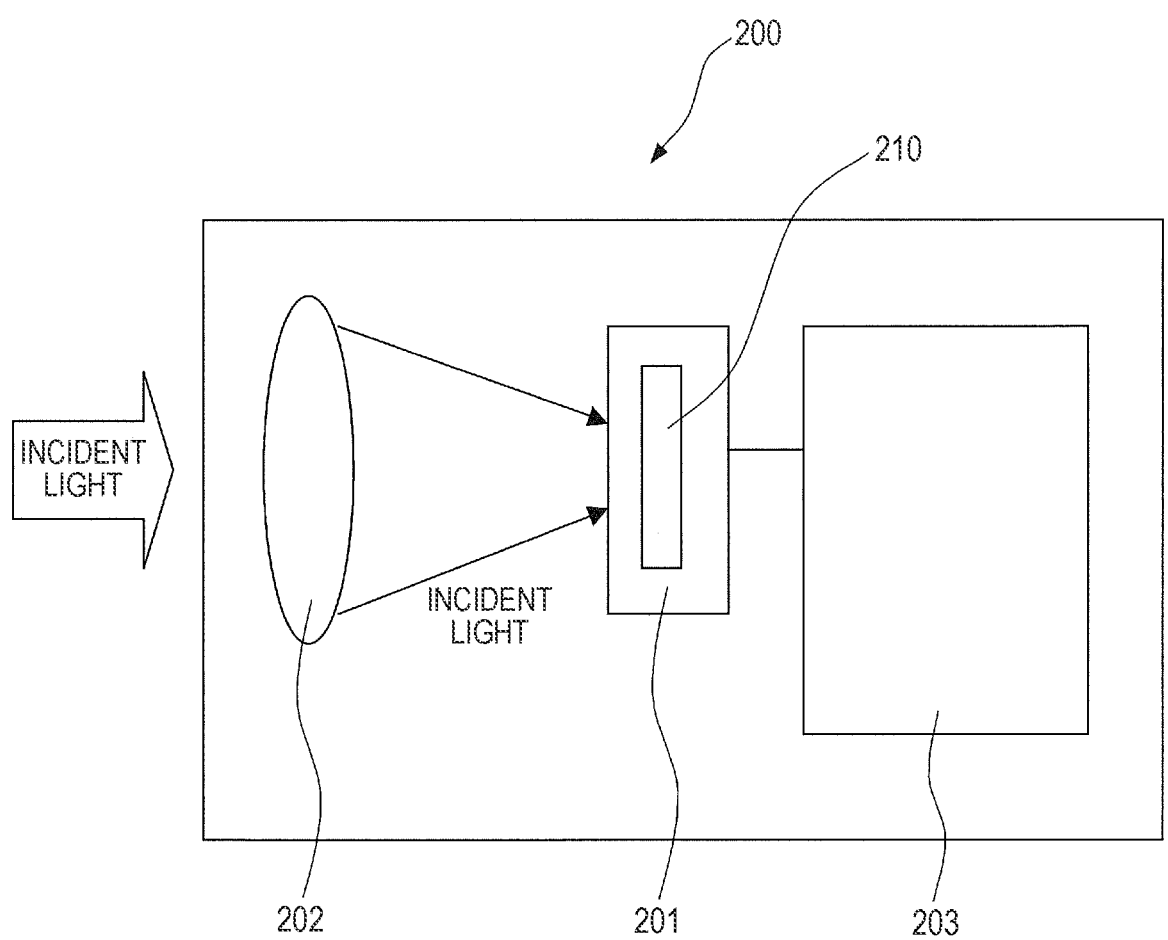
FIG. 31 is a block diagram illustrating an exemplary configuration of an imaging apparatus according to a seventh embodiment of the present invention.

A second example of a fabrication method of a solid-state imaging device according to the sixth embodiment of the present invention will be described with reference to the schematic cross-sectional views shown in FIGS. 29 to 30.

Figure 28:
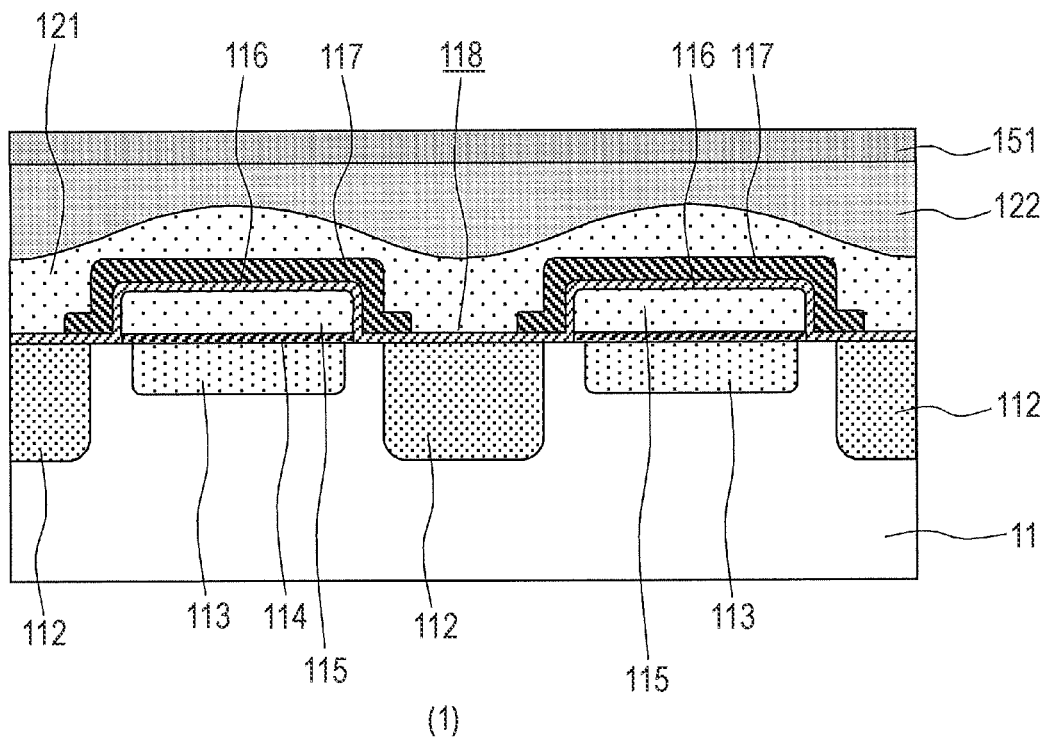
FIG. 28 is a schematic cross-sectional view illustrating a second example of the fabrication method of the solid-state imaging device according to the sixth embodiment of the present invention.
Figure 28:
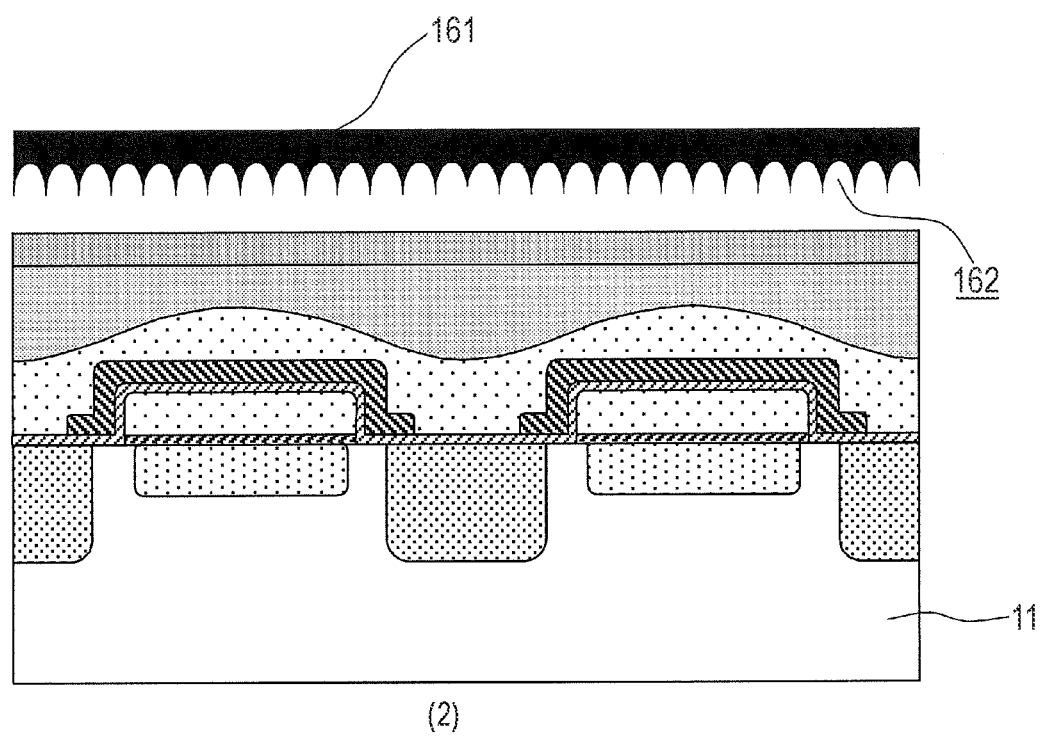

As illustrated in (1) in FIG. 28, a photoelectric conversion portion 112 that converts an incident light to signal charges is formed in a semiconductor substrate 11. A silicon substrate, for example, is used for the semiconductor substrate 11. Moreover, a vertical charge transfer portion 113 that reads and transfers the signal charges from the photoelectric conversion portion 112 is formed in the semiconductor substrate 11. At the same time, a horizontal charge transfer portion (not shown) that transfers and outputs the signal charges transferred from the vertical charge transfer portion 113 in the horizontal direction is formed. On the vertical charge transfer portion 113 (the horizontal charge transfer portion as well) of the semiconductor substrate 11, a transfer gate 115 is formed via a gate insulating film 114. Furthermore, the transfer gate 115 is covered with a light shielding film 117 via an insulating film 116. An aperture portion 118 is provided on the light shielding film 117 and the photoelectric conversion portion 112.

Furthermore, a plurality of layers of interlayer insulating films is formed on the semiconductor substrate 11 so as to cover the photoelectric conversion portion 112, the light shielding film 117, and the like. For example, an interlayer insulating film 121 is formed. The interlayer insulating film 121 is formed from a silicon oxide-based insulating film, for example, and is specifically formed from a BPSG (boron phosphorous silicate glass) film, for example. The interlayer insulating film 121 may be formed from other silicon oxide-based insulating films.

In addition, a passivation film 122 is formed. For example, the passivation film 122 is formed from a plasma-CVD silicon nitride (P—SiN) film. The surface of the passivation film 122 is planarized by CMP (chemical mechanical polishing).

A UV-curable or heat-curable coating film 153 is formed on the surface of the planarized passivation film 122 which is a first light transmissive film of the plurality of layers of the light transmissive films. The coating film 153 preferably has a refractive index as close as the refractive index of the passivation film 122. For example, since the passivation film 122 made from silicon nitride has a refractive index of about 2, the coating film 153 is preferably formed from siloxane containing titanium oxides (titania) particles, and the like. Moreover, a polyimide resin may be used. The coating film 153 is formed by coating, for example. As a coating method, spin coating, slit coating, nozzle coating, and the like may be used. The thickness of the coating film 153 is optimized by a moth-eye structure formed later, and it is necessary to set a residual thickness considering the effect of contraction.

That is to say, the thickness is set similar to the UV-curable film 151 described above. Specifically, as illustrated in (1) in FIG. 24, when it is desired to form an anti-reflection structure 131 (moth-eye structure) in which the protrusions 132 have a height $h_0$ of 200 nm, the thickness $h_0+h_2$ of the coating film 153 is set to 300 nm or more so that the thickness $h_2$ of a residual thickness portion is about 100 nm.

Subsequently, as illustrated in (2) in FIG. 28, a nanoimprint mold 161 which has a 3-dimensional reverse structure of the moth-eye structure to be formed is loaded above the semiconductor substrate 11. That is to say, on the nanoimprint mold 161, spindle-shaped depressions 162 having a sinusoidal curved surface are arranged on an entire surface thereof.

The nanoimprint mold 161 has a size corresponding to a target substrate (the semiconductor substrate 11), and when a 300 mm-diameter wafer (semiconductor substrate 11) is used for transfer, a 300 mm-diameter nanoimprint mold 161 is prepared. As a material of the nanoimprint mold 161, materials capable of transmitting ultraviolet (UV) light are required, and examples of such materials include quartz, glass, and plastic which are capable of transmitting ultraviolet rays.

Subsequently, as illustrated in (3) in FIG. 29, when the coating film 153 is formed from a UV-curable resin, the UV-transmitting nanoimprint mold 161 is pressed against the coating film 153, thus transferring the shape of the spindle-shaped depressions 162 having a sinusoidal curved surface to the surface of the UV-curable film 153. That is to say, the coating film 153 is filled into the depressions of the nanoimprint mold 161. At this time, by tilting the nanoimprint mold 161 and the semiconductor substrate 11, it is possible to reduce the filling time. Moreover, although the pressing may be performed by the own weight of the nanoimprint mold 161, for reduction of the filling time, a sealed structure may be formed in the upper portion of the nanoimprint mold 161 so that it can be uniformly pressed by air pressure or the like. When the coating film 153 is filled into the depressions of the nanoimprint mold 161, the coating film 153 is cured by irradiation with UV rays for sufficient time.

Alternatively, when the coating film 153 is formed from a heat-curable resin, the coating film 153 is heated to its curing temperature to be cured and is then cooled. For example, when the coating film 153 is a siloxane, the coating film 153 is cured by heating at a temperature of 300° C. for 5 minutes.

Subsequently, as illustrated in (4) in FIG. 29, the nanoimprint mold 161 is demolded from the surface of the coating film 153. As a result, a spindle-shaped protrusions 132 having a sinusoidal curved surface is formed on the surface of the coating film 153.

Subsequently, as illustrated in (5) in FIG. 30, a planarization film 123 is formed on the anti-reflection structure 131 which has a moth-eye structure and is constructed from the protrusions 132. The planarization film 123 is formed by coating an organic film, for example. This step requires planarization to be achieved for formation of a color filter array in a later step.

The degree of flatness of the coated planarization film 123 can be generally improved by coating sufficiently thicker than the height of the relief structure on the underlying layer (in this example, the anti-reflection structure 131).

However, in a solid-state imaging device, the increased thickness of the planarization film 123 may lead to an increase in the optical path length, namely a loss of light condensing efficiency.

Therefore, as illustrated in (2) in FIG. 24, the thickness $h_1$ of the planarization film 123 is determined in conformity with the coating characteristics of the planarization film 123. For the planarization film 123 used in this embodiment, since it has been proven that a thickness $h_1$ of 100 nm is required, a relation of $h_1 > h_0 + 100$ nm is obtained. Here, $h_0$ is the height of the protrusion 132 on the anti-reflection structure 131.

However, since the smaller $h_1$ is preferable from the perspective of light condensing efficiency, it may be desirable to set the height $h_1$ so that $h_1 = h_0 + 100$ nm.

Although it may be cost-effective to nano-imprint 300 mm-diameter wafers by batch processing, demolding properties need be considered too. An aspect ratio suitable for demolding is 1 or smaller.

On the other hand, as described above, to a certain height, a greater aspect ratio provides superior anti-reflection performance.

The embodiment of the present invention presents the optimum values when sensitivity, anti-reflection performance, and fabrication issues are all considered. Referring to FIG. 22, the pitches and sensitivity variation ratios for the aspect ratio of 1 are plotted. In this case, the optimum values for the protrusions 132 are a pitch of 200 nm and a height of 200 nm.

Subsequently, as illustrated in (6) in FIG. 30, a color filter layer 141 is formed on the planarization film 123. The color filter layer 141 is formed by a general fabrication method, for example, a coating method and a lithography technique such that a green color filter layer G, a red color filter layer R, and a blue color filter layer B are formed sequentially. However, the formation order is arbitrary.

In this way, when the color filter layer 141 is formed via the planarization film 123, since damage during the patterning to form the color filter layer 141 is not applied to the protrusions 132, the shape of the protrusions 132 can be maintained.

Furthermore, by a general lens formation technique, a microlens 142 is formed on the color filter layer 141 so as to guide an incident light towards the photoelectric conversion portion 112.

In this way, a solid-state imaging device 1 is obtained.

When the anti-reflection structure 131 having the protrusions 132 arranged thereon is formed on the passivation film 122 by the fabrication method described above, interfacial reflections are reduced to improve the efficiency of the solid-state imaging device 1 condensing light towards the photoelectric conversion portion 112, thus improving the sensitivity. For example, when the protrusions 132 with a pitch of 100 nm and a height of 400 nm were formed on the surface of the passivation film 122, a sensitivity improvement of 6% is achieved.

Since the passivation film 122 forms a step between a light-receiving pixel portion including the photoelectric conversion portion 112 and a peripheral circuit portion because of the structure of the solid-state imaging device 1, it is very difficult to form the passivation film 122 uniformly on the light-receiving pixel portion. For this reason, an uneven thickness of the light-receiving pixel portion means a variation in interference of visible light, and thus sensitivity fluctuates, thus causing occurrence of color unevenness. In the embodiment of the present invention, the anti-reflection structure 131 formed on the passivation film 122 has an effect of reducing the color unevenness even when a film thickness is uneven. For example, when the anti-reflection structure 131 having the protrusions 132 with a pitch of 100 nm and a height of 400 nm is formed on the passivation film 122 made from a silicon nitride film, it is possible to reduce the sensitivity variation against a thickness variation to ⅓ of that of a case where no anti-reflection structure is provided.

Moreover, when the anti-reflection structure 131 is formed on any film surface of the solid-state imaging device 1, by using a nanoimprinting method capable of forming 300 mm-diameter wafers by batch processing, it is possible to decrease the costs compared to other formation methods.

As described above, in the second fabrication method, since the protrusions 132 of the anti-reflection structure 131 are formed into a spindle shape having a sinusoidal curved surface, a volume variation of the substances on both sides of the interface of the anti-reflection structure 131 changes in a linear fashion. For this reason, when a widthwise dimension of the protrusion 132 is smaller than a wavelength of light, a spatial occupancy of a substance (the planarization film 123) on one side of the interface changes gradually so that the substance is switched to a substrate (the passivation film 122) on the other side of the interface, whereby an effective refractive index changes continuously. Therefore, the refractive index variation in the anti-reflection structure 131 becomes linear, and thus light reflections are reduced. Moreover, the protrusions 132 have a height which is equal to or greater than 50 nm and equal to or less than 100 nm for an arrangement pitch of 40 nm, equal to or greater than 200 nm and equal to or less than 400 nm for an arrangement pitch of 100 nm, and equal to or greater than 50 nm and equal to or less than 400 nm for an arrangement pitch of 200 nm. With such regulations, since the aspect ratio of the protrusion can be suppressed as low as 4 at the maximum, it is possible to suppress the reduction of sensitivity. Moreover, preferably, by setting the aspect ratio of the protrusion 132 to 2 or smaller, more preferably, 1 or smaller, it is possible to enable application of the nanoimprinting method.

Therefore, it is possible to prevent the reduction in sensitivity of all the pixels, prevent shading, and prevent reflections. These advantages result from the improved sensitivity with the reduced aspect ratio of the protrusion 132, the improved demolding properties of the nanoimprint mold 161, the improved planarization properties, and the ability to reduce an optical path length. Moreover, since the protrusions 132 are formed into a spindle shape having a sinusoidal curved surface, an improved anti-reflection performance can be provided.

Therefore, since noise such as flare or ghost can be reduced, it is possible to provide an advantage that high-quality images can be obtained with high sensitivity.

In the first and second fabrication methods described above, although it has been described that the anti-reflection structure 131 is formed on the surface of the passivation film 122, the anti-reflection structure 131 may be formed, for example, on the surface of the microlens 142 or the surface of the insulating film 116 which is an inorganic anti-reflection film according to any of the fabrication methods. Moreover, although not shown in the figure, the anti-reflection structure 131 may be formed on the surface of a cover glass or infrared cut-off filter that is formed in an outermost portion of a region where the incident light is incident.

According to the first fabrication method, the anti-reflection structure 131 may be formed on the surface (the silicon substrate surface) of the photoelectric conversion portion 112.

Furthermore, the anti-reflection structure 131 may be formed on two layers or more layers, for example, the surface of the passivation film 122 and the surface of the microlens 142.

7. Seventh Embodiment

Exemplary Configuration of Imaging Apparatus Using Solid-State Imaging Device

Next, an exemplary configuration of an imaging apparatus to which a solid-state imaging device formed by the fabrication method of the solid-state imaging device according to the embodiment of the present invention is applied will be described with reference to the block diagram shown in FIG. 32. The imaging apparatus uses the solid-state imaging device according to the embodiment of the present invention.

As illustrated in FIG. 32, an imaging apparatus 200 is provided with a solid-state imaging device 210 in an imaging unit 201. A light-condensing optical unit 202 that condenses an image is provided on a light condensing side of the imaging unit 201. Moreover, the imaging unit 201 is connected to a signal processing portion 203 that includes a driving circuit for driving the imaging unit 201, a signal processing circuit for processing signals having been subjected to photoelectric conversion in the solid-state imaging device 210 to obtain image signals, and other circuits. Moreover, the image signals processed by the signal processing portion 203 are stored in an image storage unit (not illustrated). In such an imaging apparatus 200, the solid-state imaging device 210 may be a solid-state imaging device formed by the solid-state imaging device manufacturing method described in the embodiment.

Since the imaging apparatus 200 according to the embodiment of the present invention uses the solid-state imaging device fabricated by the solid-state imaging device fabrication method according to the embodiment of the present invention, it is possible to provide an advantage that high-quality images in which noise light such as flare or ghost is reduced can be obtained with high sensitivity.

The imaging apparatus 200 may have such a form that it is formed into a one-chip configuration and may have a modular form having an imaging function in which the imaging unit, the signal processing portion or the optical unit are packaged. Here, the imaging apparatus 200 refers to, for example, a camera or portable equipment having an imaging function. Moreover, "imaging" is meant not only to include capturing of an image at the time of general camera shooting but also detection of fingerprints and the like in a broader sense of its meaning.

The present application contains subject matter related to that disclosed in Japanese Priority Patent Applications JP 2009-086671 and JP 2009-121605 filed in the Japan Patent Office on Mar. 31, 2009 and May 20, 2009, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A fabrication method of an anti-reflection structure, the method comprising the steps of:
   providing a resin film having micro-particles dispersed therein on a surface of a substrate;
   forming a dummy protrusion pattern on a surface of the resin film by etching the resin film using the micro-particles in the resin film as a mask while gradually etching the micro-particles; and
   forming a protrusion pattern on the surface of the substrate by etching back the surface of the substrate together with the resin film having the protrusion dummy pattern formed thereon, thereby transferring a surface shape of the dummy protrusion pattern formed on the surface of the resin film to the surface of the substrate and eliminating the resin film, the resulting protrusions being tapering in cross-section from a relatively wide base to a relatively narrow end, the resulting protrusions having a distribution pitch and an aspect ratio of height to base diameter effective to suppress reflection of light and provide the anti-reflection structure.

2. The fabrication method of an anti-reflection structure according to claim 1, wherein the resin film having the micro-particles dispersed therein is formed by a coating method.

3. The fabrication method of an anti-reflection structure according to claim 1 or 2, wherein the micro-particles are made from metal oxides or a phthalocyanine compound; and the resin film is selected from a group consisting of a novolac-based resin, a styrene-based resin, an acrylic resin, a polysiloxane-based resin, and a polyimide-based resin.

4. The fabrication method of an anti-reflection structure according to claim 1 or 2, wherein the resin film contains a heat curing agent.

5. The method of claim 1, wherein the resulting protrusions have an aspect ratio of 4 or less.

6. The method of claim 5, wherein the resulting protrusions have an aspect ration of 1 to 2, inclusive, and a distribution pitch of 100 nm to 200 nm inclusive.

7. The method of claim 5, wherein the resulting protrusions have an aspect ratio of 2.5 or less.

* * * * *